United States Patent
Gödecke et al.

(10) Patent No.: US 7,172,654 B2
(45) Date of Patent: Feb. 6, 2007

(54) PREPARATION OF COMPOUNDS BASED ON PHASE EQUILIBRIA OF CU-IN-SE

(75) Inventors: Tilo Gödecke, Stuttgart (DE); Frank Ernst, Cleveland, OH (US)

(73) Assignee: Max-Planck-Gesellschaft zur Förderung der Wissenschaften e.V., Munich (DE)

( * ) Notice: Subject to any disclaimer, the term of this patent is extended or adjusted under 35 U.S.C. 154(b) by 174 days.

(21) Appl. No.: 10/311,716

(22) PCT Filed: Jun. 29, 2001

(86) PCT No.: PCT/EP01/07461

§ 371 (c)(1),
(2), (4) Date: Feb. 7, 2003

(87) PCT Pub. No.: WO02/02851

PCT Pub. Date: Jan. 10, 2002

(65) Prior Publication Data

US 2004/0025781 A1     Feb. 12, 2004

(30) Foreign Application Priority Data

Jun. 30, 2000     (EP) ................................. 00113935

(51) Int. Cl.
*C30B 25/12*     (2006.01)
(52) U.S. Cl. ................................. 117/2; 117/3; 117/937
(58) Field of Classification Search .................... 117/2, 117/3, 937
See application file for complete search history.

(56) References Cited

U.S. PATENT DOCUMENTS 4,652,332 A     3/1987     Ciszek

OTHER PUBLICATIONS

The Phase relations in the Cu, In, Se System . . . Crystals, Fearheiley, Solar Cells, vol. 16. No. 1/Apr. 1986, pp. 91-100.
"Preparation of Nonstoichiometirc CUINSE2 Crystals . . . Method", Yip, et al. Record of the Photovoltaic Specialists Conference,, vol. Conf. 21, May 21, 1990 (p. 768.
"Effect of nonstoichiometry on conductivity . . . CuInSe2", Shukri, et al., Journal of Crystal Growth, NL. vol. 191, Jan. 7, 1998 (pp. 97-107).
CuInS2ySe2-2y and CuGaxIn1. . . Bulk Crystal growth . . . properties, Abid, et al. Specialists Conference 1987, May 1987—pp. 1305-1308.
LPE Growth of CuGa1 . . . substrate, Takenosita, Japanese Journal of Applied Physics, vol. 23. (1984) p. 389.
Phase relations in the ternary system. Cu-In-Se, Boehke, et al. Journal of Materials Science, vol. 22, (1987), pp. 1635-1641.
Phase Relations in the Cu, In. Se system and properties . . . Crystals, Bachmann, et al., Applied Physics, Letters. vol. 44. Feb 15, 1984 (pp. 407-409).

*Primary Examiner*—Felisa Hiteshew
(74) *Attorney, Agent, or Firm*—Fulbright & Jaworski L.L.P.

(57) ABSTRACT

The present invention relates to the use of phase equilibria as shown in the phase diagram of Cu—In—Se for the preparation of solid compositions. Further, a new method for directly obtaining α CuInSe2 from a liquid phase, preferably as a single phase composition and novel single phase α CuInSe2 compositions are provided.

26 Claims, 54 Drawing Sheets

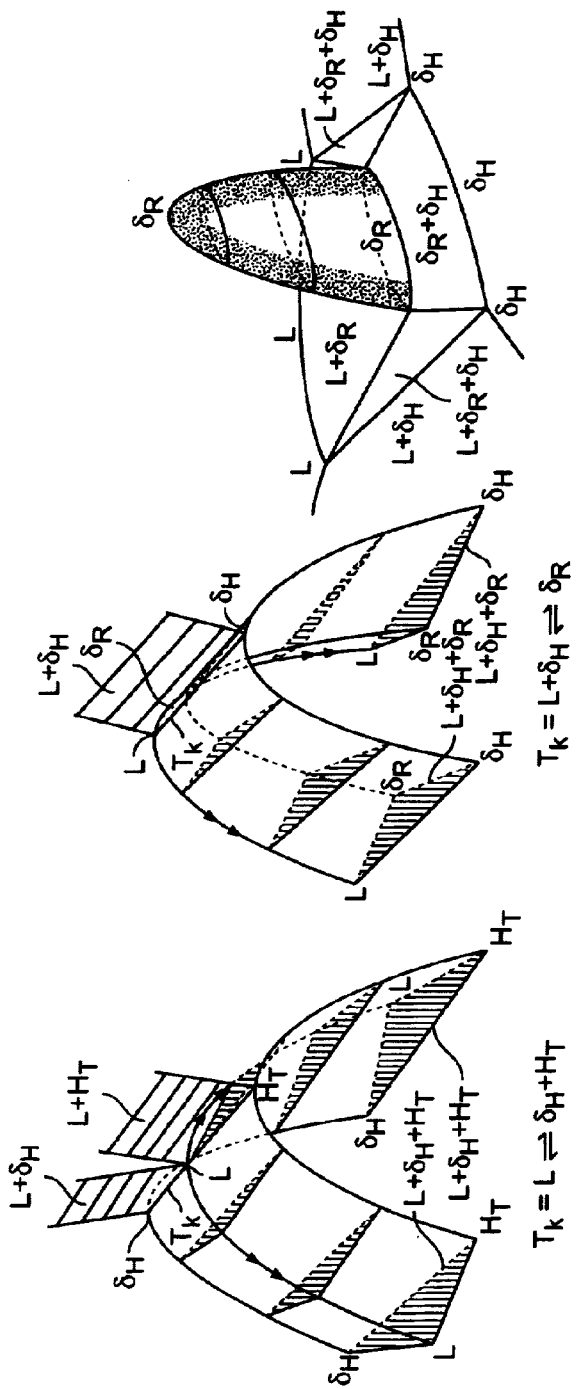

 
FIG. 8A  FIG. 8B
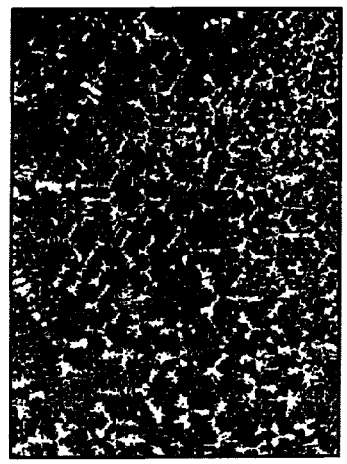
FIG. 9

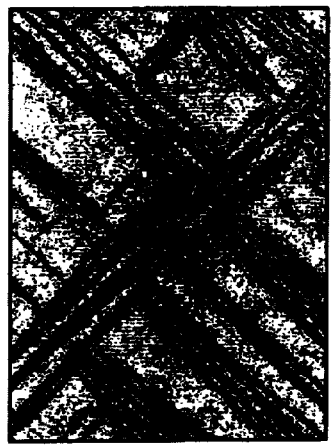
FIG. 10
 
FIG. 11A				FIG. 11B

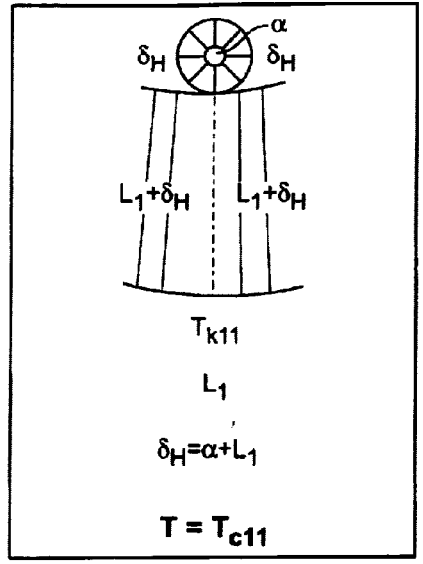 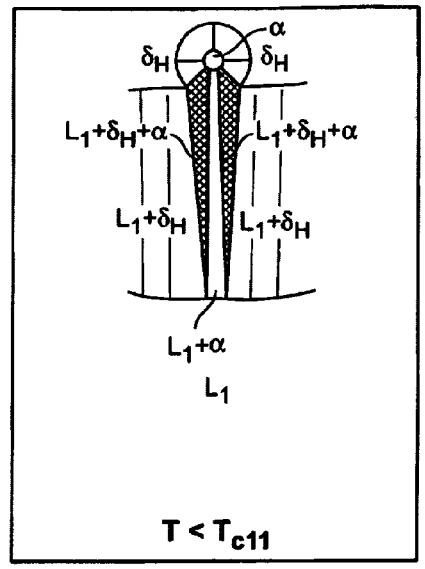
FIG. 25A  FIG. 25B
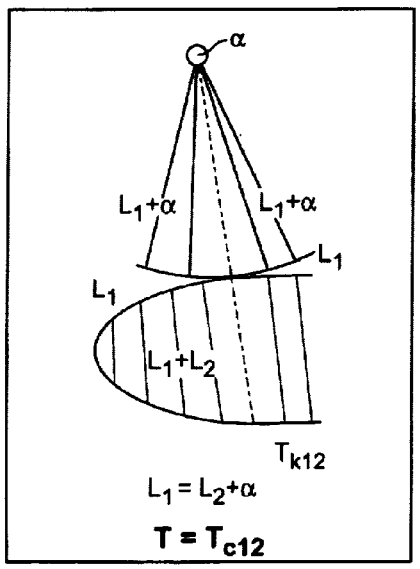 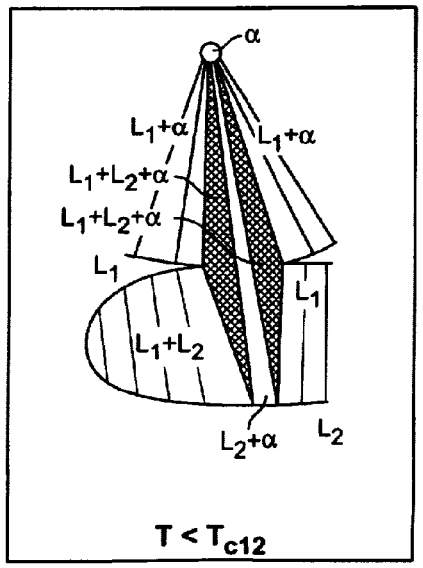
FIG. 25C  FIG. 25D

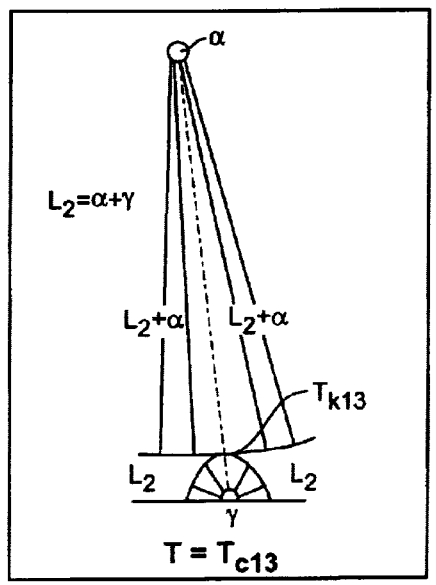 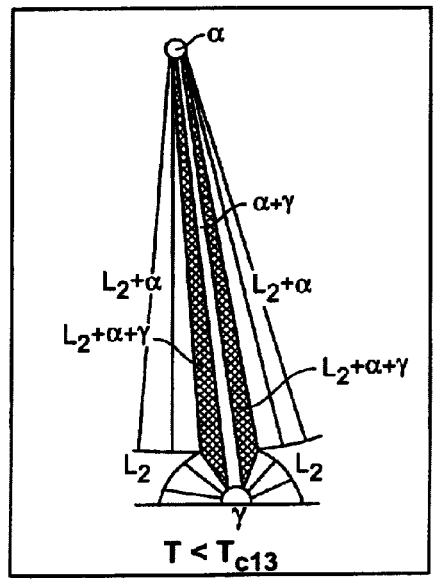
FIG. 25E  FIG. 25F

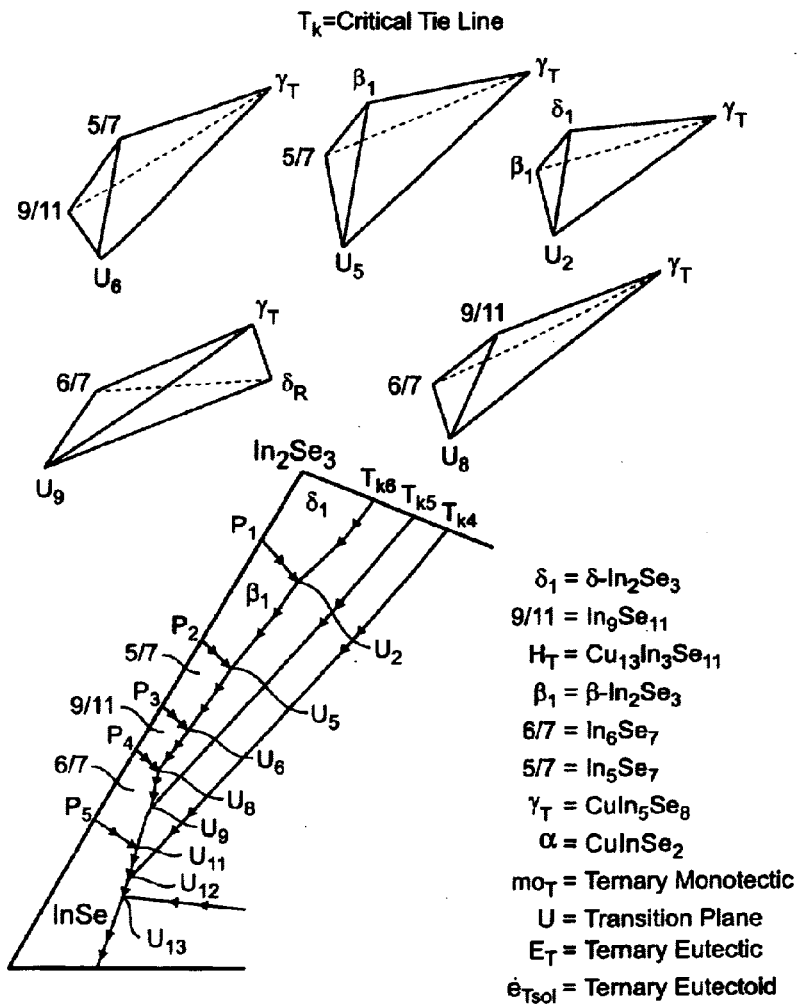
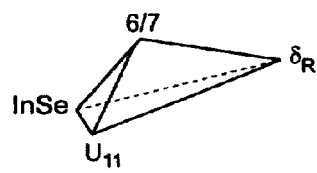
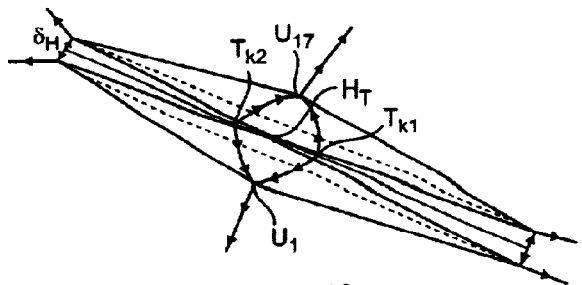
FIG. 27D
FIG. 27C $\gamma_T = CuIn_5Se_8$
$\gamma_{2/3} = \gamma\text{-}In_2Se_3$
$\beta_1 = \beta\text{-}In_2Se_3$
$5/7 = In_5Se_7$
$9/11 = In_9Se_{11}$
$6/7 = In_6Se_7$
L = Liquid
$T_k$ = Critical Tie Line
$H_T = Cu_{13}In_3Se_{11}$
$mo_T$ = Ternary Monotectic
$E_T$ = Ternary Eutectic
U = Transition Plane

PREPARATION OF COMPOUNDS BASED ON PHASE EQUILIBRIA OF CU-IN-SE

BACKGROUND AND SUMMARY OF THE INVENTION

The present invention relates to the use of phase equilibria as shown in the phase diagram of Cu—In—Se for the preparation of solid Cu—In—Se phases with defined compositions. In particular, a new method is provided for obtaining single-phase $\alpha$-CuInSe$_2$ directly from a liquid phase. Further, the new method allows one to fabricate single phase $\alpha$-CuInSe$_2$ with compositions that one could not obtain before.

Cu—In—Se-compositions, e.g. compounds and alloys, particularly the $\alpha$-CuInSe phase having the stoichiometry CuInSe$_2$ are semiconductor materials which are suitable for photovoltaic applications due to their excellent optical and electronical properties. Since CuInSe-compounds transfer light energy into electric energy with high efficiency and additionally absorb visual light very well, these materials are suitable for preparing thin film solar cells, which are superior to conventional silicon solar cells both as to their performance characteristics and lower material consumption and thus can be produced at lower costs. Due to their higher efficiency and weight reduction because of the lower quantity of material present, such solar cells are particularly well suited for the energy supply of space ships and satellites. Theoretically, CuInSe$_2$ thin film solar cells are said to achieve efficiencies of over 20%. The efficiencies obtained in practice, however, are still below 15% so far. An important aspect for the efficiency is the microstructure of the thin films, i.e. the entirety of the microscopic defects in the material concerned. The microstructure comprises point defects (impurities), dislocations, surface and inner boundaries. The inner boundaries comprise grain boundaries, i.e. boundaries between areas having different orientation of the crystal lattice, and phase boundaries.

Among the defects mentioned above, extended defects such as grain boundaries and phase boundaries presumably have a particular disadvantageous effect on the photovoltaic properties of the material: Photovoltaically produced charge carriers, i.e. electrons and holes are captured by these defects and recombine with one another thereby generating a photon. Thus, at crystal defects the photovoltaic conversion of energy is reversed and the macroscopically detectable efficiency of the solar cell decreases accordingly. In addition, the presence of additional phases reduces the volume percent of the photovoltaically relevant $\alpha$-phase, thereby reducing the efficiency even more.

Accordingly, a particular high efficiency can be achieved by producing an $\alpha$-copper-indium-selenide without grain boundaries and phase boundaries. Such a monocrystalline material without grain boundaries and phase boundaries is called single crystal.

Over the recent years there have been intensive attempts of producing a single-crystalline $\alpha$-copper-indium-selenium. However, the Bridgman techniques applied for this purpose have not been successful. According to current knowledge, the problem is that in the Cu—In—Se system a complex variety of phase equilibria can be generated. For instance, cooling down a liquid phase having the composition CuInSe$_2$ to room temperature according to the Bridgman method does not result in a single crystal, but in a mixture having several phases of different composition and corresponding phase boundaries. To be able to conceive a method for the production of single crystals a complete and precise ternary phase diagram is required. So far, however, the literature only provides incomplete and/or incorrect phase diagrams of the Cu—In—Se system.

U.S. Pat. No. 4,652,332 describes a method, wherein stoichiometric amounts of Cu, In and Se are applied. Contrary thereto, the method according to the invention does not start out from the stoichiometric composition. Additionally, the phase diagram included in U.S. Pat. No. 4,652,332 differs from the phase diagram presented herein.

L. S. Yip et al., Record of the Photovoltaic Specialists Conference, U.S., New York, IEEE, vol. Conf. 21, May 21, 1990, pages 768–771 show in FIG. 3 compositions with which $\alpha$-CIS-monocrystals were obtained. Upon performing the works of the present invention it was noticed that the breadth of the $\alpha$ phase is much smaller and the monocrystals described in Yip et al. are no thermodynamically stable $\alpha$-CIS single crystals. Yip et al. mention data, which were obtained by electron probe microanalysis (EPMA). The spacial resolution of this method, however, is only 1 µm (1000 nanometers). When corresponding compositions are examined with transmission electron microscopy, a technique used for obtaining a spacial resolution of 0.3 nm, however, polyphases are detected. The monocrystals described by Yip et al. are thus polyphase crystals having a common crystal orientation, contrary to the single-phase crystals described herein. Further, the crystals described by Yip et al. have a size of only a few millimeters, whereas the method described herein allows for the production of crystals of arbitrary size. Moreover, the Bridgman method of Yip et al. is based on congruent solidification, which means that the solidifying solid particle has the same composition as the melt. A particuliarity of the method according to the invention is that the melt from which the $\alpha$-CIS single-phase crystals are obtained exhibits a different composition than, $\alpha$-CIS.

Z. A. Shukri et al., Journal of Crystal Growth, NL, North-Holland Publishing, Amsterdam, vol. 191, No. 1–2, (1998), pages 97–107 describe a Bridgman method based on concruent solidification. This means that the solidifying solid particle has the same composition as the melt. Contrary thereto the melt, from which $\alpha$-CIS monocrystals are obtaned in the method according to the invention, exhibits a different composition than $\alpha$-CIS. Also Shukri et al. show measuring data obtained by electron probe microanalysis (EPMA). The dimensional resolution of this method, however, is only 1 µm (1000 nm). When crystals of corresponding compositions are examined with transmission electron microscopy, a technique for obtaining a dimensional resolution of 0.3 nm, the polyphases of such crystals can be detected.

Abid et al., Conference Record of the 19th Photovoltaic Specialists Conference 1987, May 1987, pages 1305–1308 also describe a phase diagram of Cu—In—Se, which is incomplete and different to the phase diagram presented herein. The assertion in Abid et al. that monocrystals of the alloy concerned were produced is not supported by experimental data in this work.

In extensive experimental tests conducted on over 250 different Cu—In—Se alloys for the first time the ternary phase diagram of the Cu—In—Se system was determined completely and at high accuracy with the help of differential-thermal analysis, transmission electron microscopy, scanning electron microscopy, x-ray diffraction and light microscopy. From these phase diagrams now several promising methods for the production of $\alpha$-single crystals and other interesting compositions can be derived.

From the ternary phase diagram Cu—In—Se, as shown in the enclosed figures, it becomes evident why α-single crystals cannot be produced according to the Bridgman method. This phase diagram shows that the α-phase is involved in a variety of phase equilibria at temperatures during the cooling phase to room temperature. At about 500° C. there are two-phase equilibria and three-phase equilibria between the α-phase and nine other phases. However, this was not known before our tests have been performed. According to the prior art it was assumed that α-CuInSe$_2$ can only be generated via solid phase transformation $\delta_H \rightarrow \alpha$. According to our novel ternary phase diagram the α-phase, however, has four different surface areas of primary crystallization—consequently, there are four types of liquid phases, from which CuInSe$_2$ can be directly obtained and then cooled down to room temperature without further phase transformation.

Thus, the novel phase diagram of Cu—In—Se including the liquidus surface of the ternary system as described in the accompanying figures provides novel methods for the preparation of solid compositions comprising the elements Cu, In and Se. By means of the phase equilibria in the diagram the direct formation of desired solid compositions, i.e. solid compositions having a desired phase and/or stoichiometry, may be effected from a liquid phase without phase transformation in the solid state. Preferably, the solid compositions are prepared by crystallization from a liquid molten Cu—In—Se phase.

For example, the preparation of the solid compositions may comprise crystal growth by the Czochralski method without feed of a liquid phase. In this method, a seed crystal is immersed in a melt having a desired composition and temperature and grown by rotation. In a further embodiment, the preparation of the solid composition comprises crystal growth by the Czochralski method including feed of a liquid phase, i.e. during the crystal growth a liquid phase having the same composition or a different composition from the original liquid phase is fed continuously or intermittently into the liquid phase which is used for the crystal growth.

Alternatively, the preparation of single crystals may comprise crystal growth from a first liquid phase which is in contact with a second liquid phase wherein the density and the stoichiometry of the first liquid phase differs from the density and the stoichiometry of the second liquid phase. While the crystal is grown from the first liquid phase, the second liquid phase supplies the material withdrawn from the first liquid phase by the crystal growth.

It should be noted, however, that other methods for crystal growth, particularly for the growth of single crystals are suitable for the preparation of particular Cu—In—Se-compositions as can be gathered by the skilled person from the phase diagram as shown in the accompanying figures. For a detailed description of crystallization methods reference is made to Elwell and Scheel, Crystal Growth from High Temperature Solutions, New York: Academic Press (1975), Holden and Morrison, Crystals and Crystal Growing: The MIT Press (1982), Recker and Wallrafen, Synthese, Einkristallzüchtung und Untersuchung akustooptischer Materialien FbNRW, 2983 (1980), Wilke, Kristallzüchtung (Ed. J. Bohm), Berlin: VEB Deutscher Verlag der Wissenschaften (1988) and references recited therein.

A particular advantage of the novel Cu—In—Se phase diagram including the liquidus surface of the system is to provide novel methods for preparing compositions from a liquid phase wherein the desired solid composition has a stoichiometry which differs from the stoichiometry of the liquid phase. Without knowledge of the liquidus surface of the system such a method of preparation would not be feasible.

The phase diagram is particulary suitable for the preparation of alloys that are single phase compositions and/or single crystalline compositions. The preferred direct formation of the desired solid alloy from a liquid phase without solid state transformation results in a composition having advantageous properties compared to prior art compositions which have been subjected to solid state transformations. Alloys obtained by direct formation from a liquid phase have advantageous physicochemical properties compared to alloys that have been obtained via a solid state transformation, e.g. macroscopic homogeneity, lower amounts of defects and inner boundaries. Particularly, alloys obtained by direct precipitation from a liquid phase will not contain any inter-phase interfaces, which also means that they will be free of the internal stresses that usually build up in the presence of such interfaces.

The phase diagram as shown in the accompanying figures is not restricted to a ternary system consisting of the elements Cu, In and Se, but may be extended to Cu—In—Se alloys doped with at least one further element, particularly Ga, Na, or S, wherein said at least one further element is present with dopant concentrations up to 5 atom percent, preferably up to 2 atom percent and more preferably up to 1 atom percent. The before-mentioned dopants widen the α-phase field, the stoichiometrical range of the α-phase.

The phase diagram of the present invention allows the preparation of single phase and/or single crystalline alloys in the ternary system Cu, In and Se and extensions thereof comprising at least one further element. More preferably, the compositions are selected from the α-phase, the $\gamma_T$-phase, the $\delta_R$-phase and the $\delta_H$-phase. The melt compositions and temperatures for a direct deposition of $\gamma_T$, $\delta_R$ and $\delta_H$ from a melt are indicated in FIGS. 6, 43(*a*), 50 and 51. Most preferably, the composition is the α-phase having the stoichiometry CuInSe$_2$ within a compositional range as indicated in FIGS. 51 and 52. Doping with Ga, Na or S further extends the compositional range of the α-phase.

The α-phase may be directly crystallized from a liquid phase under conditions selected from the group of liquidus surfaces of primary crystallization αL1, αL2, αL3 and αL4 as defined in the phase diagram and particularly in Table 4.

Thus, a further subject matter of the invention is a method for directly obtaining the α-phase from a liquid phase by crystal growth under conditions selected from the group of liquidus surfaces of primary crystallization αL1, αL2, αL3 and αL4. The α-phase may be obtained as a single phase composition, and thus also as a single crystal. Further, it is possible to grow single crystalline α epitaxially on a single crystalline substrate, such as a metal or ceramic substrate.

Yet a further subject matter of the present invention is a single phas composition, selected from the α-phase, the $\gamma_T$-phase, the $\delta_R$-phase and the $\delta_H$-phase, particularly which have been directly obtained from a liquid phase and which have not been subjected to a solid phase transformation. Single crystals of this kind can have a defect concentration as low as the defect concentration in melt-grown single crystals of any other comparable material. Since the solidification of the α-phase from the liquid phase $L_1$, $L_2$, $L_3$ or $L_4$ can be conducted close to thermodynamic equilibrium (small supercooling), the defect density of the resulting crystals will be very low compared to, for example, material deposited from the vapor phase (physical vapor deposition, PVD) or layers plated from aqueous solutions. Similar to Si crystals grown from the melt, the concentration of extended defects (phase boundaries, grain boundaries, twin boundaries, stacking faults and dislocations), which one can experimentally observe by transmission electron microscopy (TEM), can be near or equal to zero. For the same reason, the concentration of various types of point defect, which one can analyze by capacity methods (admittance spectroscopy, deep level transient spectroscopy) can be as low as the corresponding equilibrium concentration $Exp[S/k_B T] \cdot Exp[-E/k_B T]$, where S denotes the formation entropy of the respective type of point defect, E the formation energy, $k_B$ Boltzmann's constant, and T the temperature in Kelvin. Further, the composition may be a macroscopic single crystal having a size of at least 1 $cm^3$, preferably at least 5 $cm^3$.

Particularly preferred methods for obtaining $\alpha$-$CuInSe_2$ single crystals are described in detail as follows:

The novel phase diagram shows that $\alpha$-single crystals with a certain variety of compositions can be generated around the ideal stochiometric composition $CuInSe_2$ (FIGS. 43a–g). This does not work with the Bridgman technique, either: Since the Bridgman technique is bound to congruent solidification of the liquid phase, the single crystals of the $\delta$-phase are always obtained first. As can be gathered from the novel phase diagram, the $\delta$-phas crystallizes via a melting point maximum at 1002° C. thus resulting in the composition $Cu_{23.5}In_{26.0}Se_{50.5}$. Since this composition differs from the ideal composition $Cu_{25}In_{25}Se_{50}$ of the $\alpha$-phase, the high temperature phase $\delta$ does not completely transform into the $\alpha$-phase upon further cooling, but decomposes into two phases, $\alpha$ and $\delta_R$. This can be taken from the quasibinary section $In_2Se_3$—$Cu_2Se$ (FIGS. 6a–d) of the ternary phase diagram.

Based on this novel ternary phase diagram Cu—In—Se, there are two preferred methods for the production of $\alpha$-single crystals:
1. Czochralski method (including and without feed of a liquid phase)
2. Single crystal growth in a monotectic reaction For performing these methods the location of the composition ranges of the four above-mentioned liquidus surfaces of primary crystallization of a and their temperature dependency as well as position and temperature of the monotectic reaction must be known. According to the polythermic illustration in FIGS. 43a–g the four surfaces of primary crystallization of the $\alpha$-phase are specified by the parameters indicated in Table 4.

In order to be able to precisely adjust the composition of the single crystals, the course of the tie lines between the $\alpha$-phase and the liquid phases $L_1$–$L_4$ is provided. Our results prove that the $In_2Se_3$—$Cu_2Se$ isopleth constitutes a quasibinary section. In quasibinary sections the tie lines are aligned with the section plane. This is an advantage for single crystal growth according to the Czochralski method, since the isopleths immediately disclose the temperature-concentration-range suitable for crystal cultivation. Further, the chemical composition of the liquid phase and the single crystal may be determined and/or adjusted via the tie lines.

This is now possible due to our results, particularly with the isopleth $CuInSe_2$—$Cu_{50}In_{50}$ (FIG. 32) and—correspondingly—with the isopleth $CuInSe_2$—$Cu_{70}In_{30}$ (FIG. 31).

Thus, there are at least three novel methods for producing single crystals from $\alpha$-copper-indium-selenide using isopleth $CuInSe_2$—$Cu_{50}In_{50}$ (FIG. 32):
1. The Czochralski method without feed of a liquid phase provides a means for growing the $\alpha$-phase as single crystal starting from a composition with 41 atom percent (at. %) Se to the monotectic point
2. The Czochralski method including feed of a liquid phase provides a means for producing single crystals within the concentration range from 33.7 at. % Se to 41 at. % Se at any temperature between 812° C. and 660° C., as the tie lines are aligned with the section plane.
3. Furthermore, the isopleth $CuInSe_2$—$C_{50}In_{50}$ shows a monotectic reaction, wherein the liquid phase $L_1$ dissolves at 600° C. into the $\alpha$-phase and another liquid phase $L_2$. This liquid phase $L_2$ is richer in indium than liquid phase $L_1$ and has therefore a higher density (a higher specific weight). Due to gravitation, the liquid phases $L_1$ and $L_2$ are positioned in layers one on top of the other and whereas the single crystal is grown from liquid phase $L_1$, the liquid phase $L_2$ below supplies the liquid phase $L_1$ with further material.

The isopleth $CuInSe_2$—$Cu_{70}In_{30}$ (FIG. 31) provides further possibilities for the production of $\alpha$-single crystals. This isopleth can be used for producing single crystals of the $\alpha$-phase according to the three above-mentioned methods between 33.5 at. % Se at 673° C. and 39.6 at. % Se at 805° C.

Moreover, the isopleth InSe—CuSe (FIGS. 30 and 51) enables the growth of single crystals of the $\alpha$-phase from the liquid phase $L_3$ according to both Czchoralski methods. The following data have to taken into consideration: Between 44 at. % Se at 800° C. and 49.5 at. % Se at 605° C. the tie lines are aligned with the section plane and form the boundary between the $\alpha$-phase and the liquid phase $L_3$.

The same is true for isopleth Se—$CuInSe_2$ (FIG. 45). Between 85 at. % Se at 805° C. and 99.99 at. % at 221° C. the $\alpha$-phase can be primarily grown from the liquid phase $L_4$. Hence the preconditions for single crystal growth of $\alpha$-copper-indium-selenide without phase transformation are fulfilled.

The invention is further explained by the following figures, tables and examples:

BRIEF DESCRIPTION OF THE DRAWINGS

1. In Examples I and II the $In_2Se_3$—$Cu_2Se$ isopleth (subsystem I), which constitutes a quasibinary section, and the In—$In_2Se_3$—$Cu_2Se$—Cu subsystem (subsystem II) are described. Example III deals with the $In_2Se_3$—Se—$Cu_2Se$ subsystem (subsystem III). This subsystem is further subdivided into the regions $In_2Se_3$—Se—$CuInSe_2$ (IIIa) and $Cu_2Se$—Se—$CuInSe_2$ (IIIb).

2. Equilibrium phase diagram In—Se between 33 and 60 at. % Se.

Figure 1:
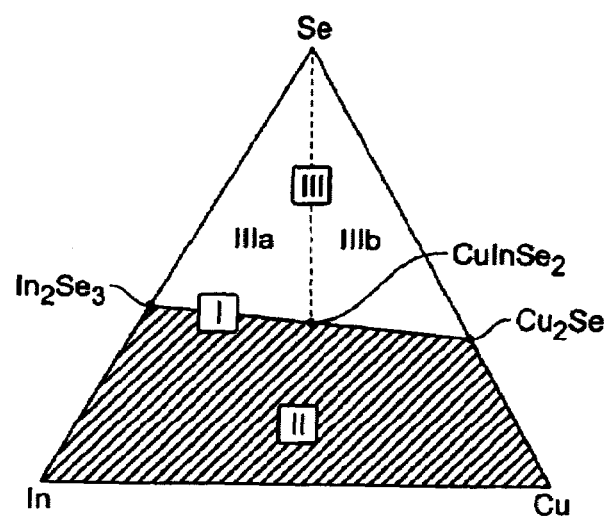

3. Diagram comparing metastable phases (solid lines) and stable phases (dotted lines) of the In—Se system.

3a. Phase diagram between 30 and 60 at. % Se.

3b. Enlarged region of FIG. 3a, indicating the position of thermal effects (open triangles) obtained after re-heating immediately after detecting the last thermal effects of supercooling (filled triangles).

4. Constellation leading to critical tie lines in the $In_2Se_3$—$Cu_2Se$ quasibinary section.

4a. Eutectic critical tie line.

4b. Peritectic critical tie line.

5. Three-dimensional sketches of critical tie lines in the ternary phase diagram.

5a. Eutectic critical tie line.

5b. Peritectic critical tie line.

5c. Region of homogeneous $\delta_R$ and the two-phase and three-phase equilibria that bound to $\delta_R$ at low temperatures.

6. The isopleth $In_2Se_3$—$Cu_2Se$ of Cu—In—Se. Our experimental results show that this section actually represents a quasibinary section.

7. Microstructure of $Cu_{46.5}In_{12.2}Se_{41.3}$ after different heat treatments.

7a. 3 h at 935° C.; water quench; SEM 200×.

7b. 12 h at 500° C.; water quench; 400×.

8. Microstructure of $Cu_{42.0}In_{50.0}Se_{43.0}$ after different heat treatments.

8a. 5 h at 850° C.; water quench; LM 200×.

8b. 5 h at 850° C.; water quench; 1000×.

9. Microstructure of $Cu_{60.0}In_{4.0}Se_{36.0}$ after 5 h at 850° C.; water quench; SEM 400×.

10. Microstructure of $Cu_{18.0}In_{29.4}Se_{52.6}$ after 60 h at 500° C., 70 h at 300° C., and 140 h at 100° C.; water quench; SEM 1000×.

11. Microstructure of $Cu_{18.5}In_{28.9}Se_{52.6}$ after different heat treatments.

11a. 60 h at 500° C., 70 h at 300° C., and 140 h at 100° C.; water quench; SEM 1000×.

11b. After cooling from 900° C. down to room temperature at 5 K/min; SEM 1000×.

12. Microstructure of $Cu_{21.0}In_{27.5}Se_{51.5}$ after different heat treatments.

12a. 12 d at 500° C.; water quench; SEM 2000×.

12b. 6 d at 500° C., 6 d at 300° C., and 6 d at 100° C., water quench; SEM 2000×.

13. Microstructure of $Cu_{23.5}In_{26.0}Se_{50.5}$ after different heat treatments.

13a. 12 d at 50° C., water quench; SEM 2000×.

13b. 6 d at 500° C., 6 d at 300° C., and 6 d at 100° C.; water quench; SEM 2000×.

14. Phase diagrams $In_2Se_3$—$Cu_2Se$ between 15 and 30 at. % Cu.

14a. Equilibrium phase diagram.

14b. Metastable phase diagram for solid solutions water-quenched to room temperature from 850° C.

15. Microstructure of $Cu_{26.0}In_{24.2}Se_{49.8}$ after 12 h at 850° C.; water quench; TEM 220 000×. Bright regions consist of α-$CuInSe_2$, dark regions of $(CuIn)_2Se$.

16. Isothermal section of the Cu—In—Se equilibrium phase diagram.

16a. Isothermal section at 500° C.

16b. Enlarged section of FIG. 16a.

17. Microstructure of $Cu_{10.0}In_{44.0}Se_{46.0}$ after 20 d at 500° C.; water quench; SEM 400×.

18. Microstructure of $Cu_{16.0}In_{33.0}Se_{51.0}$ after 20 d at 500° C.; water quench; SEM 400×.

19. Microstructure of $Cu_{18.0}In_{30.0}Se_{52.0}$ after 13 d at 500° C.; water quench; SEM 400×.

20. Microstructure of $Cu_{24.4}In_{25.2}Se_{50.4}$ after 3 d at 500° C., 4 d at 300° C., and 13 d at 180° C.; water quench; SEM 400×.

21. Equilibrium phase diagram Cu—In.

22. Equilibrium phase diagram Cu—Se.

23. Equilibrium phase diagram In—Se.

24. Schematic drawing of a ternary eutectic four-phase plane and a transition plane.

25. Constellations leading to the eutectic type of critical tie lines, such as $T_{k11}$, $T_{k12}$ and $T_{k13}$.

25a. Constellation leading to the metatectic critical tie line $T_{k11}$ ($\delta_H \leftrightarrows \alpha + L_2$).

25b. Phase equilibria at temperatures below the metatectic critical tie line $T_{k11}$.

25c. Constellation leading to the monotectic critical tie line $T_{k12}$ ($L_1 \leftrightarrows L_2 + \alpha$).

25d. Phase equilibria at temperatures below the monotectic critical tie line $T_{k12}$.

25e. Constellation leading to the eutectic critical tie line $T_{k13}$ ($L_2 \leftrightarrows \alpha + \gamma$).

25f. Phase equilibria at temperatures below the metatectic critical tie line $T_{k13}$.

26. Projection of the liquidus surface of subsystem II (In—$In_2Se_3$—$Cu_2Se$—Cu).

26a. Liquid phase isotherms, subdivision of the liquidus surface, and position of critical liquid phases at $U_1$ through $U_{16}$, $mo_{T1}$, $mo_{T2}$, $E_{T1}$, $E_{T2}$, $T_{k11}$, $T_{k12}$, and $T_{k13}$.

26b. Quasibinary section $In_2Se_3$—$Cu_2Se$ over the temperature interval between 850 and 1050° C.

26c. Schematic drawing showing the liquidus surface of the ternary phase HT.

26d. Graphical representation of the critical tie lines $T_{k11}$ and $T_{k12}$.

26e. Schematic drawing indicating the subdivision of the liquidus surface by In—Se phases.

26f. Subdivision of the liquidus surface at the In-rich corner.

27. Projection of four-phase planes, critical tie lines, and double saturation edges onto the concentration plane of the In—$In_2Se_3$—$Cu_2Se$—Cu subsystem.

27a. Projection of the four-phase planes $U_1$ through $U_{16}$, position of the critical tie lines $T_{k11}$ through $T_{k13}$, and position of the ternary monotectica $mo_{T1}$, $mo_{T2}$.

27b. Quasibinary section $In_2Se_3$—$Cu_2Se$ over the temperature interval between 850 and 1050° C.

27c. Schematic drawing indicating the position of the four-phase planes at $U_1$ and $U_{17}$ and the position of the critical tie lines $T_{k1}$, $T_{k2}$.

27d. Schematic drawing indicating the position of the four-phase planes $U_2$, $U_5$, $U_6$, $U_8$, $U_9$, and $U_{11}$.

27e. Projection of the four-phase planes $E_{T1}$ ($L_2 \leftrightarrows \alpha + \beta + Cu_2Se_H$) and $e_{Tsol}$ ($\beta \leftrightarrows \alpha + \alpha + \delta_{Cu}$).

28. Isopleth $In_{80.0}Se_{20.0}$—$Cu_{80.0}Se_{20.0}$.

29. Isopleth $In_{60.0}Se_{40.0}$—$Cu_{60.0}Se_{40.0}$.

30. Isopleth $In_{50.0}Se_{50.0}$—$Cu_{50.0}Se_{50.0}$.

31. Isopleth $CuInSe_2$—$Cu_{70.0}In_{30.0}$.

32. Isopleth $Cu_{25.0}In_{25.0}Se_{50.0}$—$Cu_{50.0}In_{50.0}$.

33. Color micrograph revealing the microstructure of $Cu_{48.0}In_{14.0}Se_{38.0}$. Brown regions belong to the α phase, white regions to the δ phase; LM 500×.

34. Microstructure of $Cu_{26.0}In_{26.0}Se_{48.0}$ after 15 h at 700° C.; water quench.

34a. SEM×1000; α (gray)+$L_1$ (bright, fine grains).

34b. SEM×4000; enlargement of FIG. 34a revealing details in the microstructure of $L_1$.

35. Microstructure of $Cu_{33.0}In_{33.0}Se_{34.0}$ after cooling down from the liquid state to room temperature at 5 K/min during DTA.

36. Isothermal section showing subsystem II (In—$In_2Se_3$—$Cu_2Se$—Cu) at 500° C.

37. Microstructure of $Cu_{48.0}In_{14.0}Se_{38.0}$ after 4 d at 500° C.; water quench.

37a. SEM 100×; $Cu_2Se_{H/R}$ (dark gray)+α (light gray)+ $α_{Cu}$ (white).

37b. SEM 1000×; $Cu_2Se_{H/R}$ (dark gray)+α (light gray)+ $α_{Cu}$ (black).

38. Microstructure of $Cu_{28.0}In_{33.4}Se_{38.6}$ after 4 d at 500° C.; water quench; SEM×200; $In_4Se_3$ (light gray)+η (white)+α (dark gray).

39. Microstructure of $Cu_{66.0}In_{30.0}Se_{4.0}$ after 21 d at 500° C.; water quench; etched; LM 250×; δ (gray)+α (black, small fraction).

40. Microstructure of $Cu_{77.0}In_{16.0}Se_{7.0}$ after 21 d at 500° C.; water quench; etched; LM 250×; δ (gray)+$α_{Cu}$ (white)+α (black, small fraction).

41. Microstructure of $Cu_{48.0}In_{22.0}Se_{30.0}$ after cooling from the liquid state down to room temperature at 5 K/min during DTA.

41a. SEM 300×; $L_1$ (bright)+$L_2$ (dark).

41b. SEM 1000×; enlargement of FIG. 41a, revealing details in the microstructure of $L_2$.

42. Microstructure of $Cu_{46.0}In_{12.5}Se_{41.6}$ after 15 min at 1020° C. (liquid); cooling from 1020° C. down to room temperature at 2 K/min.

42a. SEM 2000×; Cu whiskers form at the surface during solidification.

42b. SEM 3000×; different region of the same specimen.

43. Liquidus projection and liquidus isotherms in the Cu—In—Se ternary phase diagram.

43a. Liquidus isotherms, partitioning of the liquidus, scheme of eutectic, monotectic, and peritectic reactions, position of critical tie lines, and position of liquid phases of transition equilibria, ternary monotectica, and ternary eutectica.

43b. Schematic drawing indicating the partitioning of the liquidus near the Se-rich corner.

43c. Schematic drawing showing the position of the liquidus phases involved in the transition equilibria $U_{20}$ and $U_{21}$ and the position of the liquidus surfaces of $CuSe_2$, γ-CuSe, and $Cu_2Se_H$.

43d. Schematic drawing indicating the liquidus surfaces of indium selenides.

43e. Characteristic features of some critical tie lines.

43f. Schematic drawing showing the liquidus surface of the high-temperature phase $H_T$ ($Cu_{13}In_3Se_{11}$).

43g. Partitioning of the liquidus near the In-rich corner (schematic drawing).

44. Schematic drawing explaining the formation of the three-phase space $L_3+L_4+δ_H$.

44a. Phase fields at T=835° C., the temperature of $T_{k14}$.

44b. Phase fields below the temperature of $T_{k14}$.

44c. Extension of the three-phase space $L_3+L_4+δ_H$.

45. Isopleth Se—$CuInSe_2$.

46. Isopleth $In_{20.0}Se_{80.0}$—$Cu_{20.0}Se_{80.0}$.

47. Isopleth $In_2Se_3$—$Cu_{40.0}Se_{60.0}$.

48. Microstructure of $Cu_{30.0}In_{10.0}Se_{60.0}$ after 1 d at 500° C.; water quench.

48a. SEM 400×; $L_4$(gray)+$Cu_2Se_H$ (dark)+α (bright).

48b. LM 500×, bright-field, no etching; $L_4$(gray, fine-grained)+$Cu_2Se_H$ (light brown)+α (dark brown).

49. Microstructure of $Cu_{30.0}In_{10.0}Se_{60.0}$ after 2 d at 320° C.; water quench.

49a. SEM 200×; α (bright)+$CuSe_2$ (dark gray).

49b. LM 500×, bright-field, polarized light; α (gray)+$CuSe_2$ (finegrained).

50. Isothermal section at 900° C.

51. Isothermal section at 800° C. The symbols $β_1$ and $δ_1$ are shortcuts for $β-In_2Se_3$ and $δ-In_2Se_3$.

52. Isothermal section at 500° C. The legend introduces a few shortcuts for ternary phases and indium selenides.

53. Isopleth $Cu_{10.0}In_{90.0}$—$Cu_{10.0}Se_{90.0}$.

TABLES

1. Scheil reaction scheme of the In—$In_2Se_3$—$Cu_2Se$—Cu subsystem.

2. Scheil reaction scheme of the Se—$CuInSe_2$—$Cu_2Se$ subsystem (IIIb in FIG. 1).

3. Scheil reaction scheme of the $In_2Se_3$—Se—$CuInSe_2$ subsystem (IIIa in FIG. 1). The symbols $δ_1$, $γ_{2/3}$, and $α_{2/3}$ are shortcuts for $δ-In_2Se_3$, $γ-In_2Se_3$ and $α-In_2Se_3$, respectively.

4. Boundaries of the compositions for the four surface areas of primary crystallization of the α-phase.

DETAILED DESCRIPTION

We have carried out a thorough investigation of the entire Cu—In—Se phase diagram, including the liquidus surface of the entire ternary system and with particular emphasis on the $In_2Se_3$—$Cu_2Se$ section. We present the results of these experiments in three Parts, as indicated by FIG. 1. In Part I we discuss the $In_2Se_3$—$Cu_2Se$ section of the phase diagram. Parts II and III deal with the Cu—In—$In_2Se_3$—$Cu_2Se$ and $In_2Se_3$—$Cu_2Se$—Se subsystems, respectively. For each subsystem we present the corresponding part of the liquidus surface, a reaction scheme, and various vertical and isothermal sections of the phase diagram. Part II, moreover, includes the phase diagrams of the three binary boundary systems, Cu—In, Cu—Se, and In—Se.

1. Part I

1. Experimental 1.1. Production of Solid Solutions

The In—Se, Cu—Se, and Cu—In—Se solid solutions were prepared by fusing Cu, In, and Se with a total mass between 0.25 and 1.00 g in a high-frequency electromagnetic-field. The Cu we used had a purity of 99.999%, the In and the Se a purity of 99.9999%. The Cu was rolled to sheets with a thickness of 0.1 mm and cut into slices, Se was supplied as granules (~1 mm in diameter), and In was cut into small pieces. To avoid problems arising from the large heat of formation and the high vapor pressure of Se, the ingot was encapsulated in silica tub s with particularly strong walls. These tubes were filled with high-purity Ar at 820 mbar. Our experimental procedure combines the following advantages: (i) The high-frequency furnace we employed provides precise control of the temperature. (ii) Encapsulating the ingot in silica tubes allowed us to observe the material during processing. In particular, by observing the diffusion zone at Cu stripes protruding from the Se or In melt we could carefully control of the temperature. (iii) Owing to the large heat of formation and the high vapor pressure of Se, fusing of Cu—In—Se alloys normally causes excessive agitation of the components. The Ar filling of the tubes, however, solves this problem.

After fusing the ingot, the newly formed solid solutions were annealed in a muffle furnace for up to one hour at 950° C. To improve the homogeneity of the temperature distribution during this treatment we embedded the silica tubes in a large body of heat-resistant steel. Subsequently, we cooled the tubes in air and inspected the ingot. By mechanical agitation we detached the newly formed material and any left-overs of the ingot from the tube walls, put the tube back into the muffle furnace and melted it a second time. Depending on the composition, the melting point varied between 950 and 1020° C. We found that thermodynamic equilibrium can be approached most efficiently by a cooling procedure that includes periods of constant cooling rate (2 K/min) as well as periods at constant temperatures: 500° C., 300° C., and 100° C. In the following, we denote this procedure as 'step cooling'.

1.2 Differential Thermal Analysis

For differential thermal analysis (DTA) we encapsulated the alloys in silica tubes with thin walls and filled these with high-purity Ar at a pressure of 800 mbar to avoid evaporation of Se. As reference material we used 0.3 g Cu. Our DTA apparatus allows us to analyze two samples simultaneously, together with the (same) reference material. During the analysis the corresponding silica tubes reside in a metal chamber, which improves the temperature stability. The thermocouples probing the temperature were in direct contact with the silica tubes. The heating rate varied between 2 and 10 K/min, and the total mass of the DTA samples was between 0.25 and 0.5 g. At any temperature our apparatus allows us to quench the specimen by crushing the silica tubes while immersing them in water. Thus, we can analyze changes of the microstructure that occur along with phase transformations ex-situ by metallography and by TEM.

1.3 Characterization of Microstructure and Crystal Structure

For x-ray diffraction (XRD) analysis we employed the Guinier method. After pulverizing the corresponding material, encapsulating it in silica tubes, and relaxing the powder for one or two days at different temperatures we studied it with Cu—$K_{\alpha 1}$ radiation in a Guinier camera (Enraf-Nonius FR 552). For phase identification we used line diagrams of homogeneous phases as "fingerprints".

For metallographic studies by light microscopy (LM) and scanning electron microscopy (SEM) we used conventional methods of surface preparation, including polishing with diamond paste. For transmission electron microscopy (TEM) we employed the preparation method developed by Strecker et al. (Praktische Metallographie 30 (1993) 482). The TEM samples were investigated in a JEM 2000 FX (JEOL) transmission electron microscope, equipped with a system (Tracor Northern) for x-ray energy-dispersive analysis (XEDS).

2. The In—Se Component System

Figure 2:
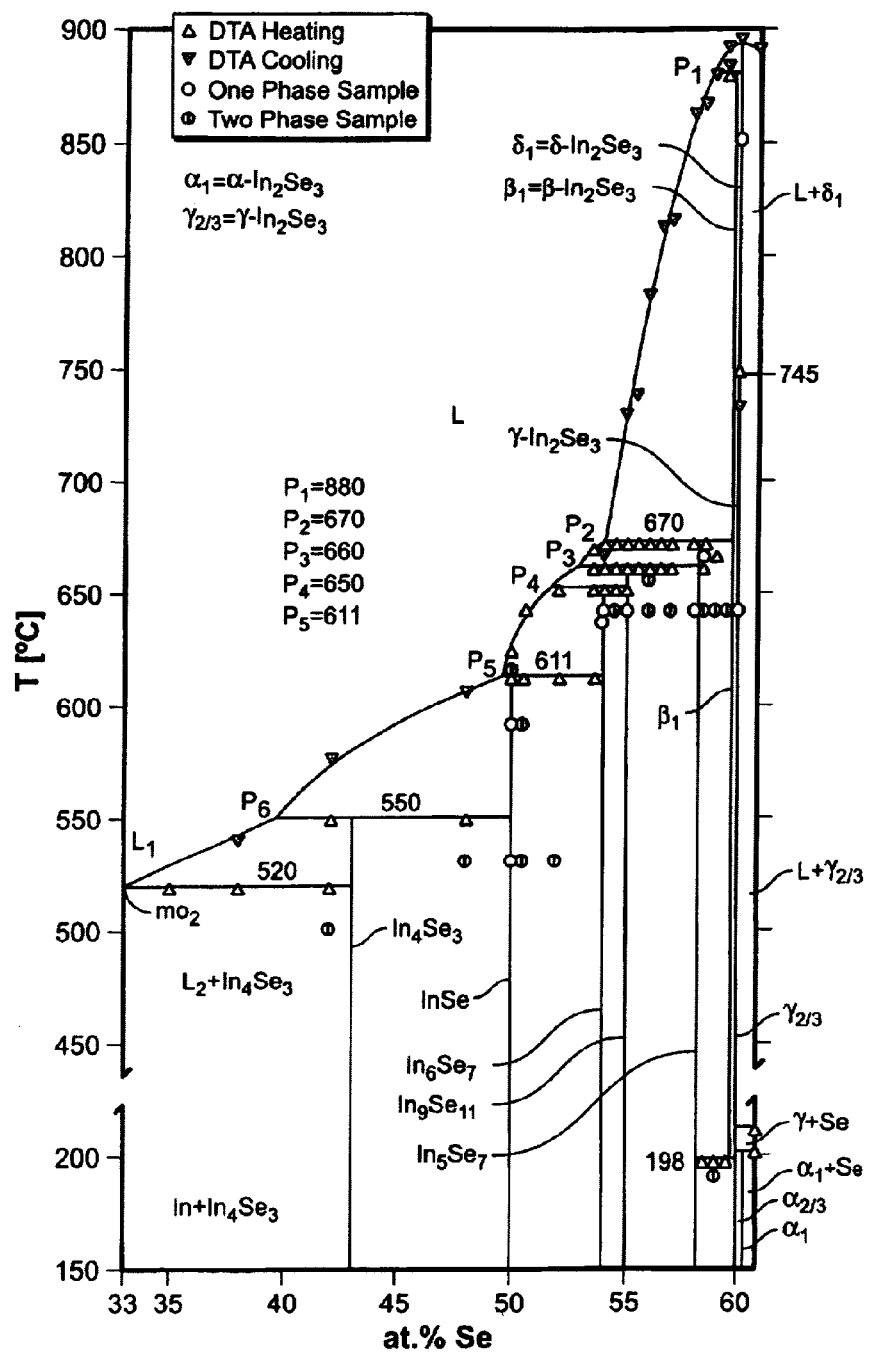

The In—Se component system is of major importance for the phase equilibria of the $In_2Se_3$—$Cu_2Se$ isopleth and for the isothermal section at 500° C. that we present in this publication. In recent work, the number of phases in this system, their composition range, and the sequence of their formation have been re-determined as depicted in FIG. 2. Accordingly, five different indium selenides occur in the composition range between 40 and 59 at. % Se: $In_4Se_3$, InSe, $In_6Se_7$, $In_9Se_{11}$, and $In_5Se_7$. The indium selenide $In_2Se_3$, which bounds the $In_2Se_3$—$Cu_2Se$ isopleth on the left, has been observed in four different modifications: $\delta$-$In_2Se_3$, $\beta$-$In_2Se_3$, $\gamma$-$In_2Se_3$, and $\alpha$-$In_2Se_3$. Experimental data on the crystal structures of these modifications are compiled in Lutz et al. (J. Less Common Materials 143 (1988), 83–92) and Pfitzner and Lutz (J. Solid State Chem. 124 (1996), 305–308).

On cooling down from high temperatures, $\delta$-$In_2Se_3$ forms congruently from the melt at 891° C. and transforms to $\gamma$-$In_2Se_3$ at 745° C. Stoichiometric $In_2Se_3$ does not undergo further transformations, and at room temperature one retains $\gamma$-$In_2Se_3$. Lutz et al. (supra) have obtained the same result by XRD. Recording XRD diagrams while heating, however, Lutz et al. observed the transformations $\gamma$-$In_2Se_3 \rightarrow \beta$-$In_2Se_3$ at 687° C. and $\beta$-$In_2Se_3 \rightarrow \delta$-$In_2Se_3$ at 807° C. Furthermore, on cooling samples that had been tempered above 697° C., Lutz et al. observed several metastable phases: $\alpha$-$In_2Se_3$(H), $\alpha$-$In_2Se_3$(R), $\beta'$-$In_2Se_3$, and $\beta$-$In_2Se_3$ (R). According to our experimental data, however, $\alpha$-$In_2Se_3$ constitutes a stable phase that forms from Se and $\gamma$-$In_2Se_3$ in a peritectoid reaction at 201° C. and is minutely richer in Se than stoichiometric $In_2Se_3$.

Furthermore, FIG. 2 indicates that on heating, $\beta$-$In_2Se_3$ decomposes into the melt $p_2$ and $\delta$-$In_2Se_3$ in a peritectic reaction at 880° C. At 198° C., an eutectoid reaction decomposes $\beta$-$In_2Se_3$ into $In_5Se_7$ and $\gamma$-$In_2Se_3$. Similar to $\alpha$-$In_2Se_3$, $\beta$-$In_2Se_3$ slightly deviates from the stoichiometric composition $In_2Se_3$, however towards the In-rich side of the phase diagram.

Figure 3A:
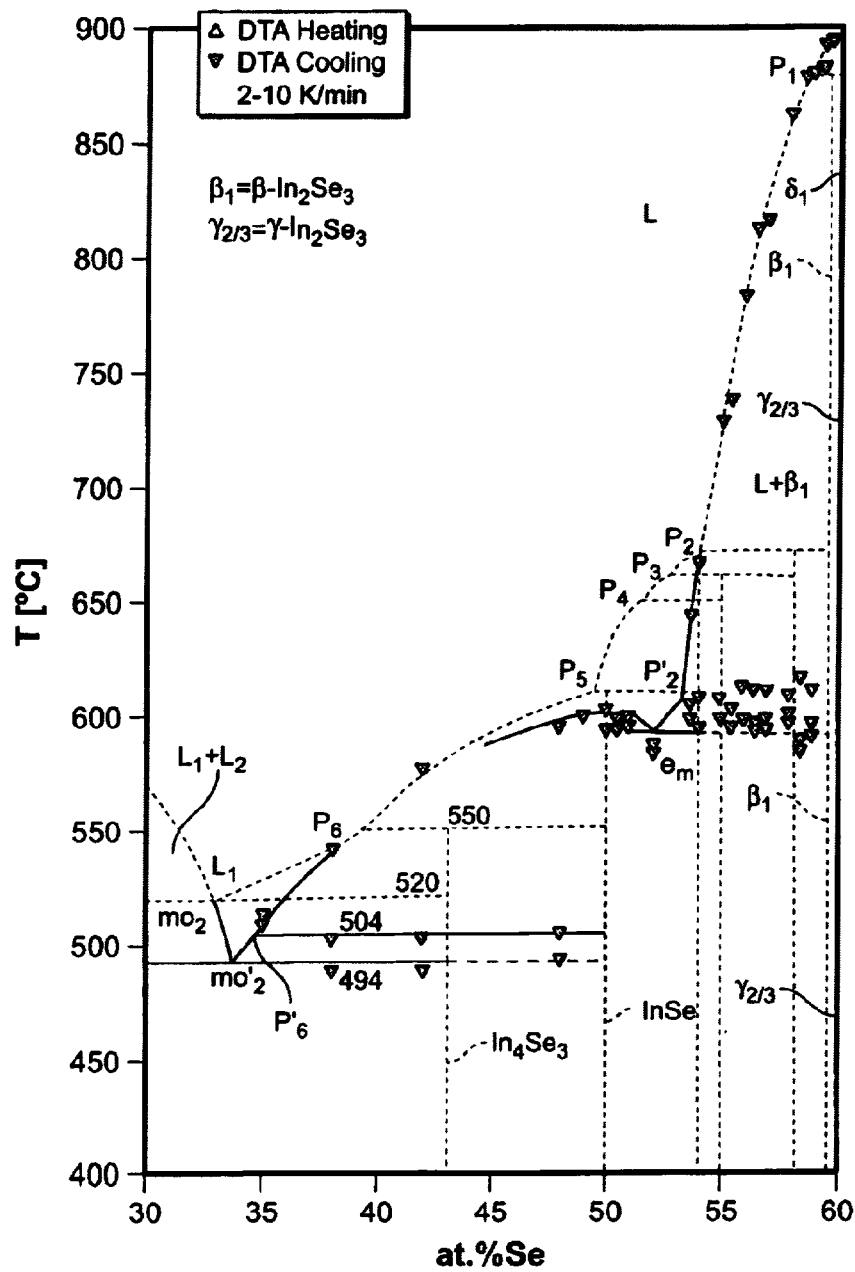
Figure 3B:
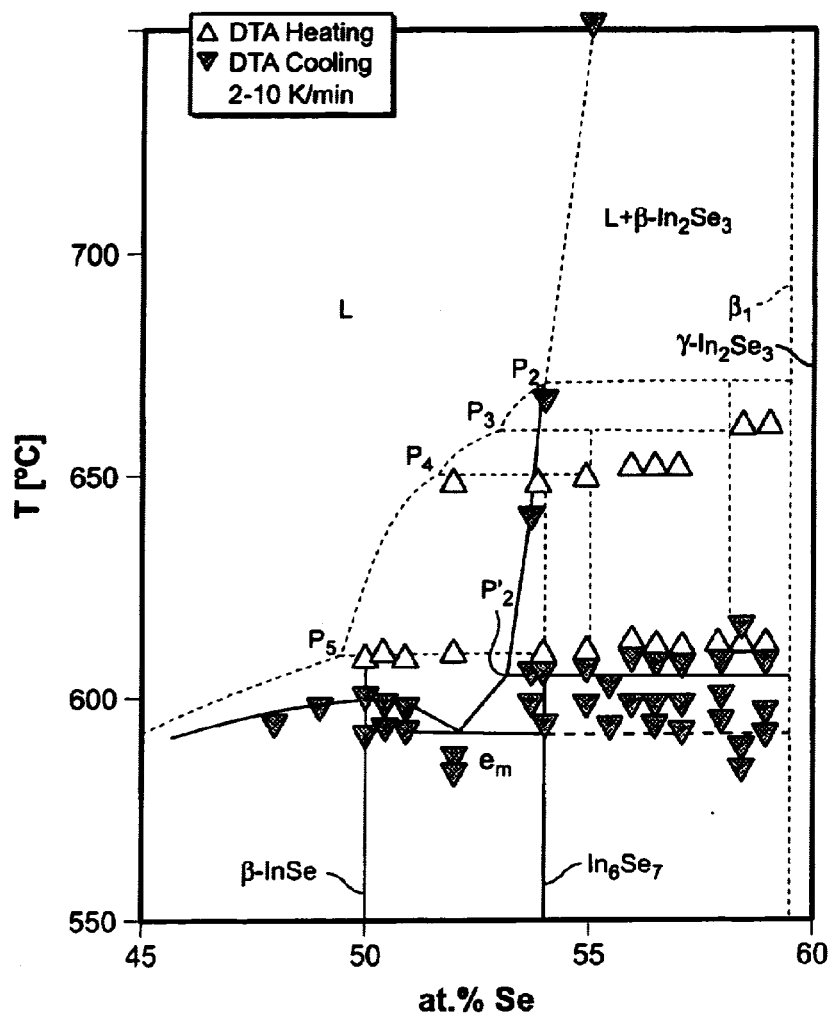

In order to determine the temperatures $mo_1$ and $p_2$ through $p_6$ of the corresponding monotectic and peritectic reactions in FIG. 2 we performed DTA during heating, not cooling, after first equilibrating the specimen at the starting temperature. This was necessary because when cooling down a melt with a Se content between 48 and 54 at. % at a rate between 2 and 10 K/min, supercooling occurs and leads to metastable states. FIGS. 3*a* and 3*b* present the corresponding metastable phase diagram by solid lines, while the dotted lines correspond to the stable phase diagram of FIG. 2. Black solid triangles indicate where we have detected transformation-related effects by DTA during cooling. The metastable equilibria at $e_m$ and $p_2'$ have already been described in earlier work by Gödecke et al. (J. Phase Equ. 19 (1998), 572–576).

3. Critical Tie Lines

The Cu—In—Se system in general, and in particular the $In_2Se_3$—$Cu_2Se$ isopleth comprise a variety of invariant equilibria. To prepare the subsequent discussion of our experimental results, this section briefly reviews the different types of such equilibria.

Invariant equilibria in ternary systems belong to either one of two families: (i) four-phase equilibria and (ii) invariant three-phase equilibria. Four-phase equilibria are further divided in: ternary eutectica, ternary peritectica, and transition equilibria. Invariant three-phase equilibria occur in the binary boundary systems and in quasibinary sections of a ternary system, where the two constituting phases behave like the elements of a binary system. In the example of the $In_2Se_3$—$Cu_2Se$ section, which we show further below to qualify as quasibinary indeed, these quasibinary "elements" correspond to $In_2Se_3$ and $Cu_2Se$. In quasibinary sections, therefore, three-phase equilibria imply invariance—in accordance with Gibbs' phas rule for two components. For this reason, one denotes the tie lines that indicate invariant three-phase equilibria in the phase diagram as "critical tie lines".

There are two basic types of critical tie lines (or invariant three-phase equilibria): (i) eutectic and (ii) peritectic critical tie lines, depending on, whether a liquid phase decomposes into two solid phases (L$\rightarrow\alpha+\beta$), or a liquid phase reacts with a solid phase to produce another solid phase (L+$\alpha\rightarrow\beta$). From these basic types one may derive further categories of critical tie lines, namely monotectic critical tie lines (L$_1\rightarrow$L$_2+\alpha$), metatectic ($\alpha\rightarrow$L+$\beta$), eutectoid ($\alpha\rightarrow\gamma+\beta$), or peritectic critical tie lines ($\alpha+\beta\rightarrow\gamma$).

All these different types of critical tie lines do actually occur in the Cu—In—Se system. Moreover, we have found a variety of four-phase equilibria. According to Gibbs' phase rule, four-phase equilibria in ternary systems imply non-variance. Among the four-phase equilibria, one distinguishes between three types: (i) ternary eutectica, (ii) ternary peritectica, and (iii) transition planes, planes at whose temperature two three-phase equilibria are replaced by two other three-phase equilibria (see FIG. 24). As variants of the latter, we have observed a variety of ternary monotectic reactions and ternary eutectoid four-phase planes. These four-phase equilibria and the critical tie lines essentially determine the phase equilibria of the Cu—In—Se ternary system. In all three parts of this work, therefore, we explain some particularly important types of invariant equilibria by means of schematic graphical illustrations and by reaction schemes.

Figure 4A:
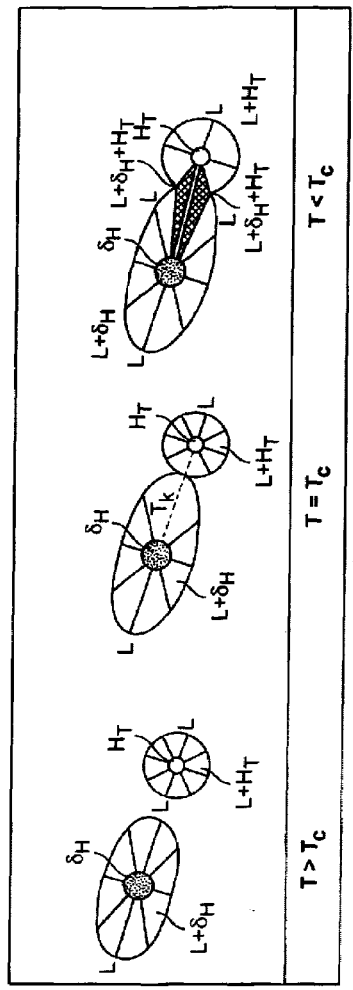
Figure 4B:
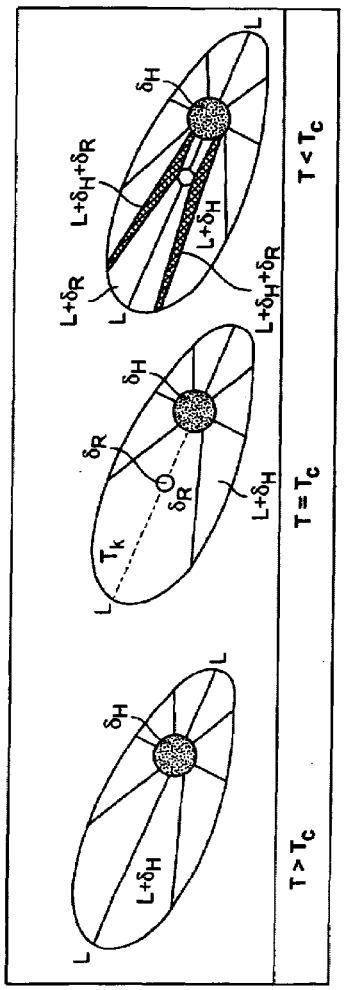

FIG. 4 illustrates the formation of a eutectic critical tie line (FIG. 4a) and a peritectic critical tie line (FIG. 4b). Eutectic critical tie lines always occur, for example, if, on cooling, the liquidus isotherms of two different two-phase regions touch each other. In FIG. 4a this occurs at $T=T_c$, where the tie lines of the two-phase regions $L+\delta_H$ and $L+H_T$ form a common, "critical" tie line $T_k$. At the critical point, the point where the liquidus isotherms touch each other, the liquid phase decomposes into $\delta_H$ and $H_T$ in a eutectic reaction. Below the critical temperature $T_c$, FIG. 4a indicates the existence of two monovariant three-phase equilibria $L+\delta_H+H_T$ (dark regions), one on each side of the critical tie line.

The isothermal section in FIG. 4b explains a peritectic critical tie line. The plane of this isothermal section just intersects with the maximum of the phase field $\delta_H$, and the tie lies between $\delta_H$ and the melt L extend from the point of intersection in a radial arrangement. On cooling down to the critical temperature $T_c$ of this isothermal section, $\delta_R$ forms in the peritectic reaction $L+\delta_H \rightarrow \delta_R$. At this temperature the solid phases $\delta_H$ and $\delta_R$ and the melt L make a common, critical tie line (dotted line in FIG. 4b). At temperatures below $T_c$ the critical tie line develops into two monovariant peritectic three-phase spaces $L+\delta_H+\delta_R$ (dark regions).

FIG. 5 demonstrates the constellations that lead to eutectic and peritectic critical tie lines by means of three-dimensional sketches. In these drawings one can recognize particularly well the evolution of the respective three-phase spaces that develop on cooling below the critical temperature $T_c$. FIG. 5a shows the three-phase spaces $L+\delta_H+H_T$ for a eutectic critical tie line, while FIG. 5b shows the three-phase spaces $L+\delta_H+\delta_R$ beneath a peritectic critical tie line. FIG. 5c shows the region of homogeneous $\delta_R$, which forms by peritectic reaction, as well as the two-phase and three-phase equilibria that bound to $\delta_R$ at low temperatures.

The examples of FIG. 5 also demonstrate that one may denote a isopleth as "quasibinary" only if all critical tie lines section and all tie lines of adjacent two-phase equilibria lie parallel to the plane of the section. If not—if, for example, a critical tie line makes a finite angle with the plane of the isopleth—the section includes not only invariant but also monovariant three-phase-spaces, and the tie lines of the adjacent two-phase equilibria exhibit an inclination versus the plane of the section.

The phases denoted as $\delta_{H,R}$, and $H_T$ in FIGS. 4 and 5 actually exist in the Cu—In—Se system and have a finite extension within the isopleth $In_2Se_3$—$Cu_2Se$. In Examples II and III we describe the constellations that lead to metatectic and monotectic critical tie lines.

4. Experimental Results

The results in this Example and those in Examples II and III prove that $In_2Se_3$—$Cu_2Se$ indeed constitutes a quasibinary system: Along the $In_2Se_3$—$Cu_2Se$ isopleth of the Cu—In—Se system we have found a total of 10 critical tie lines, and all these lie in the plane of the section. Furthermore, the data we have obtained for the adjacent subsystems, which we describe in Examples II and III, reveals that all tie lines become parallel to the $In_2Se_3$—$Cu_2Se$ isopleth as one approaches the plane of this isopleth.

4.1 Stable Equilibria of the $In_2Se_3$—$Cu_2Se$ Subsystem

FIG. 6 presents the major result of this publication, the $In_2Se_3$—$Cu_2Se$ section of the Cu—In—Se phase diagram. To obtain this diagram we investigated a total of 73 different alloys with the experimental methods described in section 1.

A dense sampling of the composition space was necessary to distinguish between the primary crystallization surfaces of $Cu_2Se$ and $\delta$-$In_2Se_3$, and between those of the ternary phases $\delta_H, \delta_R$ ($CuIn_3Se_5$), $\alpha$ ($CuInSe_2$), $\gamma_T$ ($CuIn_5Se_8$), and $H_T$ ($Cu_{13}In_3Se_{11}$). Since there has been confusion about the designation of these phases in the literature, we have designated them such that their names conform with those in the three boundary systems Cu—Se (Example II), In—Se (section 2), and Cu—In (Example II). The subscripts "H" and "R" indicate high temperature and room temperature modifications, respectively, while the subscript "T" serves to distinguish ternary phases from binary phases with the same symbol. Mixed subscripts, like $Cu_2Se_{H/R}$ or $\delta_{H/R}$, indicate a transformation from a high-temperature to a room temperature modification that we were not able to suppress by quenching. Non-equilibrium phases (including metastable phases) are marked by the subscript "m". $T_{k1}, T_{k2}, \ldots T_{k10}$ denote the 10 critical tie lines. In order to facilitate comparison with the results we show in Examples II and III, FIG. 6 indicates the composition in atomic percent copper rather than mole percent $Cu_2Se$. Some further details of our nomenclature, like abbreviated names for some phases, are given in legend of the respective phase diagrams or reaction schemes.

In the following three sections we describe the two-phase equilibria and the 10 critical tie lines of the $In_2Se_3$—$Cu_2Se$ subsystem. Section 4.1.1 deals with the composition range between $CuInSe_2$ and $Cu_2Se$, while in sections 4.1.2 and 4.1.3 we describe compositions between $In_2Se_2$ and $CuInSe_2$.

4.1.1 The Composition Range $CuInSe_2$—$Cu_2Se$

Figure 6A:
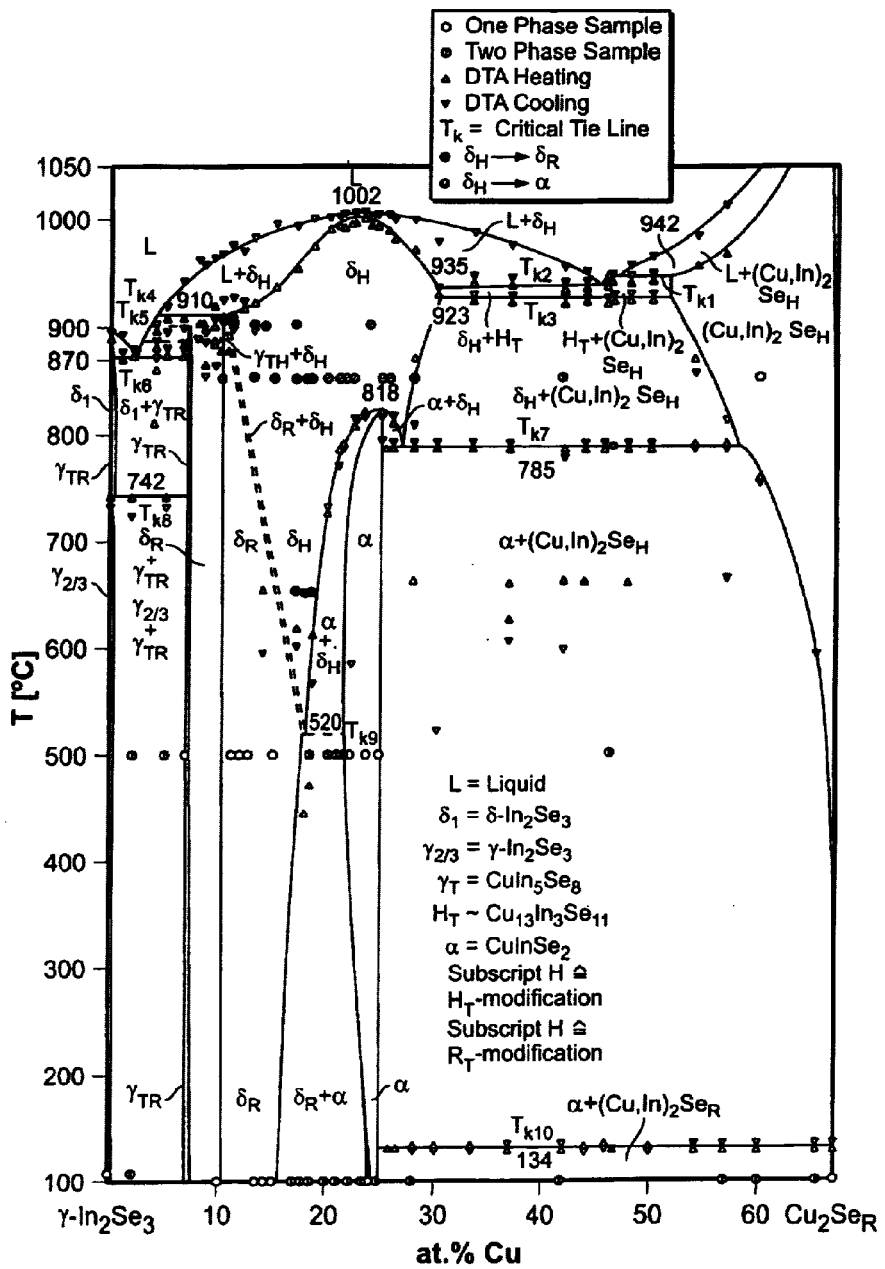
Figure 6B:
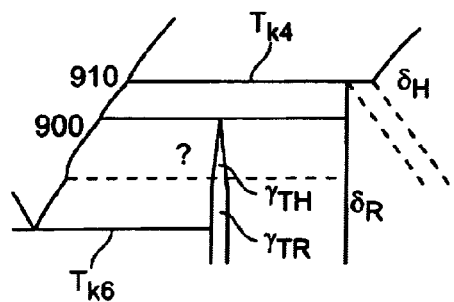
Figure 6C:
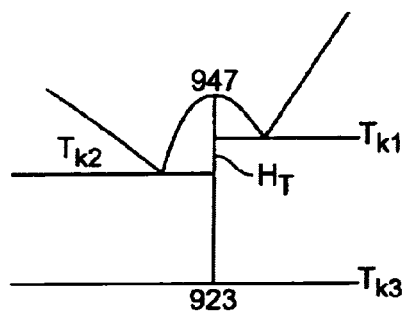
Figure 6D:
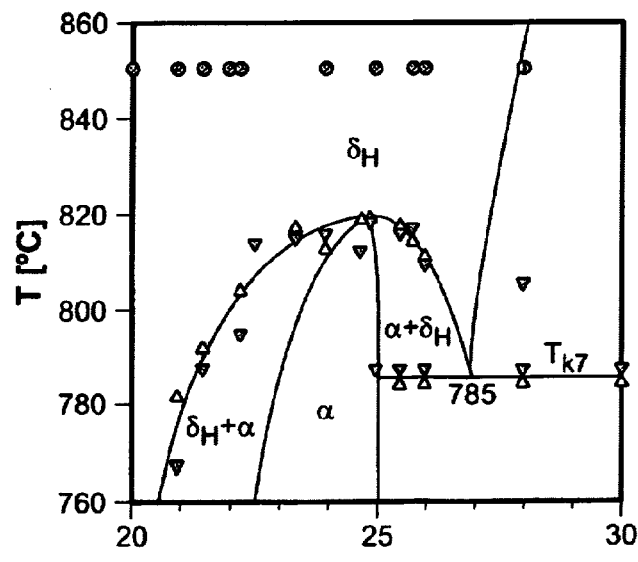

FIG. 6, and in particular the enlarged section in FIG. 6c indicate that on cooling down from high temperatures the crystallization of solid begins with the ternary phases $\delta_H$ and $H_T$, which have their maximum melting points of 1002° C. and 947° C. at 23.5 at. % and at 46.5 at. % Cu, respectively. Each one of the reactions $T_{k1}$ through $T_{k6}$ involves one liquid phase and corresponds to either a eutectic or a peritectic critical tie line (compare FIG. 4). The high-temperature phase $H_T$ only exists over a narrow temperature interval of 24 K. At $T_{k3}$ (923° C., FIG. 6c) $H_T$ decomposes in to $\delta_{HR}$+(Cu, In)$_2Se_{H/R}$ in a eutectic reaction. $H_T$ has the composition $Cu_{46.5}In_{12.2}Se_{41.3}$, which roughly corresponds to the composition $Cu_{13}In_3Se_{11}$. We have not observed, however, the high-temperature phase with the composition $Cu_{50}In_{10}Se_{40}$ ($Cu_5InSe_4$).

The high-temperature phase $\delta_H$ also decomposes in a eutectoid reaction; according to FIGS. 6a and d, $\delta_H$ decomposes into $\alpha$+(Cu, In)$_2Se_{H/R}$ at $T_{k7}$ (785° C.). At $T_{k10}$ the high-temperature modification $Cu_2Se_H$ transforms to $Cu_2Se_R$+$\alpha$. The phases $\delta_H$, $H_T$, and (Cu, In)$_2Se_H$ cannot be stabilized down to room temperature by water quenching. Data points indicating the extension of homogeneous (Cu, In)$_2Se_H$ are located at 52.0 at. % Cu and 942° C., at 58.0 at. % Cu and 785° C., and at 66.4 at. % Cu and 450° C.

Figure 7A:
Figure 7B:
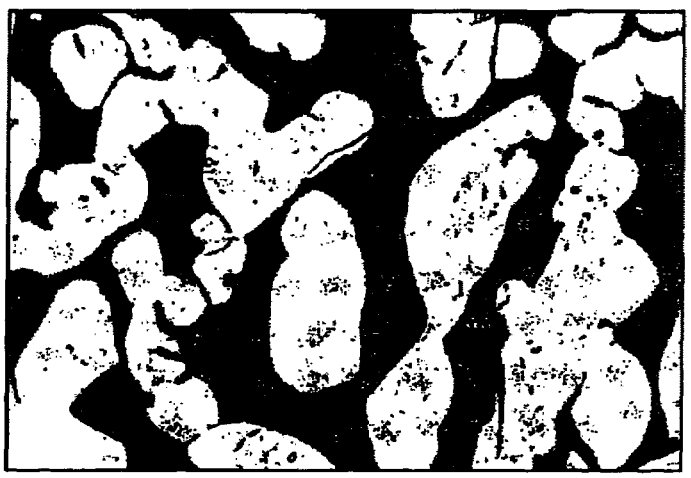

To demonstrate the evolution of the microstructure for alloy compositions between $CuInSe_2$ and $Cu_2Se$ we have included FIGS. 7, 8, and 7. FIG. 7a reveals the microstructure that results from eutectoid decomposition of the high-temperature phase $H_T$ into $\delta_{H/R}$+(Cu, In)$_2Se_{H/R}$ (dark). To obtain this microstructure the alloy $Cu_{46.5}In_{12.2}Se_{41.3}$ had been quenched from 935° C. The lamellar, even distribution of phases within the formerly homogeneous $H_T$ grains indicates the eutectoid decomposition. On tempering the same alloy for 12 d at 500° C. and subsequent quenching in water one obtains the phase equilibrium $\alpha$+(Cu, In)$_2Se_{H/R}$ (FIG. 7b). The SEM back-scattering micrograph shows $\alpha$ as bright and (Cu, In)$_2$Se$_{H/R}$ as dark regions. The eutectoid decomposition of $\delta_H$ into $\alpha$+(Cu, In)$_2$Se$_{H/R}$ shows clearly within the bright regions of $\alpha$ in FIG. 7b. The fine-grained bright precipitates within the dark regions of (Cu, In)$_2$Se$_{H/R}$ consist of $\alpha$ (CuInSe$_2$).

FIGS. 8 and 9 reveal the microstructure of Cu$_{42.0}$In$_{15.0}$Se$_{43.0}$ (FIG. 8) and Cu$_{60.0}$In$_{4.0}$Se$_{36.0}$ (FIG. 9) after heating to 850° C. and quenching in water. These micrographs serve to document the microstructure of (Cu, In)$_2$Se$_H$ after quenching. According to the phase diagram in FIG. 6, heating Cu$_{42.0}$In$_{15.0}$Se$_{43.0}$ to 850° C. leads to a microstructure that consists of the phases $\delta_H$ and (Cu, In)$_2$Se$_H$. Since quenching in water does not stabilize these two phases down to room temperature, FIG. 8 reveals precipitates of the $\alpha$ phase (bright) in the (Cu, In)$_2$Se$_{H/R}$ matrix. Moreover, the micrographs in FIGS. 8a and 8b reveal that the eutectoid decomposition of $\delta_H$ into (Cu, In)$_2$Se$_{H/R}$+$\alpha$ has taken place at T$_{k7}$ in the formerly homogeneous regions of $\delta_H$ (bright).

FIG. 9 presents the microstructure of Cu$_{60.0}$In$_{4.0}$Se$_{36.0}$. The formerly homogeneous matrix of (Cu, In)$_2$Se$_{H/R}$ (dark) reveals precipitates (bright), which are lined up along crystallographic directions. Comparison with FIGS. 8a and b reveals that these precipitates consist of $\alpha$. By DTA data of some alloys with a Cu content between 28 and 57 at. % (FIG. 6) we have observed spurious effects between 600 and 650° C. These effects appear to have their origin in small deviations from the desired alloy composition.

4.1.2 The Composition Range In$_2$Se$_3$—CuInSe$_2$ Between 10 and 25 at. % Cu

The composition range between 10 and 25 at. % Cu in FIG. 6 features solid state phase transformations from the high-temperature phase $\delta_H$ to $\delta_R$ and from $\delta_H$ to $\alpha$. The point where the $\alpha$ phase field has its maximum temperature, 818° C., does not correspond to the stoichiometric composition with 25.0 at. % Cu but only to 24.8 at. % Cu. By DTA it was not possible to determine with sufficient precision the field of compositions where $\delta_R$ coexists with $\delta_H$ because the heat released by this transformation is too small. Therefore, the field $\delta_R$+$\delta_H$ appears with dotted lines in FIG. 6. These lines were determined by XRD: From alloys with a Cu content between 10.0 and 18.5 at. %, which had been annealed at temperatures above the dotted lines, we obtained XRD patterns in which the superlattice reflections of the $\delta_R$ phase appeared diffuse. Below the dotted lines, in contrast, we always observed sharp superlattice reflections. On the basis of these observations, however, we cannot exclude that the transformation $\delta_H$→$\delta_R$ is of higher order. Extrapolation of our data for the $\delta_H$→$\delta_R$ transformation leads from 18 at. % Cu and 520° C. to 10 at. % Cu and 910° C. and then directly to the field L+$\delta_H$ in FIG. 6.

From the critical point at 818° C. two regions $\delta_H$+$\alpha$ extend towards lower temperatures. One of these two-phase regions ends at the critical tie line T$_{k7}$ (785° C.), while the oth r one first contributes to the critical tie line T$_{k8}$ (520° C.) and then persists as $\delta_R$+$\alpha$ down to room temperature because of the phase transformation $\delta_H$→$\delta_R$.

Between 500 and 550° C. the compositional extension of the $\alpha$ phase field reaches its maximum of 3.5 at. % Cu. Further decrease of the temperature narrows this field to ⁻1 at. % Cu at 100° C. The lateral extension of the two-phase region $\delta_{H/R}$+$\alpha$ in FIG. 6 was only observed after step cooling—when interrupting the standard cooling process, which proceeded at 2 K/min, by extended annealing at 500° C. (60 h), 300° C. (70 h), and 100° C. (140 h). The boundaries of the $\alpha$ phase field in FIG. 6 were determined by combining the data we obtained by SEM, TEM, DTA, and XRD.

In alloys of the $\delta_R$+$\alpha$ region that had undergone our special procedure of step cooling we have observed the same precipitates with several different dispersions. Such a microstructure with precipitates on different length scales develops because the phase fields of $\alpha$ and $\beta$ become narrower on both sides with decreasing temperature. The micrographs of FIGS. 10 and 11a show large precipitates in which further decomposition has occurred during the isothermal annealings of our step cooling procedure. During each one of the isothermal annealings at 500, 300 and 100° C. the fractions of the individual phases adjust themselves according to the inverse lengths of the respective tie line sections—thus according to the lever rule.

Completely different volume fractions of $\alpha$ and $\delta_{H/R}$ are obtained, however, when cooling down from 900° C. to room temperature at a constant rate of 5 K/min. This becomes obvious when comparing the micrographs of Cu$_{18.5}$In$_{28.9}$Se$_{52.6}$ in FIG. 11a with that in FIG. 11b. While in FIG. 11a the volume fractions of $\alpha$ and $\delta_{H/R}$ obey the lever rule, FIG. 11b indicates an increased volume fraction of $\alpha$ (dark). Moreover, the two micrographs reveal significant differences in the morphology of the precipitates after the two different cooling procedures.

Figure 12A:
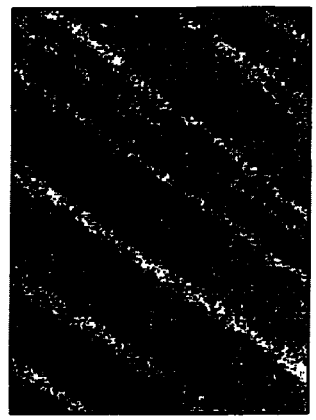
Figure 12B:
Figure 13A:
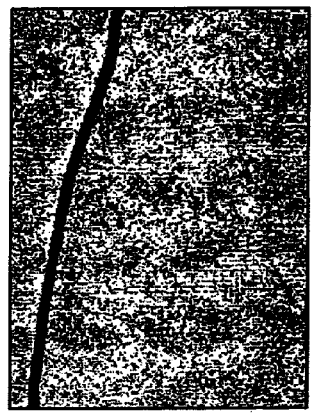
Figure 13B:

The micrographs in FIGS. 12 and 13 serve to compare the microstructures of alloys annealed at 500° C. for 12 d and quenched in water (FIGS. 12a and 13a) with the microstructure of alloys that have undergone our step cooling procedure (FIGS. 12b and 13b). The alloy with 21.0 at. % Cu (Cu$_{21.0}$In$_{27.5}$Se$_{51.5}$) and the one with 23.5 at. % Cu (Cu$_{23.5}$In$_{26.0}$Se$_{50.5}$) that have been annealed at 500° C. and quenched in water consist of $\delta_R$+$\alpha$ (FIG. 12a) and pure $\alpha$ (FIG. 13a), respectively. FIG. 12a features the $\delta_R$ phase as bright stripes. Step cooling of these alloys, in contrast, leads to different volume fractions of $\alpha$ and $\delta_R$ (FIG. 12b).

Cooling down the alloy with 23.5 at. % Cu from its homogeneous state at 500° C. leads to a fine dispersion of $\delta_R$ precipitates (FIG. 13b). Here and there we have also observed round precipitates with a bright SEM backscattering contrast in this alloy. These precipitates turned out to be InSe. This indicates that the homogeneity range of the $\alpha$ phase becomes rather narrow at temperatures around 100° C.; at low temperatures already small deviations from the stoichiometric composition CuInSe$_2$ lead to precipitation of various different phases (section 2).

The micrographs we have described so far indicate that not only the duration of an annealing treatment at a given temperature but also the thermal history has a strong effect on the microstructure that results at this particular temperature, particularly at low temperatures. In principle one could quantitatively establish the correlation between the cooling procedure and the microstructure, but this would require an unmanageable number of supercooling diagrams.

4.1.3 The Composition Range In$_2$Se$_3$—CuInSe$_2$ Between 0 and 12 at. % Cu

The composition range between 0 and 12 at. % Cu features the critical tie lines T$_{k4}$, T$_{k5}$, T$_{k6}$, and T$_{k8}$ and the ternary phase CuIn$_5$Se$_8$, which is denoted as $\gamma_T$ in FIG. 6. At T$_{k4}$ (910° C.) the room temperature modification $\delta_R$ forms by the peritectic reaction L+$\delta_H$→$\gamma_T$. Between T$_{k4}$ (910° C.) and T$_{k5}$=900° C., therefore, $\delta_R$ precipitates directly from the melt. The critical tie line T$_{k5}$ represents the formation of $\gamma_T$ (CuIn$_5$Se$_8$) by the peritectic reaction L+$\delta_R$⇌$\gamma_T$. A ternary phase of the same composition has also been described in Manolikas et al. (Physica Status Solidi A55 (1979), 709–722) and Boehnke and Kühn (J. Mater. Sci. 22 (1987), 1635–1641). Some of the thermal effects that we have observed by DTA near 880° C. support the hypothesis that $\gamma_T$ actually has different modifications at temperatures below and above 880° C. (schematic drawing FIG. 6b), thus transforms from a high-temperature modification ($\gamma_{HT}$) to a room temperature modification ($\gamma_{RT}$)

The last critical tie line that involves a liquid phase, $T_{k4}$, occurs at 870° C. At $T_{k4}$ the melt L decomposes by the eutectic reaction L→δ-In$_2$Se$_3$+$\gamma_T$. In FIG. 6 we have denoted the phase δ-In$_2$Se$_3$ as $\delta_1$. The polymorphic transformation from δ-In$_2$Se$_3$ to γ-In$_2$Se$_3$ leads to the critical tie line $T_{k5}$ (742° C.), the last critical tie line on the In-rich side of the In$_2$Se$_3$—Cu$_2$Se section. Below $T_{k8}$ the phases γ-In$_2$Se$_3$ and $\gamma_T$ coexist down to room temperature.

In Example II, where we describe the subsystem In—In$_2$Se$_3$—Cu$_2$Se—Cu (FIG. 1), we summarize the 10 critical tie lines of the In$_2$Se$_3$—Cu$_2$Se section and its four-phase reactions in a reaction scheme.

4.2 Phase Diagram of Supercooled Alloys

Annealing at 850 to 900° C. and subsequent quenching of alloys with a Cu content between 15 and 28 at. % has revealed the effect of supercooling on the precipitation of α from $\delta_{H/R}$ and on the transformation $\delta_H$→α near the maximum of the afield at 818° C. FIGS. 6a, 6b, 14a, and 14b depict the result of these experiments. XRD studies on pulverized samples of the respective alloys showed that quenching in water cannot suppress the reaction $\delta_H$→α for alloys with a Cu content between 20.0 and 26.0 at. %; for these alloys the XRD patterns exhibited sharp lines of the α phase. TEM confirmed the phase transformation and revealed that for Cu contents between 20.0 and 25.5 at. % $\delta_H$ transforms completely to α. The alloy with 26.0 at. % Cu, in contrast, already features small precipitates of (Cu, In)$_2$Se$_{H/R}$ in the α matrix (FIG. 15).

Figure 14A:
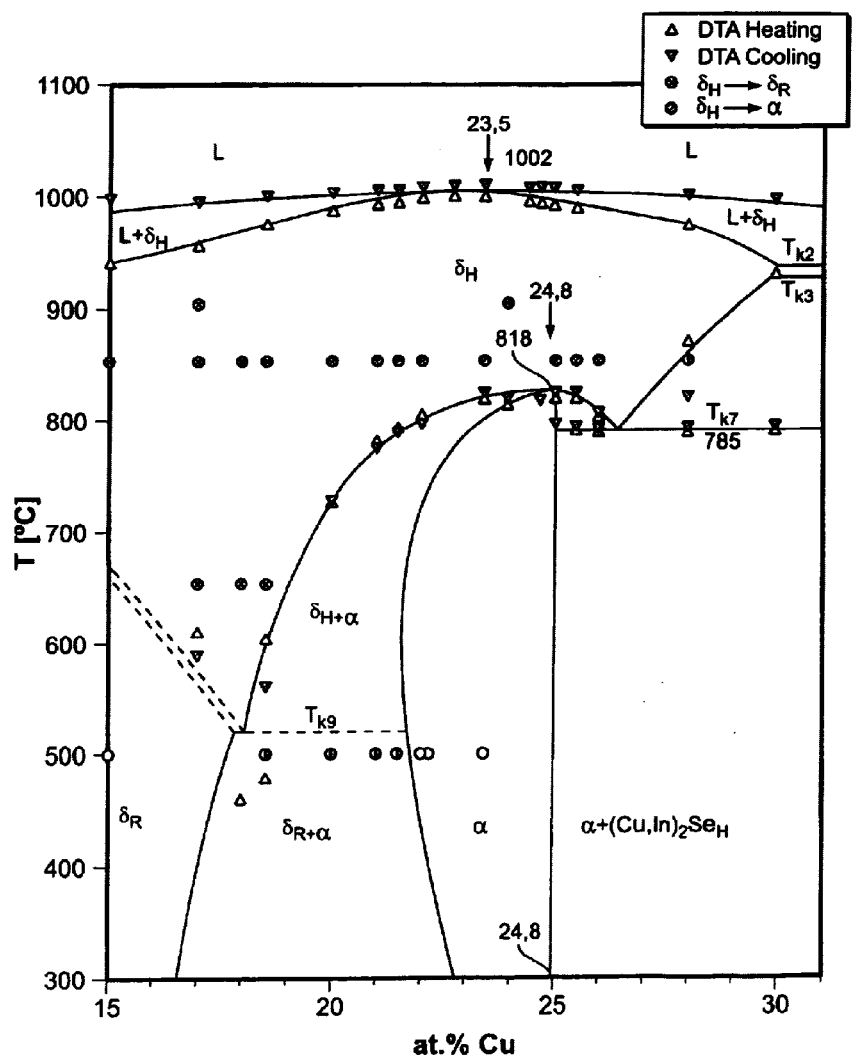
Figure 15:
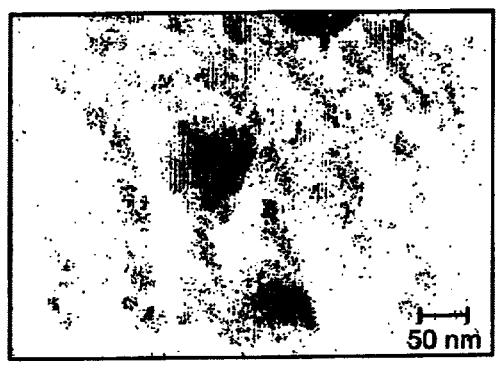

FIGS. 14a and b show the phase transformation $\delta_H$→α in the presence of supercooling in comparison with the equilibrium phase diagram for Cu contents between 15.0 and 30.0 at. %. The legend indicates the symbols we use to indicate which data points we have obtained by XRD and which ones by DTA.

XRD diagrams of alloys with a Cu content between 15.0 and 18.5 at. % exclusively exhibited the reflections of $\delta_R$. In alloys with a Cu content between 20.0 and 26.0 at. % the temperatures of the thermal effects that we have observed by DTA during heating and cooling agree very well with each other and confirm the upper boundary of the $\delta_H$+α phase field in FIG. 14a. The corresponding composition range, between 20.0 and 26.0 at. % Cu, nearly coincides with the composition range over which annealing at 850° C. and quenching produces homogeneous α (solid circles). Only between 18.5 and 20.0 at. % Cu supercooling retards the transformation $\delta_{H/R}$→α, as we have observed by DTA analysis carried out at a cooling rate of 5 K/min.

Figure 14B:
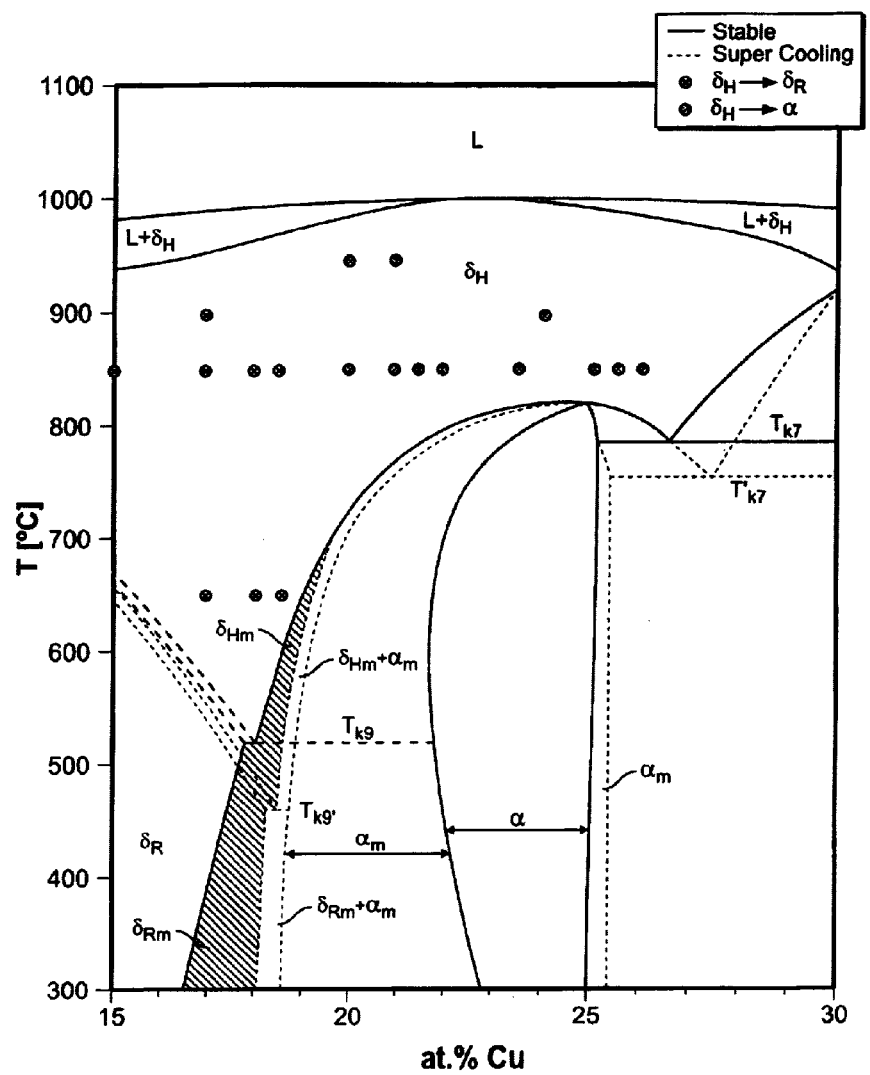

The phase diagram in FIG. 14b actually constitutes a "realization diagram"—the phase diagram drawn in dotted lines refers to the particular heat treatment and quenching procedure described above. For comparison, solid lines indicate the equilibrium phase diagram. The dotted lines commence in the maximum of the α phase field and extend over the entire section of the phase diagram shown in this figure. Above 24.8 at. % Cu, supercooling shifts the borderlines of the phase fields towards higher Cu contents; the critical tie line $T_{k7}$ moves to a lower temperature, ($T_{k7}'$), and the eutectoid point follows a line that extrapolates the lower boundary of the $\delta_H$ phase field on the right of the a maximum. Between 18.0 and 19.0 at. % Cu the critical tie line $T_{k9}$ shifts to a lower temperature ($T_{k9}'$). Comparison between the dotted and the solid lines in FIG. 14b indicates that supercooling can reduce the width of the two-phase field $\delta_R$+α to 0.6 at. % (field $\delta_{Rm}$+α$_m$; according to the convention introduced in section 5.1, non-equilibrium phases are denoted by the subscript "m"). The field $\delta_R$+α becomes narrower because supercooling extends the regions of both, homogeneous α and homogeneous δ at 300° C. (fields $\delta_{Rm}$ and m in FIG. 14b).

Most important for applications, our experiments have shown that rapid cooling can substantially extend the composition range of homogeneous α (CuInSe$_2$)—at 300° C. one can obtain homogeneous a between 18.5 to 25.5 at. % Cu.

The results presented in FIG. 14b indicate that the width of the phase field $\delta_{H/R}$+α varies strongly with the thermal history. In the case of continuous cooling the cooling rate strongly influences the microstructure. This is the reason why we have applied the special step cooling procedure described in section 2 when aiming to obtain optimum equilibration in the $\delta_{H/R}$+α phase field.

5. Isothermal Section at 500° C.

As opposed to an ordinary isopleth of a ternary phas diagram, a quasibinary section requires that all critical tie lines and all tie lines of binary phase equilibria lie in the plane of the section. In order to check whether the In$_2$Se$_3$—Cu$_2$Se section fulfills this criterion, we have worked out part of the isothermal section of the Cu—In—Se phase diagram at 500° C. This part allows us to view the tie lines of three-phase equilibria in the vicinity of the In$_2$Se$_3$—Cu$_2$Se section, too, and to examine whether these tie lines become parallel to the plane of the In$_2$Se$_3$—Cu$_2$Se section as they approach it. Moreover, the isothermal section at 500° C. is of major technical importance because Cu—In—Se thin films for photovoltaic applications are often fabricated at or near this very temperature. Finally, the phase diagrams of the In$_2$Se$_3$—Cu$_2$Se section given in the literature naturally do not fully describe the extension of the α phase (CuInSe$_2$), neither in the plane of the In$_2$Se$_3$—Cu$_2$Se section, nor in the ternary phase diagram. The latter can be assessed from a variety of isothermal sections at different temperatures.

Figure 16A:
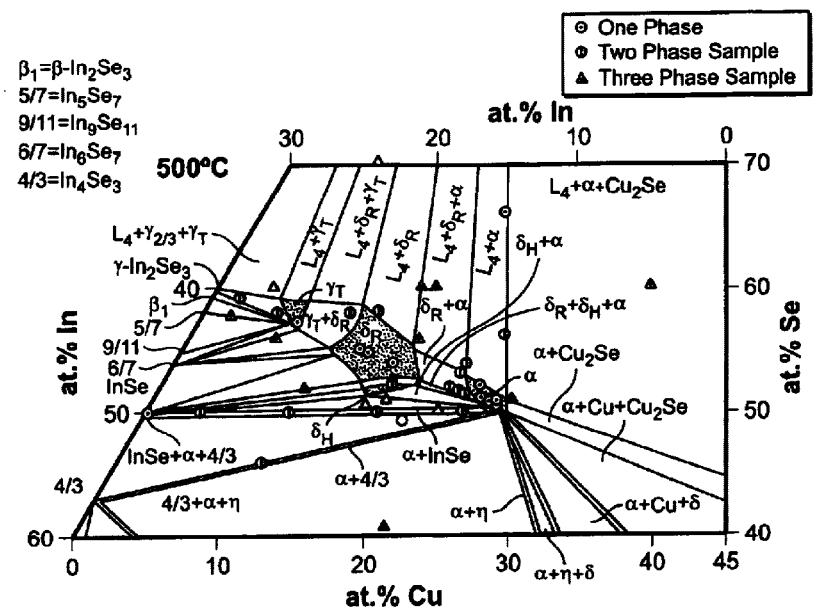
Figure 16B:
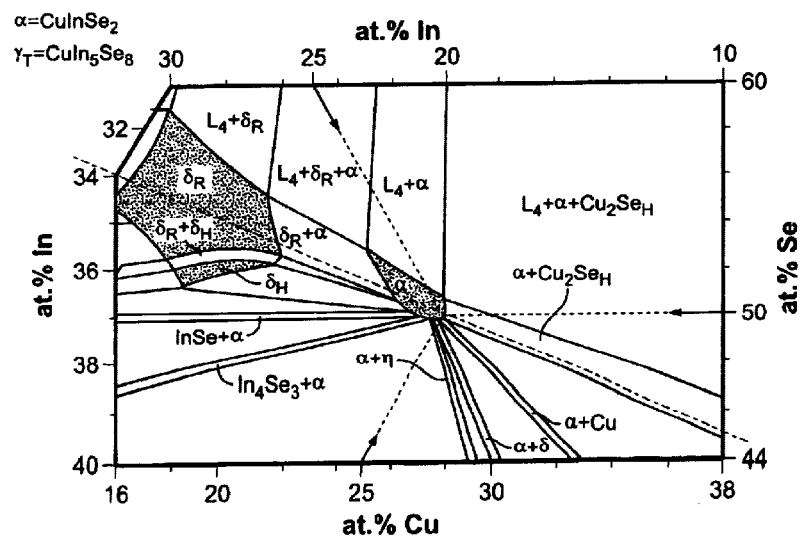

FIGS. 16a and b show parts of the isothermal section at 500° C. This drawing correctly includes the phase equilibria that we have determined by re-investigation of the In—Se component system. Shaded areas indicate single-phase regions. FIG. 16b, an enlarged section of FIG. 16a, shows the position of the isopleth In$_2$Se$_3$—Cu$_2$Se as a dotted line. The intersection of the dotted lines marks the stoichiometric composition of the α phase (CuInSe$_2$). According to FIG. 16b, the α phase borders to nine two-phase fields and nine three-phase equilibria? On the Se-rich side of the In$_2$Se$_3$—Cu$_2$Se section α exhibits a somewhat larger composition range than on the Cu-rich side. The symbol L$_4$ in FIG. 16a indicates a Se-rich liquid phase.

The high-temperature phase $\delta_H$, which cannot be stabilized to room temperature by water quenching when in the In$_2$Se$_3$—Cu$_2$Se section but on the In-rich side of the isothermal section. At 500° C. this phase has a small region of existence, labeled by $\delta_H$ in FIG. 16. Our experimental observations agree well with the data according to which $\delta_H$ has the sphalerite structure and can be stabilized to room temperature along the tie line CuInSe$_2$—In$_{42.0}$Se$_{58.0}$, with Cu concentrations between 11.0 and 15.5 at. %.

The high-temperature modification $\delta_H$ as well as the low-temperature modification $\delta_R$ each establish a two-phase equilibrium with α. The enlargement in FIG. 16b indicates that a narrow tree-phase space $\delta_H+\delta_R+\alpha$ separates the two-phase regions $\delta_R+\alpha$ and $\delta_H+\alpha$. Furthermore, the $\alpha$ phase establishes two-phase and three-phase equilibria with InSe and $In_4Se_3$. The three-phase equilibria $In_4Se_3+\alpha+\eta$, $\alpha+\eta+\delta$, and $\alpha+Cu+\delta$ are discussed in part II of this work. The binary indium selenides InSe, $In_4Se_3$, $In_6Se_7$, $In_9Se_{11}$, and $In_5Se_7$ do not provide substantial solubility for Cu.

Extrapolating the tie lines of the three-phase equilibria that bound to the $In_2Se_3$—$Cu_2Se$ isopleth towards the plane of the section we find the tie lines aligned with the plane of the section. This confirms that the $In_2Se_3$—$Cu_2Se$ section constitutes a quasibinary section.

6. Microstructures at 500° C.

The micrographs in FIGS. 17, 18, 19, and 20 demonstrate a few of the phase equilibria of the isothermal section at 500° C. that we have discussed in the previous section. In particular, these micrographs show two-phase and three-phase equilibria that involve the $\alpha$ phase.

Figure 17:
Figure 18:
Figure 19:

FIG. 17 exhibits the microstructure of $Cu_{11.0}In_{44.0}Se_{46.0}$, which consists of $In_4Se_3$ and $\alpha$ (dark). FIG. 18, in contrast, shows a three-phase equilibrium. This microstructure belongs to $Cu_{16}In_{33}Se_{51}$ annealed at 500° C. and comprises InSe (bright), $\delta_H$ (gray), and $\alpha$ (dark). FIG. 19, finally, depicts the microstructure of $Cu_{18.0}In_{30.0}Se_{52.0}$, which consists of a two-phase equilibrium between $\delta_H$ (gray) and $\alpha$ (dark).

Figure 20:
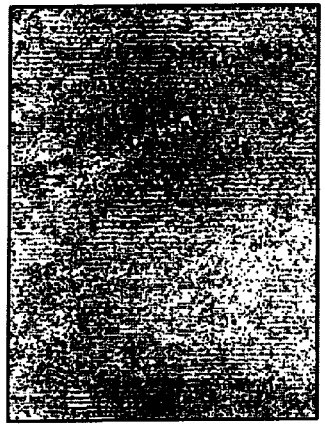

Alloys near the composition of $CuInSe_2$ often exhibit small precipitates of InSe owing to the loss of Se during processing. In the SEM backscattering image these precipitates appear as bright round particles embedded within the $\alpha$ matrix (dark). FIG. 20 presents an example of such a microstructure. The alloy had a nominal composition of $Cu_{24.4}In_{25.2}Se_{50.4}$ and was cooled down from 500° C. in two isothermal annealing steps, 100 h at 300° C. and 13 d at 180° C. The microstructure that appears in FIG. 20 confirms that at low temperatures surface that represents the precipitation of InSe from $\alpha$ closely approaches the ideal composition of $\alpha$, $CuInSe_2$.

7. Conclusion

Basic research on the phase equilibria of Cu—In—Se alloys constitutes an important pre-requisite for efficient technical applications of Cu—In—Se alloys. Both, controlled preparation and systematic optimization of Cu—In—Se alloys require a thorough knowledge of the entire Cu—In—Se phase diagram, including the liquidus surface, and a deeper understanding of potential non-equilibrium states. Applying DTA, XRD, LM, SEM, and TEM to more than 70 different alloys we have obtained consistent data on the $In_2Se_3$—$Cu_2Se$ section of the Cu—In—Se ternary phase diagram. The data we have obtained from our study, and particularly the isothermal section at 500° C. strongly support the hypothesis that the $In_2Se_3$—$Cu_2Se$ section indeed constitutes a quasibinary section.

Furthermore, we conclude from our experiments that non-equilibrium states may play an important role in the processing of Cu—In—Se alloys. This is particularly true for equilibria involving the $\alpha$ phase ($CuInSe_2$). In thermodynamic equilibrium, the existence range of the $\alpha$ phase is very narrow at room temperature (about 1 at. %), but in non-equilibrium states it can reach as much as 7 at. %. This result may have important impact on the fabrication of thin film photovoltaic devices exploiting the properties of $CuInSe_2$.

Part II

1. General

This Part deals with subsystem In—$In_2Se_3$—$Cu_2Se$—Cu. The alloys of this subsystem were fabricated by encapsulating the ingot in quartz tubes and fusing it in a high-frequency furnace, as detailed in Part I. To determine the liquidus isotherms as well as the temperatures of the four-phase reactions and the critical tie lines, we employed differential thermal analysis (DTA) after encapsulating the specimens in silicatubes with particularly thin walls. In order to analyze the microstructure of the alloys we have employed x-ray diffraction (XRD), light-optical microscopy (LM), scanning electron microscopy (SEM), and transmission electron microscopy (TEM). Along with SEM and TEM we used x-ray energy-dispersive spectroscopy (XEDS) for elemental analysis. For further details of experimental procedures it is referred to Part I.

From the results we have obtained this Part presents the liquidus, five isopleths, the corresponding Scheil reaction scheme, and an isothermal section of the entire subsystem II (In—$In_2Se_3$—$Cu_2Se$—Cu) at 500° C. The phase equilibria of a ternary system depend on the phase equilibria of the binary component systems. Before we deal with the ternary subsystem II, therefore, we summarize the most recent data on Cu—In, Cu—Se, and In—Se.

2. Binary Component Systems

2.1 Cu—In

Figure 21:
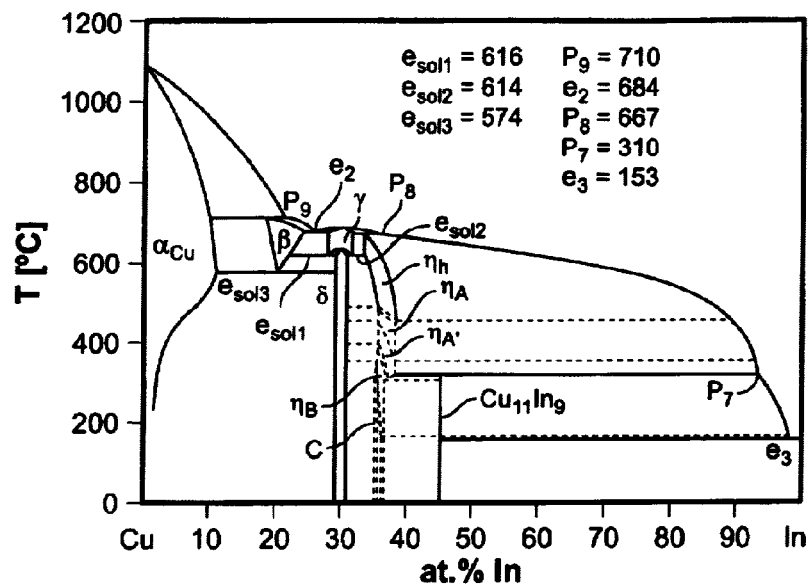

FIG. 21 presents the phase diagram of Cu—In. The symbols p and e represent peritectic and eutectic reactions, respectively. $\beta$ ($Cu_4In$) and $\gamma$ ($Cu_9In$) constitute high-temperature phases, which decompose by eutectoid reactions at $e_{sol3}$ and $e_{sol1}$, respectively. Jain, Ellner and Schubert (Z. Metallk. 63 (1972), 456–461) have subdivided the phase $\eta$ near the composition $Cu_{64.0}In_{36.0}$ into five different modifications: A, A', B, C, and $\eta_h$. Following this nomenclature we have denoted the respective phases in FIG. 2 as $\eta_A$, $\eta_{A'}$, $\eta_B$, and $\eta_h$. The high-temperature phases $\beta$, $\gamma$, and $\eta_h$ can only be stabilized to room temperature by extremely rapid cooling (splat cooling, for example).

2.2 Cu—Se

Figure 22:
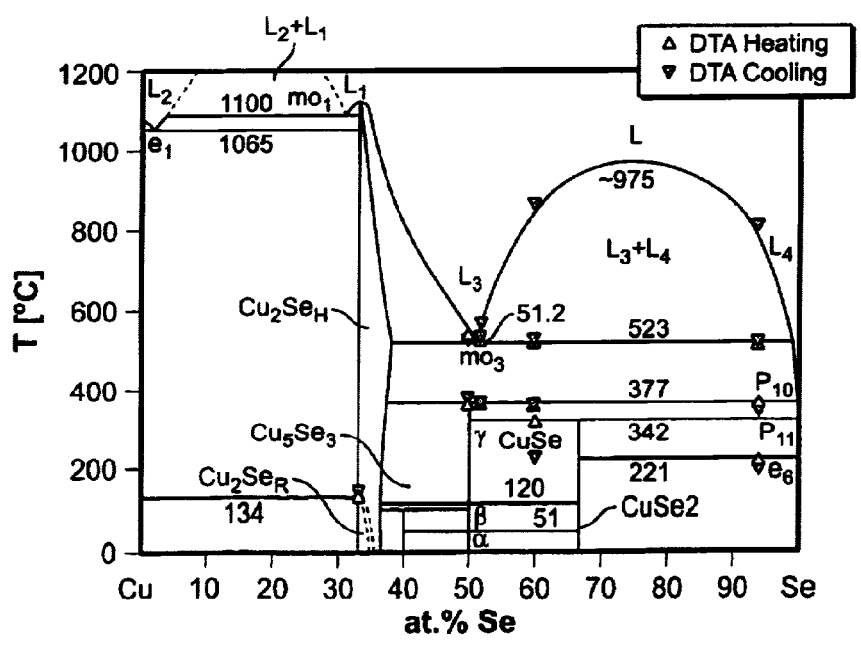

In some regions we have corrected the phase diagram of Cu—Se published in the handbook on binary phase equilibria by Charkrabarti and Laughlin ("Binary Alloy Phase Diagrams, in: T. B. Massalski et al. (eds.) Binary Alloy Phase Diagrams, ASM International, Materials Park (1990), 1475–1476). FIG. 22 presents the corrected version. By applying DTA to four different alloys with Se fractions between 50 and 95 at. % we have re-determined the miscibility gap $L_3+L_4$, the monotectic point at $mo_3$ (51.2 at. % Se), and the temperatures of the peritectica at $p_{10}$ (377° C.) and $p_{11}$ (342° C.). The transformation from the high-temperature phase $Cu_2Se_H$ to the room temperature modification $Cu_2Se_R$ was only observed at 134° C. and at the stoichiometric composition. The symbols $mo_1$ and $mo_3$ represent the monotectic reactions $L_1 \rightarrow Cu_2Se_H+L_2$ and $L_3 \rightarrow Cu_2Se_H+L_4$ at 1100° C. and 523° C., respectively.

2.3 In—Se

Figure 23:
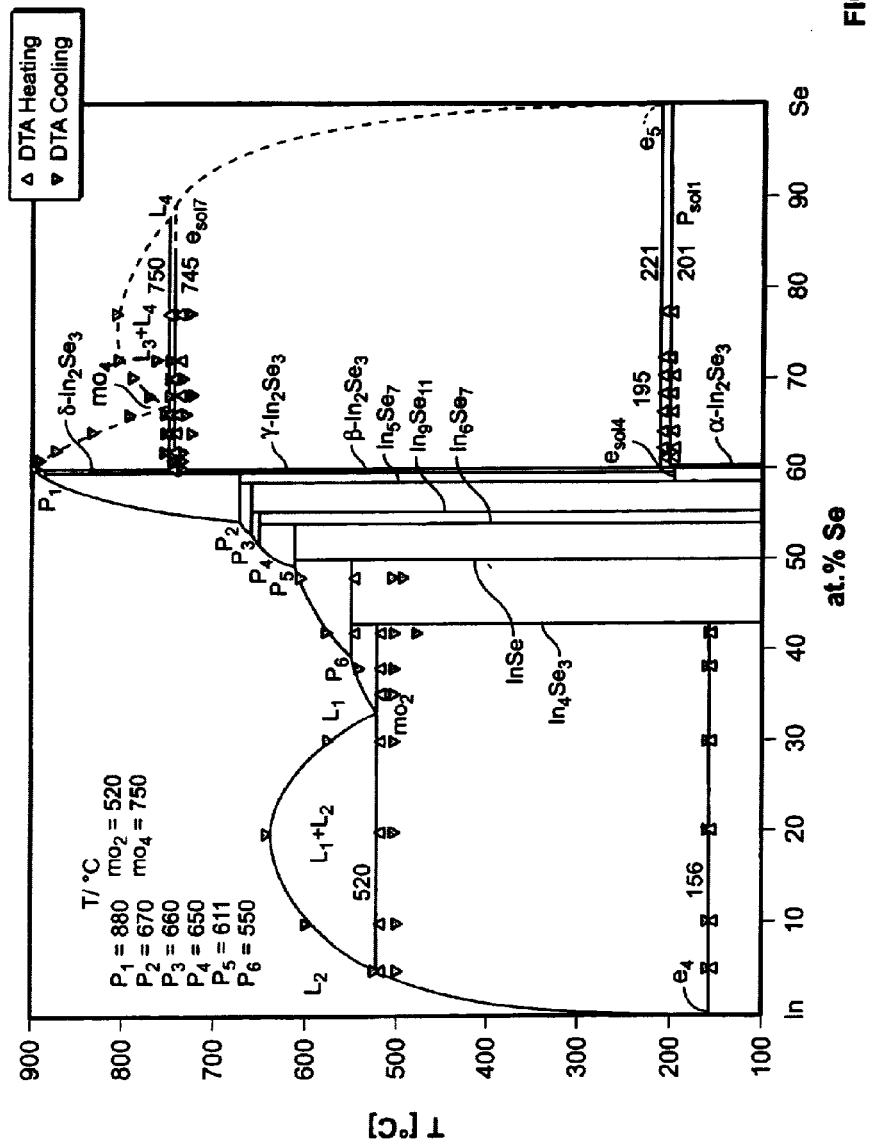

The component system In—Se has already been described in Example I. However, since this system is particularly important for the phase equilibria of Cu—In—Se we briefly repeat its most important properties here. FIG. 23 presents the new In—Se phase diagram In—Se published by Gödecke et al. (J. Phase Equ. 19 (1998), 572–576). The miscibility gaps $L_1+L_2$ and $L_3+L_4$ have been re-determined, and so were the positions of the monotectic points at $mo_2$ (520° C.) and $mo_4$ (750° C.). According to FIG. 23 there are seven different indium selenides that remain stable down to room temperature: $In_4Se_3$, $InSe$, $In_6Se_7$, $In_9Se_{11}$, $In_6Se_7$, $\gamma\text{-}In_2Se_3$, and $\alpha\text{-}In_2Se_3$. For $In_2Se_3$ four different modifications have been observed: $\delta$, $\beta$, $\gamma$, and $\alpha\text{-}In_2Se_3$. Peritectic transformations at $p_1$ through $p_5$ lead to the following phases: $\beta\text{-}In_2Se_3$ ($p_1$), $In_5Se_7$ ($p_2$), $In_9Se_{11}$ ($p_3$), $In_5Se_7$ ($p_4$), and $InSe$ ($p_5$). The melts of alloys between the peritectica $p_2$ and $p_5$ in FIG. 23 tend to be subject to supercooling, in which case crystallization leads to metastable rather than stable states. A diagram of metastable equilibria for cooling rates between 2 and 10 K/min has been published by Gödeke et al. (supra).

3. Types of Nonvariant Equilibria 3.1 Four-Phase Planes

In Example I we have already pointed out that the Cu—In—Se system features a variety of different four-phase reactions and critical tie lines. Most important for the phase equilibria of the subsystems are the ten critical tie lines that lie in the plane of the $In_2Se_3$—$Cu_2Se$ section and extend towards the Se-rich and Cu-rich region. Before discussing the four-phase planes and the critical tie lines of the In—$In_2Se_3$—$Cu_2Se$—Cu subsystem we introduce the different categories of these ternary non-variant equilibria by means of schematic drawings. In Example I we have described the constellations that lead to eutectic and peritectic critical tie lines. In this publication we introduce a ternary eutectic four-phase plane, a transition plane, a metatectic critical tie line, and a monotectic critical tie line.

Figure 24:
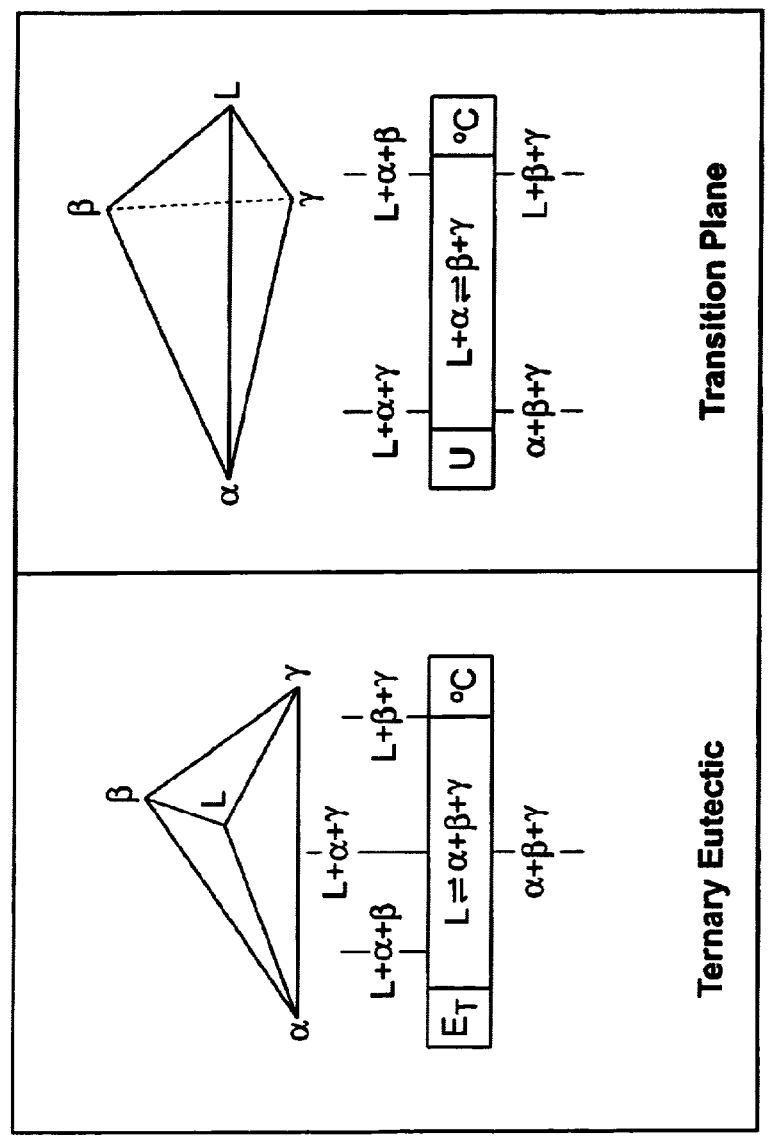

Ternary systems may exhibit three different types of non-variant equilibria: (i) four-phase equilibria, (ii) non-variant three-phase equilibria, which are denoted as critical tie lines, and (iii) non-variant two-phase equilibria, which correspond, for example, to melting point maxima or melting point minima. Four-phase equilibria are further subdivided into ternary eutectica, ternary peritectica, and transition equilibria. The left hand side of FIG. 24 shows the example of a ternary eutectic four-phase plane, which corresponds to the reaction $L \leftrightarrows \alpha+\beta+\gamma$. Below the four-phase plane we have indicated the corresponding Scheil reaction scheme. Such a reaction scheme indicates the three-phase equilibria that merge into the four-phase plane from higher temperatures and the three-phase equilibria that emerge from this plane towards lower temperatures. Moreover, the reaction scheme states the reaction equation and the temperature of the respective four-phase plane. At temperatures above the four-phase plane, for example, FIG. 24 depicts three three-phase equilibria: $L+\alpha+\beta$, $L+\alpha+\gamma$, and $L+\beta+\gamma$. According to the reaction equation, $L \leftrightarrows \alpha+\beta+\gamma$, the melt L decomposes into three solid phases, $\alpha+\beta+\gamma$. The reaction product, $\alpha+\beta+\gamma$, is indicated once again below the reaction equation.

In the liquidus projection of FIG. 26 and in the reaction scheme of Table 1 we have designated ternary eutectica by symbols like $E_{T1}$. Binary eutectica and peritectica are denoted by symbols like $e_1$ and $p_1$, respectively. The right hand side of FIG. 24 depicts a transition plane U. The three-phase equilibria above and below the four-phase plane are indicated in the reaction scheme, together with the corresponding reaction equation: $L+\alpha \leftrightarrows \beta+\gamma$. In this example, two three-phase equilibria exist at temperatures above the four-phase plane: $L+\alpha+\gamma$ and $L+\alpha+\beta$. At temperatures below the four-phase plane the system establishes two new three-phase equilibria: $\alpha+\beta+\gamma$ and $L+\beta+\gamma$, which can take part in further reactions that occurring at lower temperatures.

Transition planes carry symbols like $U_1$ in our diagrams. Four-phase planes that do not involve a liquid phase are denoted by symbols like $e_{Tsol1}$ or $u_{sol1}$, respectively. The former represent ternary eutectica, while the latter stand for transition planes. Eutectic four-phase reactions that involve two liquid phases ($L_1 \leftrightarrows L_2+\alpha+\beta$) are commonly known as ternary monotectica. In our nomenclature we have assigned symbols like $mo_{T1}$ to the temperatures at which reactions of this type occur. In the case of four-phase reactions that involve one or two liquid phases one can identify the type of the reaction by microcharacterization of casts or by microcharacterization of specimens that have been cooled down from the melt under the cooling conditions of DTA.

3.2 Metatectic and Monotectic Critical Tie Lines

In Part I we have introduced eutectic and peritectic critical tie lines and showed that they imply the existence of two monovariant three-phase equilibria either below the temperature of the respective critical tie line, or above, or below and above (compare $T_{k9}$).

In this section we describe two further types of critical tie lines: metatectic and monotectic critical tie lines. FIG. 25 presents schematic drawings of metatectic critical tie lines. These critical tie lines as well as the phases $L_1$, $L_2$, $\delta_H$ ($CuIn_3Se_5$), $\alpha$ ($CuInSe_2$), and $\gamma$ (the $\gamma$ phase of the Cu—In binary system) actually occur in the In—$In_2Se_3$—$Cu_2Se$—Cu subsystem. As shown in FIG. 25a, there is a critical temperature $T_{c11}$ at which the isotherms of the $\delta_H$ phase, which participates in the equilibria $\alpha+\delta_H$ and $L_1+\delta_H$, touch with each other. This leads to a common ("critical") tie line $T_{k11}$ representing the equilibrium $\delta_H \leftrightarrows L_1+\alpha$. Thus, the critical temperature $T_{c11}$ represents the temperature at which $\delta_H$ decomposes into $\alpha+L_1$. Generally, one d notes such a decomposition of a solid phase ($\delta_H$) into another solid phase ($\alpha$) and a liquid phase ($L_1$) as "metatectic". Similar to eutectic and peritectic critical tie lines, three-phase spaces $L_1+\delta_H+\alpha$ (black in FIG. 25b) exist below the critical temperature $T_{c11}$ of the critical tie line $T_{k11}$. These three-phase spaces are monovariant, and between them the liquid phase $L_1$ develops into a primary crystallization surface of $\alpha$.

At $T=T_{c12}$ the liquidus lines of the two-phase surfaces $L_1+L_2$ and $L_1+\alpha$ touch with each other. This leads to a common ("critical") tie line $T_{k12}$, representing the equilibrium $L_1 \leftrightarrows L_2+\alpha$ (FIG. 25c)—at the intersection point of the liquidus lines the liquid phase $L_1$ decomposes into $L_2+\alpha$. This example, where a liquid phase ($L_1$) decomposes into a solid phase ($\alpha$) and another liquid phase ($L_2$), constitutes a case of "monotectic" decomposition. According to FIG. 25d two monotectic three-phase spaces ($L_1+L_2+\alpha$, shown in black) exist below the critical tie line. This time the liquid phase $L_2$ develops into a primary crystallization surface of $\alpha$.

At $T=T_{c13}$ the liquidus isotherm of $L_2+\alpha$ touches the liquidus isotherm of $L_2+\gamma$. According to FIG. 25e this leads to a eutectic critical tie line $T_{k13}$, which represents the equilibrium $L_2 \leftrightarrows \alpha+\gamma$: where the liquidus lines touch each other, the liquid phase $L_2$ decomposes into $\alpha+\gamma$ in a eutectic reaction. The two-phase space $L_2+\gamma$ originates from the Cu—In boundary system (FIG. 21). FIG. 25f depicts the phase equilibria $L_2 \leftrightarrows \alpha+\gamma$ that exist below the critical tie line $T_{k13}$.

In the following we show, by means of several isopleths (FIGS. 28, 29, 30, 31, 32) and the liquidus projection in FIGS. 26 and 27, that the three-phase spaces resulting from the critical tie lines $T_{k1}$ through $T_{k13}$ govern to a large extent the phase equilibria of the entire In—$In_2Se_3$—$Cu_2Se$—Cu subsystem.

4. Projection of the Liquidus and the Four-Phase Planes

4.1 Liquidus Projection

FIG. 26 presents the liquidus of the In—$In_2Se_3$—$Cu_2Se$—Cu subsystem that we have obtained by DTA and metallography on cast alloys as well as alloys cooled under the conditions of DTA. In FIG. 26b the quasibinary section $In_2Se_3$—$Cu_2Se$ is shown only between 850 to 1050° C., the relevant temperature interval for the liquidus projection. This temperature interval includes critical tie lines, denoted as $T_{k1}$ through $T_{k6}$. The high-temperature phase $H_T$ ($Cu_{13}In_3Se_{11}$) forms at 947° C. At 923° C., $H_T$ and decomposes into (Cu, In)$_2Se_H$ and $\delta_H$, the high-temperature modification of $CuIn_3Se_5$. $\delta_H$ crystallizes at 1002° C. with a Cu concentration of 23.5 at. %. The In-rich side of the section features the formation of the corresponding low-temperature phase, $\delta_R$, by a peritectic reaction at $T_{k4}$, and the formation of the phase $\gamma_T$ at $T_{k5}$.

Figure 26A:
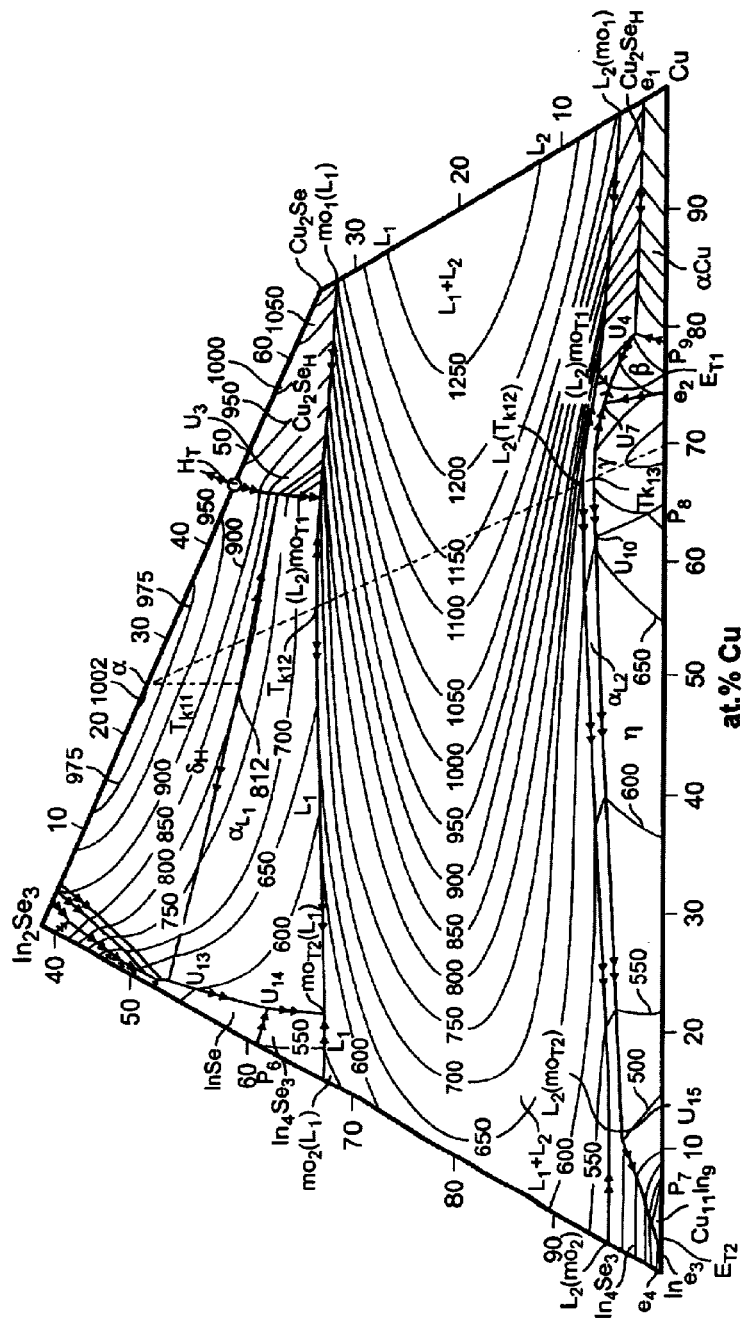

In FIG. 26a, fine lines indicate liquidus isotherms, while bold lines represent monovariant eutectic and peritectic equilibria, respectively; the arrow heads at these lines indicate the direction of decreasing temperature. The symbols U, $E_T$, and $mo_T$ designate transition planes, ternary eutectica, and ternary monotectica—as introduced in section 3.1.

In total, the In—$In_2Se_3$—$Cu_2Se$—Cu subsystem includes twenty-eight four-phase equilibria. Twenty of these involve a liquid phase (sixteen transition planes, two ternary eutectica, two ternary monotectica). Moreover, we have determined thirteen critical tie lines and twenty-one different surfaces of primary crystallization. FIG. 26a reveals that the crystallization surfaces of $\delta_H$, $\alpha_1$, (Cu, In)$_2Se_H$, $\eta$, and $\gamma$ dominate the region of the miscibility gap $L_1+L_2$.

Figure 30:
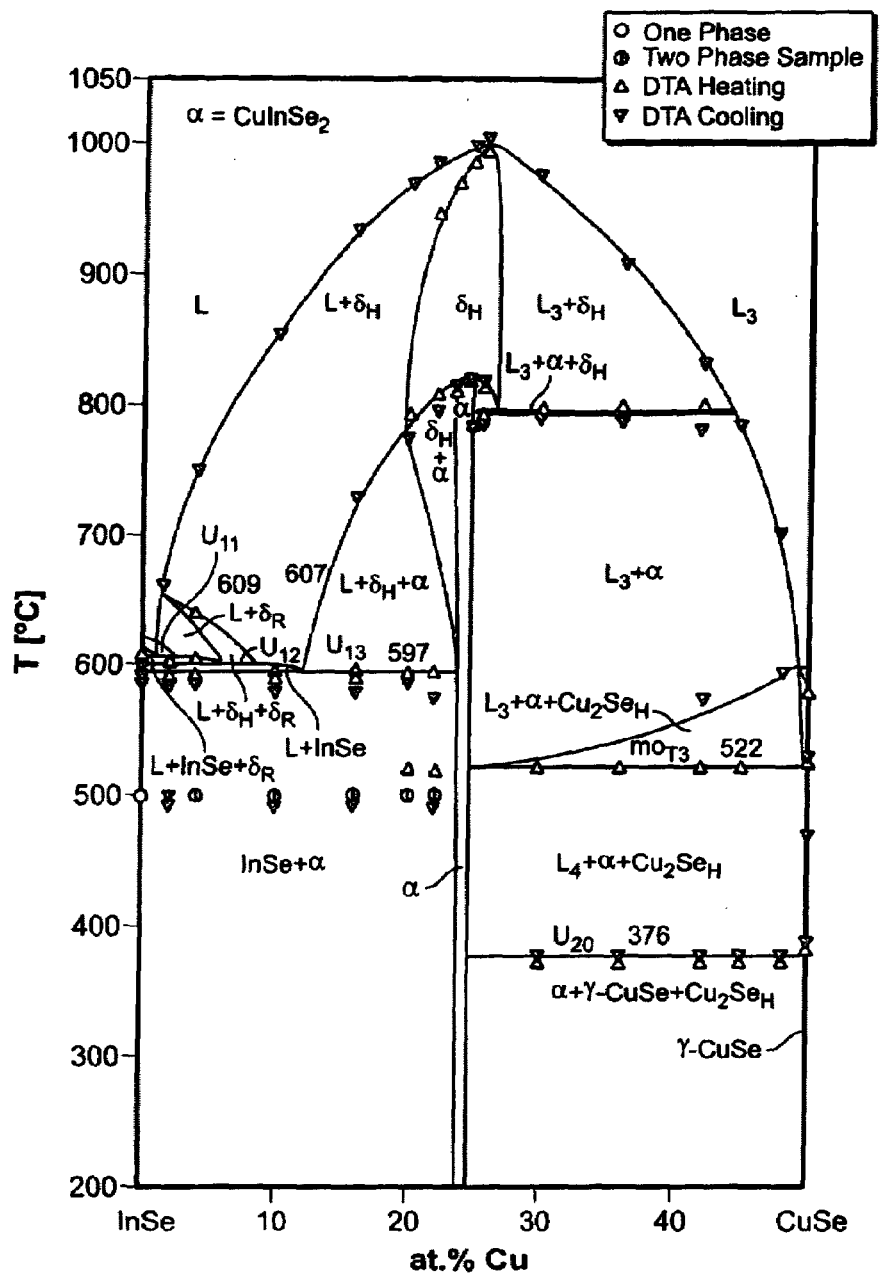

FIG. 27d shows the corresponding faces of these four-phase planes—except for the face of the transition plane at $U_2$. In the ternary system, the liquidus faces of InSe, $In_6Se_7$, $In_9Se_{11}$, $In_5Se_7$, $\beta$-$In_2Se_3$, and $\delta$-$In_2Se_3$ do not possess a large extension. At this point we need to stress that the temperatures of the four-phase planes involving indium selenides can only be determined during heating; on cooling of In—Se melts with In concentrations between 48 and 54 at. % Se, supercooling introduces metastable equilibria, which extend into the ternary system (FIG. 30).

Figure 26B:
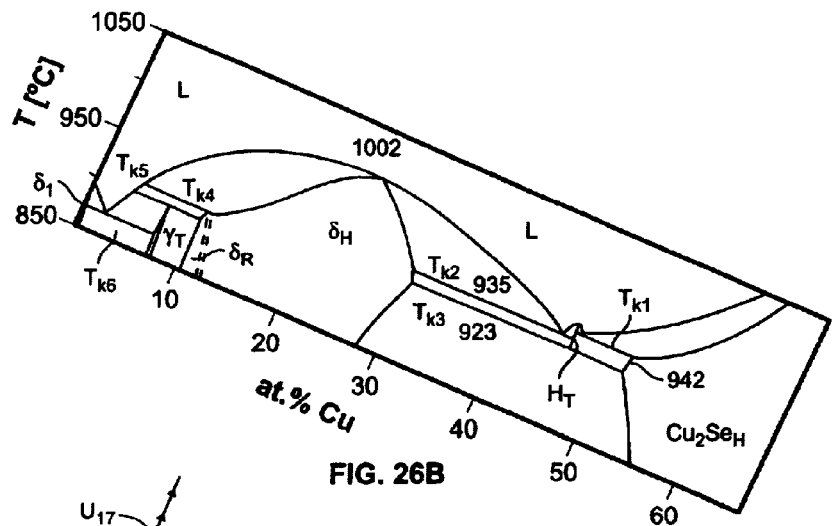
Figure 27A:
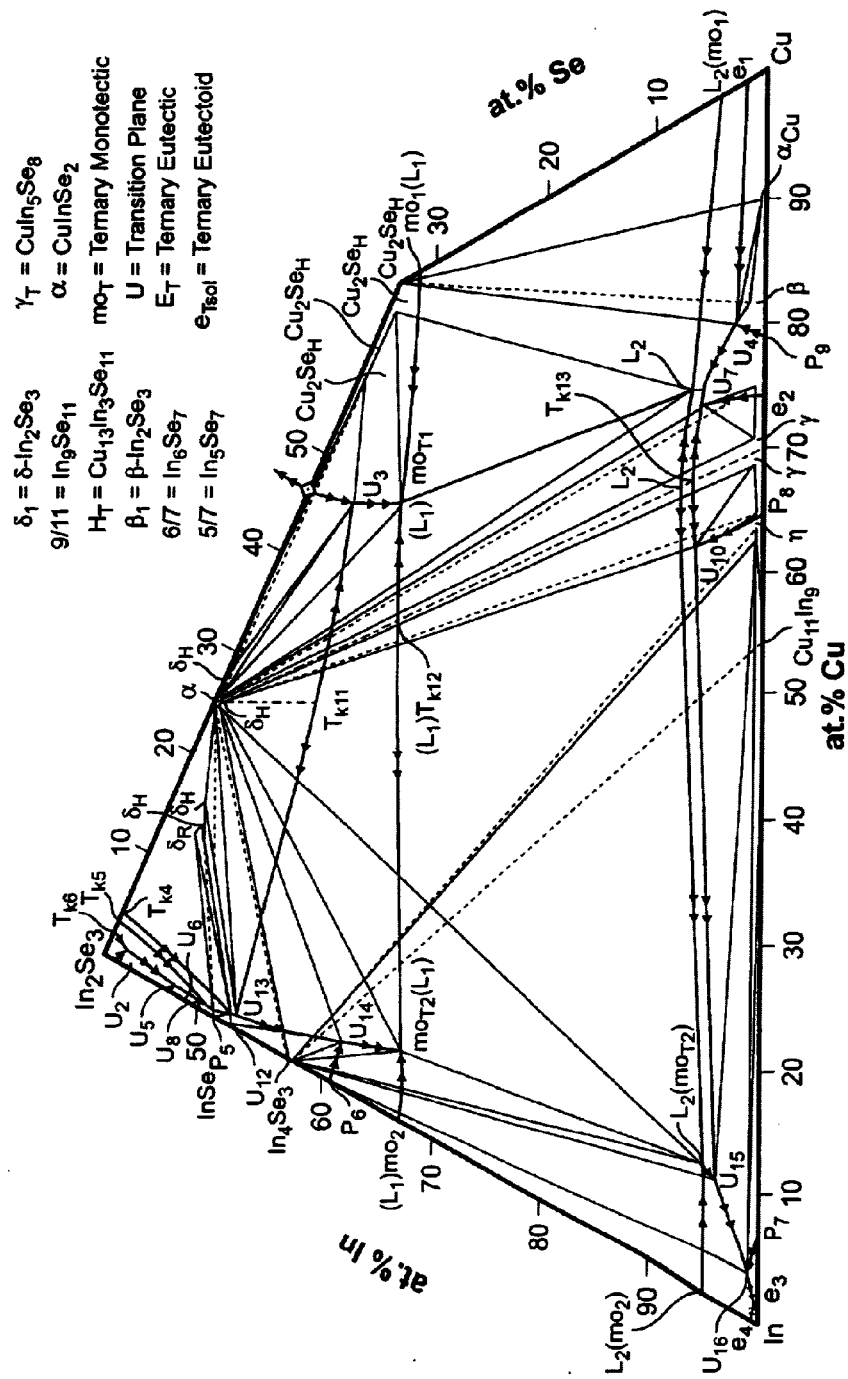
Figure 27B:
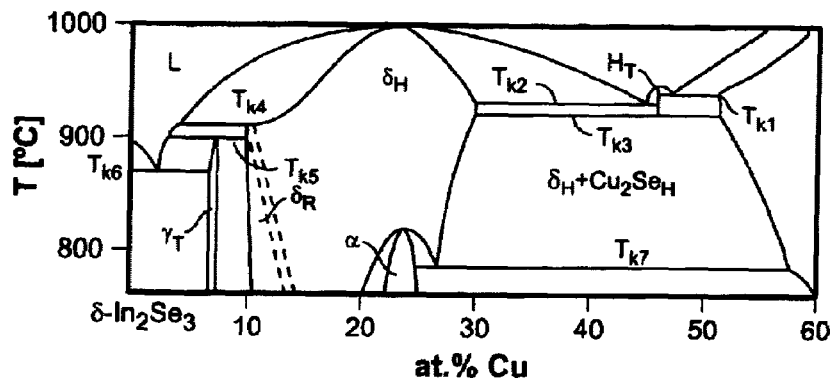

The symbols $\alpha_{L1}$ and $\alpha_{L2}$ in FIG. 26b serve to distinguish between two different primary crystallization surfaces of the $\alpha$ phase; these surfaces emerge from the critical tie lines $T_{k11}$ and $T_{k12}$, respectively. In FIG. 26a, the crystallization surface of $\alpha_{L1}$ is bounded by the nonvariant equilibria $mo_{T2}$, $U_{14}$, $U_{13}$, $T_{k11}$, $U_3$, $mo_{T1}$, and $T_{k12}$, respectively. The crystallization surface $\alpha_{L2}$ is rather narrow. It extends parallel to the Cu—In boundary system, from the point labeled $L_2$ on the In-rich side to the point labeled $L_2$ on the Cu-rich side. Both these points belong to the liquid phase $L_2$ involved in the two ternary monotectica at $mo_{T1}$ and $mo_{T2}$, respectively. The position of the two monotectic four-phase planes and the liquid phases $L_2$ is shown in FIG. 27a. FIGS. 26a and 27a further reveal the existence of primary crystallization surfaces of $In_4Se_3$ and (Cu, In)$_2$Se:In the In-rich corner of the liquidus projection, below the monotectic four-phase plane at $mo_{T2}$, the liquid phase $L_2$ precipitates $In_4Se_3$, and on the Cu-rich side, below the monotectic four-phase plane at $mo_{T1}$, $L_2$ precipitates (Cu, In)$_2Se_H$. Owing to the binary and the ternary monotectica, the liquid phase $L_1$ precipitates $In_4Se_3$ and (Cu, In)$_2Se_H$, too: $In_4Se_3$ in the field defined by $mo_2$, $p_6$, $U_{14}$, and $mo_{T2}$, and (Cu, In)$_2Se_H$ in the field defined by $mo_1$, $mo_{T1}$, and $U_3$.

Figure 26C:
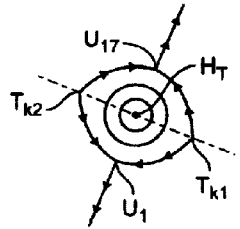
Figure 26E:
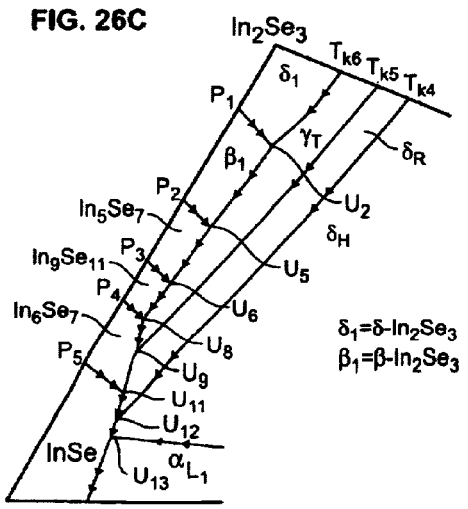
Figure 26D:
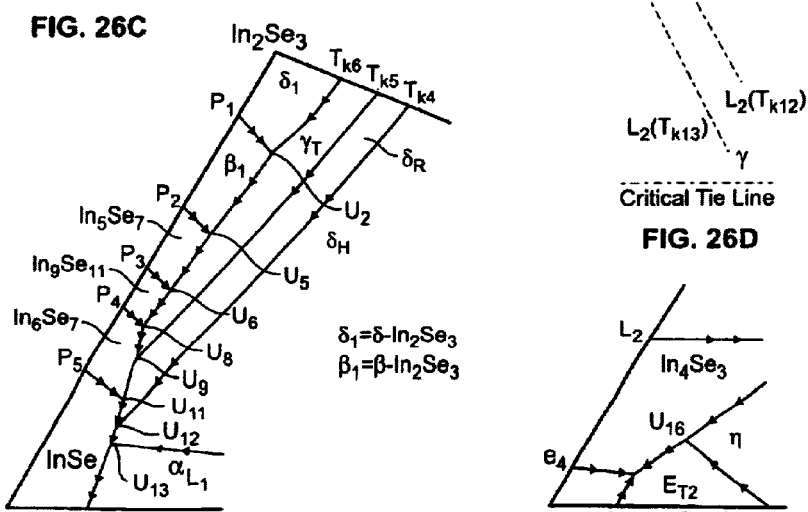
Figure 26F:
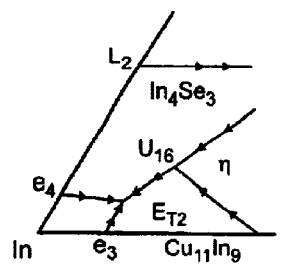

According to FIGS. 26c and 27c, the monovariant three-phase equilibria $L+\delta_H+H_T$ and $L+H_T+$(Cu, In)$_2Se_H$, which exist below the eutectic critical tie lines $T_{k1}$ and $T_{k2}$, terminate on the transition planes at $U_1$ and $U_{17}$, respectively. The four-phase plane at $U_{17}$ will be further discussed in Part III. As mentioned already in Part I, quenching in water does not stabilize the high-temperature phase $H_T$ down to room temperature.

4.2 Projection of the Four-Phase Planes

Figure 27E:
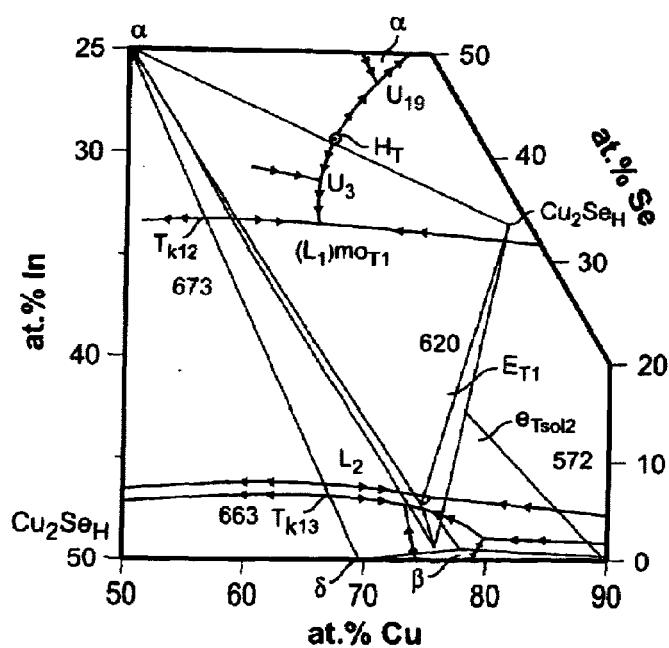

FIGS. 27a and e depict the position of the four-phase planes at $U_3$, $U_4$, $U_7$, $U_{10}$, $U_{15}$, $U_{16}$, $U_{14}$, $U_{13}$, $mo_{T1}$, and $mo_{T2}$, and FIG. 27e shows the four-phase planes at $E_{T1}$ and part of the ternary eutectic four-phase plane $e_{Tsol2}$.

Figure 29A:
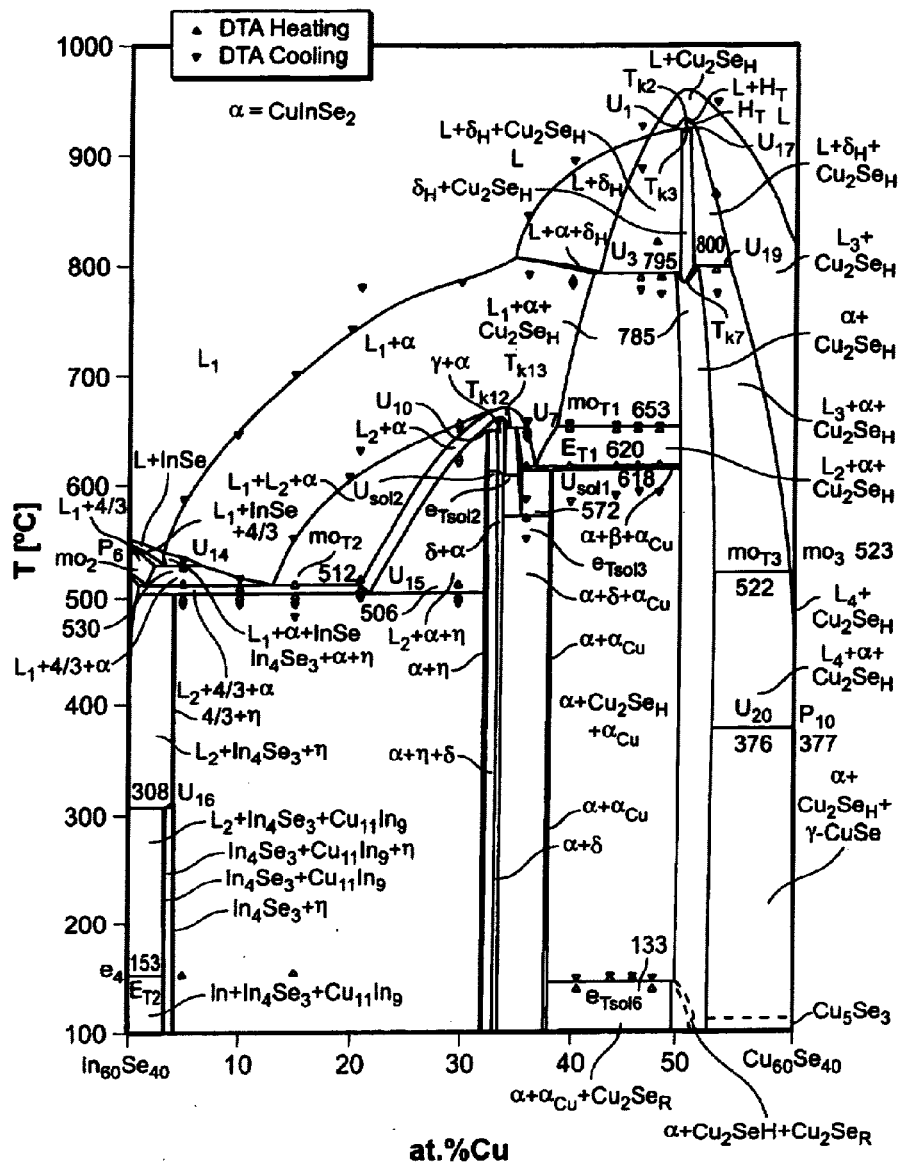

The reaction scheme in Table 1 summarizes the twenty binary and the twenty-eight ternary non-variant equilibria, including the critical tie lines $T_{k1}$ through $T_{k13}$. The critical tie lines $T_{k1}$ through $T_{k8}$ are listed in the column of $In_2Se_3$—$Cu_2Se$, and the critical tie lines $T_{k9}$ and $T_{k10}$ in the bottom part of the column In—$In_2Se_3$—$Cu_2Se$—Cu. The reactions marked by arrows involve other subsystems of Cu—In—Se; these subsystems will be subject of Example III. On compiling the reaction scheme we tried to order the nonvariant equilibria according to their temperatures. The transition plane with the highest temperature, $U_1$, occurs at 925° C. and involves the three-phase equilibria that emerge from the critical tie lines $T_{k1}$ (942° C.) and $T_{k2}$ (935° C.). Below the transition plane $U_1$ the reaction scheme features the three-phase equilibria $L+\delta_H+Cu_2Se_H$ and $H_T+\delta_H+$(Cu, In)$_2Se_H$. The three-phase space $H_T+\delta_H+$(Cu, In)$_2Se_H$ terminates at the critical tie line $T_{k3}$ (923° C.) in the $In_2Se_3$—$Cu_2Se$ quasibinary section. A corresponding three-phase space emerges from the transition plane at $U_{17}$ in the $Cu_2$—$In_2Se_3Se$ subsystem. This three-phase space also terminates at the critical tie line $T_{k3}$ (923° C.). The critical tie line $T_{k3}$ lies exactly in the plane of the $In_2Se_3$—$Cu_2Se$ section. The temperature of $T_{k3}$ constitutes a minimum with respect to the temperatures $U_1$=925° C. and $U_2$=925° C. of the corresponding four-phase planes next to the plane of the $In_2Se_3$—$Cu_2Se$ section. A similar constellation exists at the critical tie line $T_{k7}$ (785° C.), where the phase $\delta_H$ decomposes into $\alpha$ and (Cu, In)$_2Se_H$ in a eutectoid reaction; the temperature of that critical tie line also constitutes a local minimum with respect to the temperatures of the neighboring reactions (FIG. 29).

4.3 Ternary Monotectica

According to FIGS. 26 and 27, two ternary monotectica exist in the In—$In_2Se_3$—$Cu_2Se$—Cu subsystem. The four-phase plane at $mo_{T1}$=635° C. terminates the following three-phase spaces: $L_1+\alpha+$(Cu, In)$_2Se_H$, $L_1+L_2+\alpha$, and $L_1+L_2+Cu_2Se_H$. According to table 1, the three-phase space $L_1+L_2+Cu_2Se_H$ originates from the Cu—Se boundary system ($mo_1$), while the two other three-phase equilibria emerge at $U_3$ and $T_{k12}$, respectively. At $mo_{T1}$, the liquid phase $L_1$ decomposes according to $L_1 \rightarrow L_2+\alpha+$(Cu, In)$_2Se_H$.

The four-phase plane $mo_{T2}$ (512° C.) joins the following three-phase equilibria: $L_1+L_2+In_4Se_3$ (from $mo_2$), $L_1+In_4Se_3+\alpha$ (from $U_{14}$), and $L_1+L_2+\alpha$ (from $T_{k12}$). At $mo_{T2}$, the liquid phase $L_1$ decomposes according to $L_1 \rightarrow L_2+\alpha+In_4Se_3$. According to FIG. 27 the composition of the liquid phase $L_2$ lies on the In-rich side for the three-phase space $L_2+\alpha+In_4Se_3$ and on the Cu-rich side for the three-phase space $L_2+\alpha+$(Cu, In)$_2Se_H$. With decreasing temperature the Cu-rich liquid phase $L_2$ decomposes into $\alpha+\beta+$(Cu, In)$_2Se_H$ in a ternary eutectic reaction at $E_{T1}$=620° C. (Table 1 and FIG. 27e).

4.4 The Miscibility Gap $L_1+L_2$

According to FIG. 23 the In—Se boundary system possesses a miscibility gap between the liquid phases $L_1$ and $L_2$. At 520° C. $L_1$ decomposes into $L_2+In_4Se_3$. As apparent from the phase diagram of the In—Se boundary system in FIG.

23, primary crystallization of $In_4Se_3$ can occur from both, $L_1$ ($p_6$ to $mo_2$) and $L_2$ (520° C. to $e_4$). The miscibility gap $L_1+L_2$ closes at 20 at. % Se and 637° C. In order to investigate how the miscibility gap varies with the Cu concentration we have worked out an isopleth for a constant Se concentration of 20 at. % (FIG. 28).

Figure 28:
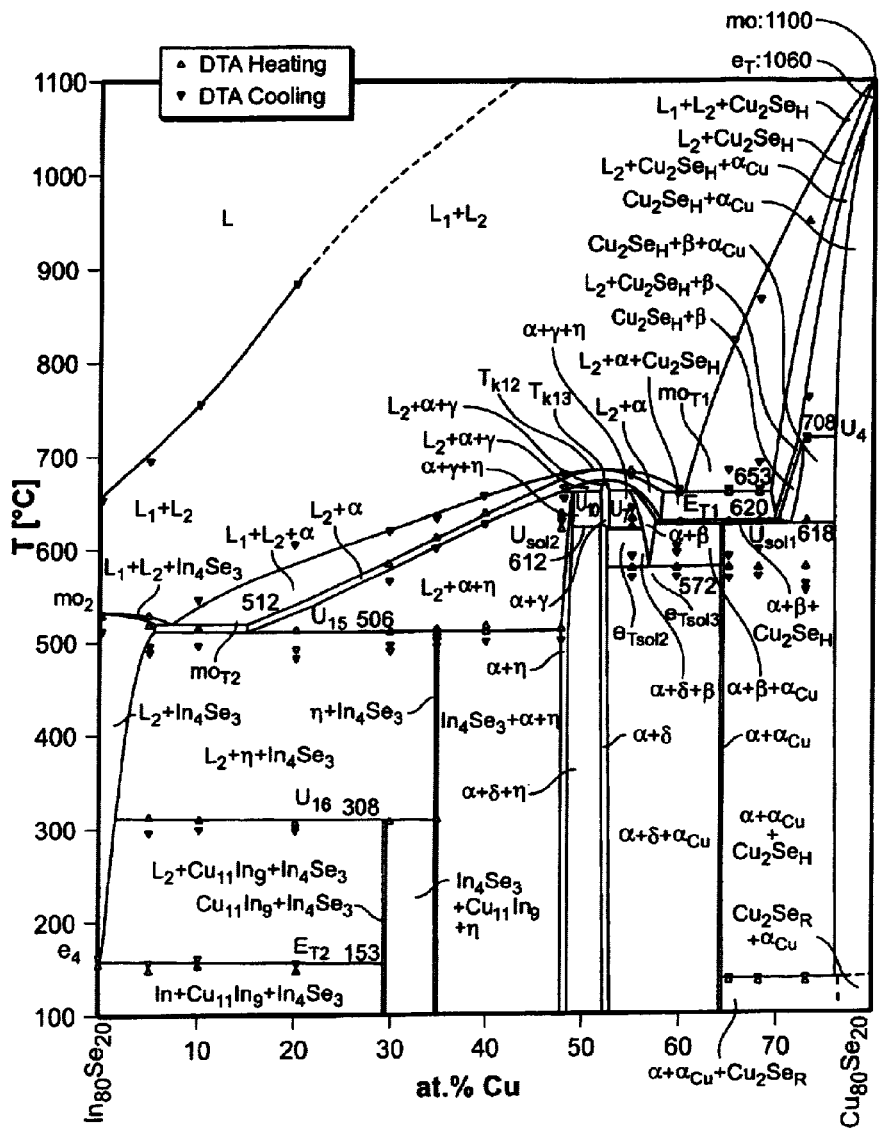

On the In-rich side of the isopleth of FIG. 28 one recognizes that increasing the Cu concentration shifts the maximum of the miscibility gap towards higher temperatures. Owing to the high vapor pressure of Se DTA analysis of the miscibility gap was not possible at temperatures above 950° C. In FIG. 28, therefore, the data above 950° C. were extrapolated from the low-temperature data. The extrapolated isotherms of the miscibility gap towards the Cu—Se boundary system are depicted in FIG. 26a.

5. Isopleths
  5.1 Phase-Equilibria with 20 at. % Se

The isopleth at 20 at. % Se in FIG. 28 reveals numerous intersections with four-phase planes and critical tie lines. Part of these have already been described when discussing Table 1 and FIGS. 25, 26, and 27. The monotectic and eutectic critical tie lines $T_{k12}$ and $T_{k13}$ and the ternary monotectica at $mo_{T1}$ and $mo_{T2}$. Here one can clearly recognize the three-phase spaces $L_1+L_2+\alpha$ and $L_2+\alpha+\gamma$, which form below the critical tie lines. According to FIG. 28, the critical tie lines $T_{k12}$ and $T_{k13}$ and the ternary monotectica at $mo_{T1}$ and $mo_{T2}$ substantially influence the phase equilibria of the In—$In_2Se_3$—$Cu_2Se$—Cu subsystem.

The isopleth at 20 at. % Se in FIG. 28 further shows that the $\alpha$ phase ($CuInSe_2$), the phase that is of particular importance for photovoltaic applications, establishes equilibria with the Cu—In phases $\eta$, $\delta$, and $\beta$, and even with the solid solution $\alpha_{Cu}$. According to Table 1, the four-phase plane intersected at $e_{Tsol3}$=572° C. marks the ternary eutectoid decomposition of the $\beta$ phase into $\alpha+\delta+\alpha_{Cu}$. In the Cu—In boundary system (FIG. 21) $\beta$ forms by a peritectic reaction at $p_9$=710° C. and decomposes in a eutectoid reaction at $e_{sol3}$=574° C. Between the four-phase planes at $U_{10}$, $U_7$, and $U_{sol2}$, FIG. 28 exhibits the two-phase spaces $\alpha+\gamma$ and $\alpha+\delta$.

In the present work, we treat the phase set $\{\eta_A, \eta_{A'}, \eta_B, C, \eta_h\}$, which occurs in the Cu—In boundary system near the composition $Cu_{36}In_{64}$, as a single phase and denote it as $\eta$. The four-phase planes at $U_{15}$=506° C., $U_{16}$=308° C., and $E_{T2}$=153° C. lead to the formation of the three-phase equilibria $In_4Se_3+\alpha+\eta$, $In_4Se_3+Cu_{11}In_9+\eta$, and $In+Cu_{11}In_9+In_4Se_3$. The latter remain stable down to room temperature. In FIG. 27a the four-phase planes at $U_{15}$ and $U_{16}$ cover rather large areas. Beginning at the in corner these areas extend up to 50 at. % Se and 64 at. % Cu.

Furthermore, FIG. 28 demonstrates the increasing the In concentration lowers the temperature of the monotectic reaction $L_1 \to L_2+(Cu, In)_2Se_H$, which occurs in the Cu—Se boundary system at $mo_1$=1000° C., to the temperature $mo_{T1}$=653° C. Similarly, increasing the In concentration lowers the temperature of the eutectic reaction $L_2 \to (Cu, In)_2Se_H+\alpha_{Cu}$, which occurs at $e_1$=1063° C., to $U_4$=708° C. At $U_{sol1}$=618° C., only 2 K below the four-phase plane at $E_{T1}$, we observe a transition plane that does not involve a liquid phase. This four-phase reaction leads to the three-phase space $\alpha+\alpha_{Cu}+(Cu, In)_2Se_H$. The thermal effects at 134° C. indicate the transformation from $(Cu, In)_2Se_H$ into $(Cu, In)_2Se_R$.

5.2 Phase Equilibria with 40 at. % Se

The isopleth $In_{60}Se_{40}$—$Cu_{60}Se_{40}$ of FIG. 29 extends from 50 to 60 at. % Cu into the more Se-rich subsystem. The tie lines of the phase equilibria at 50 at. % Cu lie exactly in the plane of the $In_2Se_3$—$Cu_2Se$ section. Accordingly, the plane of the isopleth of FIG. 29 intersects with the critical tie lines $T_{k1}$ ($L \leftrightarrows H_T+Cu_2Se_H$), $T_{k3}$ ($H_T \leftrightarrows \delta_H+Cu_2Se_H$), and $T_{k7}$ ($\delta_H \leftrightarrows \alpha+Cu_2Se_H$). As described before in section 4.3, the phases $\delta_H$ and $h_T$ decompose by eutectic reactions at 785° C. and 923° C., respectively. One realizes that towards lower temperatures the two three-phase equilibria $\delta_H+\alpha+(Cu, In)_2Se_H$ of $T_{k7}$ (785° C., below $U_3$ and $U_{19}$) and also th three-phase spaces $H_t+\delta_h+(Cu, In)_2Se_H$ (below $U_1$ and $U_{17}$) each terminat in the critical tie line $T_{k3}$ at 923° C. Note that we have not labeled the corresponding three-phase spaces in FIG. 29 because they are very small.

Figure 29B:
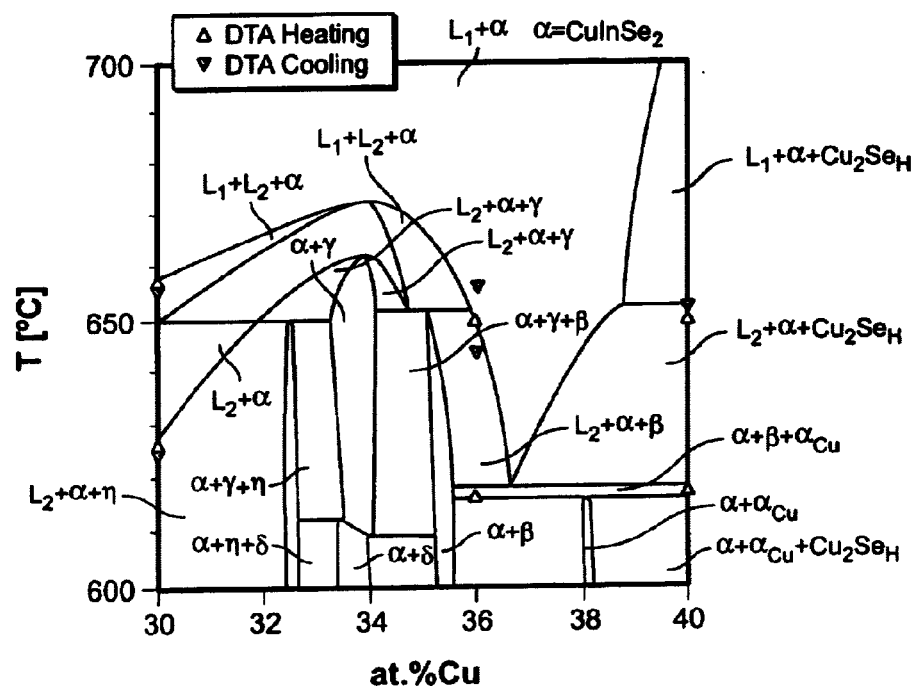

In total, the plane of the $In_{60}Se_{40}$—$Cu_{60}Se_{40}$ isopleth in FIG. 29 intersects with four liquidus surfaces and ten transition planes at $U_1$, $U_{17}$, $U_{19}$, $U_3$, $U_{10}$, $U_7$, $U_{14}$, $U_{15}$, $U_{16}$, and $U_{20}$. The four-phase planes at $mo_{T3}$, $U_{19}$, and $U_{20}$, whose surfaces intersect with the Cu-rich side of the plane of the $In_{60}Se_{40}$—$Cu_{60}Se_{40}$ isopleth, will be further discussed in Example III. The enlargement of FIG. 29b reproduces the phase equilibria below $T_{k12}$ and $T_{k13}$ in the composition range between 30 and 40 at. % Cu. The four-phase planes that intersect with the plane of this figure are the same we have already discussed with FIG. 28.

5.3 The $In_{50}Ser_{50}$—$Cu_{50}Se_{50}$ Isopleth

The $In_{50}Se_{50}$—$Cu_{50}Se_{50}$ isopleth, shown in FIG. 30, links phase equilibria of subsystem II (In—$In_2Se_3$—$Cu_2Se$—Cu) and subsystem III ($In_2Se_3$—Se—$Cu_2Se$). This isopleth shows the extension of homogeneous $\delta_H$ and a as a function of the Cu concentration. The plane of the isopleth extends exactly along the inner tie line (InSe+$\alpha$) of the transition plane at $U_{13}$ (597° C., $L+\delta_H \leftrightarrows InSe+\alpha$). The two-phase region InSe+$\alpha$ borders directly to the region of homogeneous $\alpha$ and only exhibits a weak dependence on the temperature. In Example I we have shown micrographs of InSe precipitates in $\alpha$ (FIGS. 13 and 20). On the Cu-rich side, the $\alpha$ phase (Cu, $In)_2Se_H$ can precipitate, however only in a narrow interval of compositions. The $In_{50}Se_{50}$—$Cu_{50}Se_{50}$ isopleth visualizes the liquidus surface of the phase $\delta_H$, which exhibits a maximum, and the point where $\delta_H$ transforms to $\alpha$ at 818° C. On the InSe side of the isopleth the DTA effects documented in FIG. 30 exhibit significant differences depending on whether recorded during heating or during cooling. The effects that we have registered near 500° C. during cooling down from the liquid phase do not reflect equilibrium states but metastable states. The DTA effects at 609° C., 607° C., and 597° C. are only observed on heating the respective alloys, after equilibrating them at low temperature. For the latter purpose, the specimens for the DTA analysis were annealed at 500° C. for 14d. The above three temperatures of the DTA effects observed during heating correspond to following temperatures of transition planes: $U_{11}$ ($L+In_6Se_7 \leftrightarrows InSe+\delta_R$), $U_{12}$ ($L+\delta_R \leftrightarrows InSe+\delta_H$), and $U_{13}$ ($L+\delta_H \leftrightarrows InSe+\alpha$).

5.4 The Isopleths $CuInSe_2$—$Cu_{50}In_{50}$ and $CuInSe_2$—$Cu_{70}In_{30}$

Figure 31:
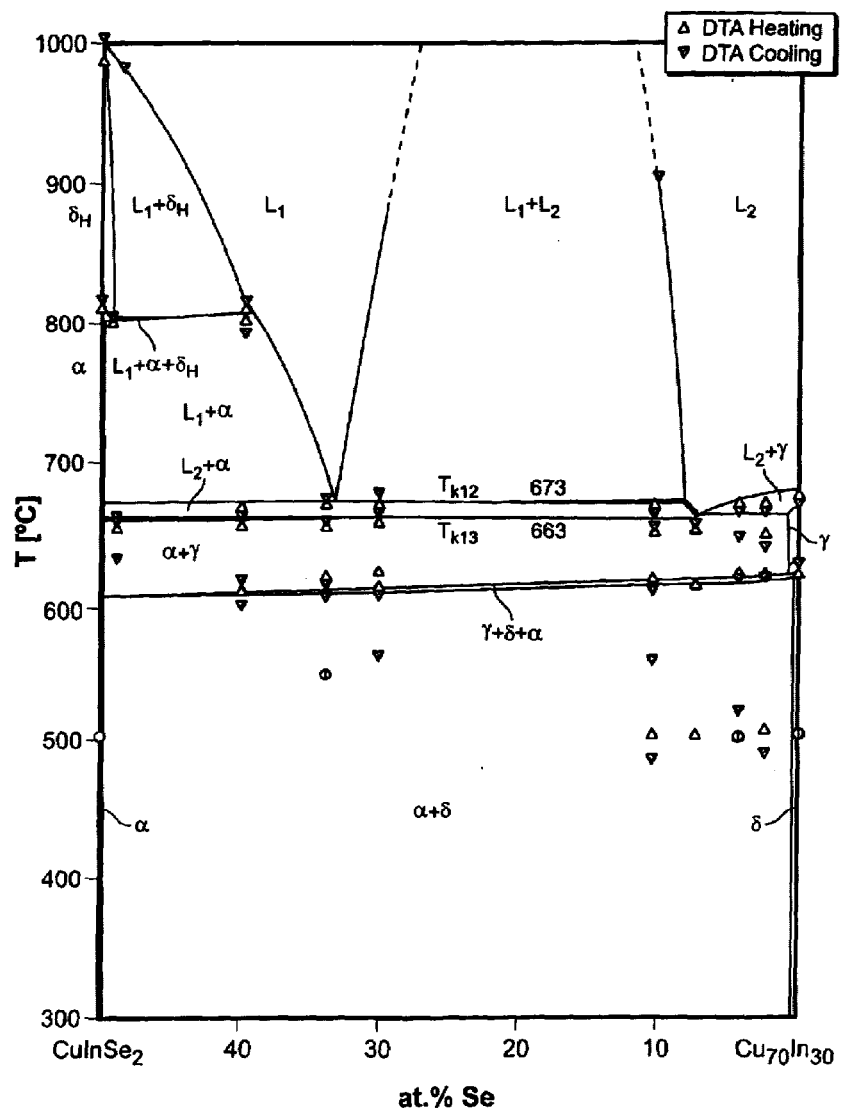
Figure 32:
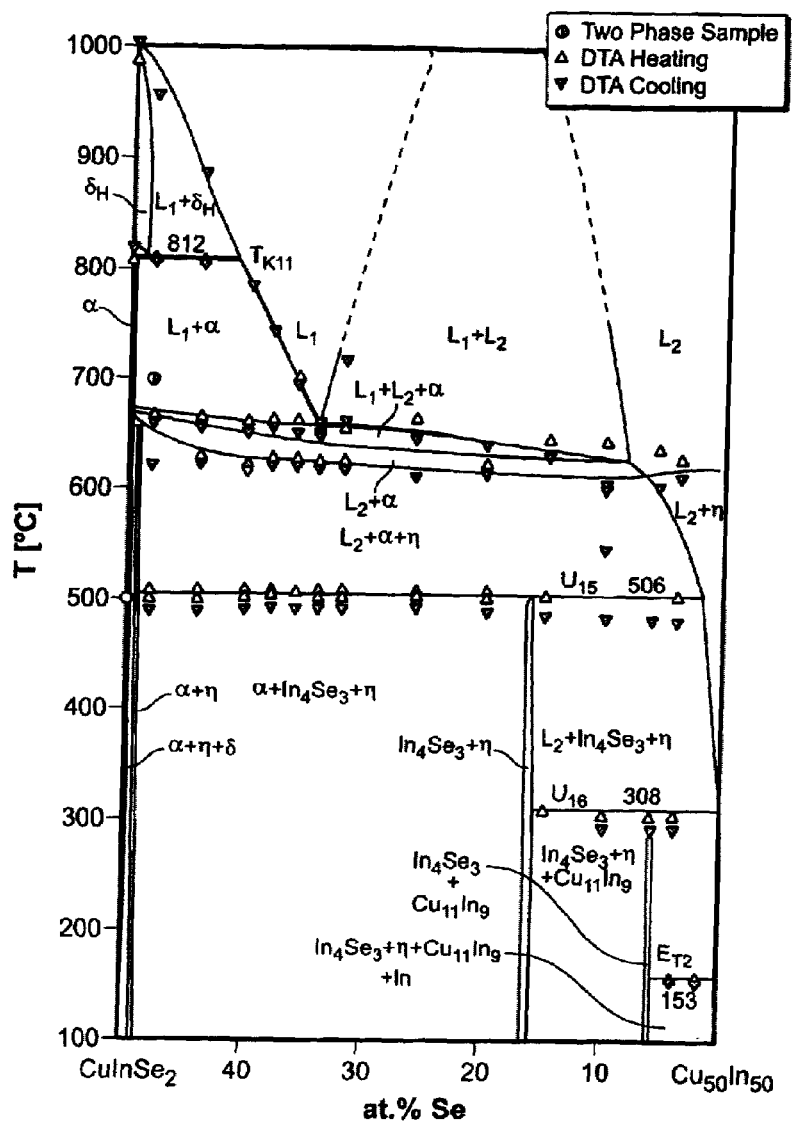

The two isopleths in FIGS. 31 and 32 reveal the extension of the $\delta_H$ and the $\alpha$ liquidus surfaces as a function of the In concentration. Even though the planes of both, FIG. 31 and FIG. 32 include some critical tie lines, the two isopleths do not constitute quasibinary sections: In FIG. 31 only the critical tie lines $T_{k12}$ (673° C.) and $T_{k13}$ (663° C.) lie in the plane of the section. The intersection of this plane with the three-phase equilibria $L_1+\alpha+\delta_H$ and $\gamma+\delta+\alpha$, however, results in monovariant equilibria. Therefore, the tie lines of the two-phase equilibria $L_1+\delta_H$ and $L_1+\alpha$ make angles with the plane of the isopleth. At $T_{k12}$ (673° C.) the liquid phase $L_1$ decomposes into $\alpha+L_2$ by a monotectic reaction. On further cooling, the liquid phase $L_2$, deficient in Se, decomposes into $\alpha+\gamma$ by a eutectic reaction. The DTA effects right above 600° C. go back to the polymorphic transformation from $\gamma$ to $\delta$ in the Cu—In boundary system (FIG. 21).

Figure 33:

FIG. 33 presents experimental evidence for the above reactions. After cooling down from the melt at 5 K/min, $Cu_{48.0}In_{14.0}Se_{38.0}$ features a large fraction of primary $\alpha$ (gray) and, along the grain boundaries, a eutectic microstructure that belongs to $\alpha+\gamma/\delta$. Owing to the monotectic reaction $L_1 \leftrightarrows \alpha+L_2$, the eutectic reaction $L_1 \leftrightarrows \alpha+\gamma$, and the transformation $\gamma \to \delta$ one can only interpret this micrograph in conjunction with DTA data.

Figure 34A:
Figure 34B:
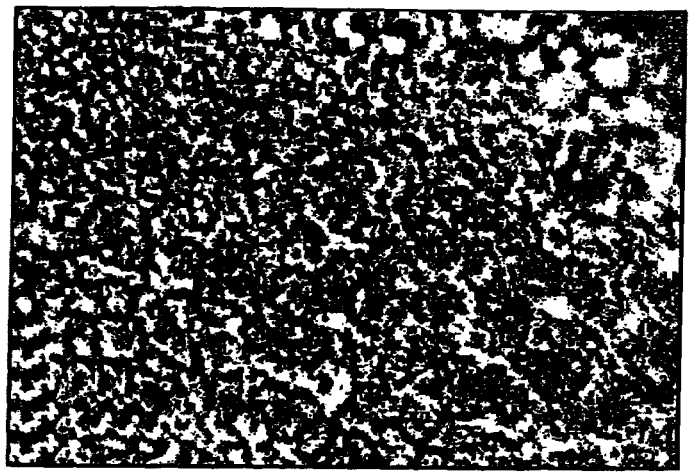

DTA of $Cu_{48.0}In_{14.0}Se_{38.0}$ showed five effects on cooling and four effects on heating. In FIG. 32, only the metatectic critical tie line $T_{k11}$ (812° C.) falls into the plane of the isopleth. The constellation that leads to this critical tie line is sketched in FIGS. 25a and 25b and explained in section 3.2. Below 812° C., FIG. 32 displays a liquidus surface of $\alpha$, which corresponds to $\alpha_{L1}$ in FIG. 26a. The micrograph of FIG. 34 reveals the microstructure of $Cu_{26.0}In_{26.0}Se_{48.0}$ at 700° C. and demonstrates the existence of the two-phase region $L_1+\alpha$. In FIG. 34a the fine-grained globular regions correspond to the liquid phase $L_1$. The matrix, which contains cracks, consists of $\alpha$. On quenching, the liquid phase $L_1$ first decomposes into $\alpha+L_2$ by a monotectic reaction. On further cooling, $L_2$, which is In-rich, precipitates the $\delta$ phase (bright regions in FIG. 34b).

Figure 35:

FIG. 35 shows another example of a microstructure that has formed by monotectic decomposition of the liquid phase $L_1$. The composition of this alloy, $Cu_{33.0}In_{33.0}Se_{34.0}$, corresponds exactly to the composition of the monotectic reaction; this becomes clear from FIG. 32 and the fractions of the respective phases predicted by the phase diagram. On cooling, the liquid phase $L_1$ decomposes almost completely into $\alpha$ and $L_2$. On further cooling, the liquid phase $L_2$, which is In-rich, precipitates the phase $\eta$. The latter appears as bright, globular component in the microstructure of FIG. 35. The dark phase, $In_4Se_3$, which decorates the grain boundaries in FIG. 35b, indicates that a small amount of liquid phase remained during crystallization and solidified to $In_4Se_3$ via the transition plane at $U_{15}$ (506° C.). In order to distinguish between the phases $\delta$ and $\eta$ that appear bright in FIGS. 34 and 35, respectively, we have carried out XEDS and XRD.

6. Isothermal Section at 500° C.

Figure 36:
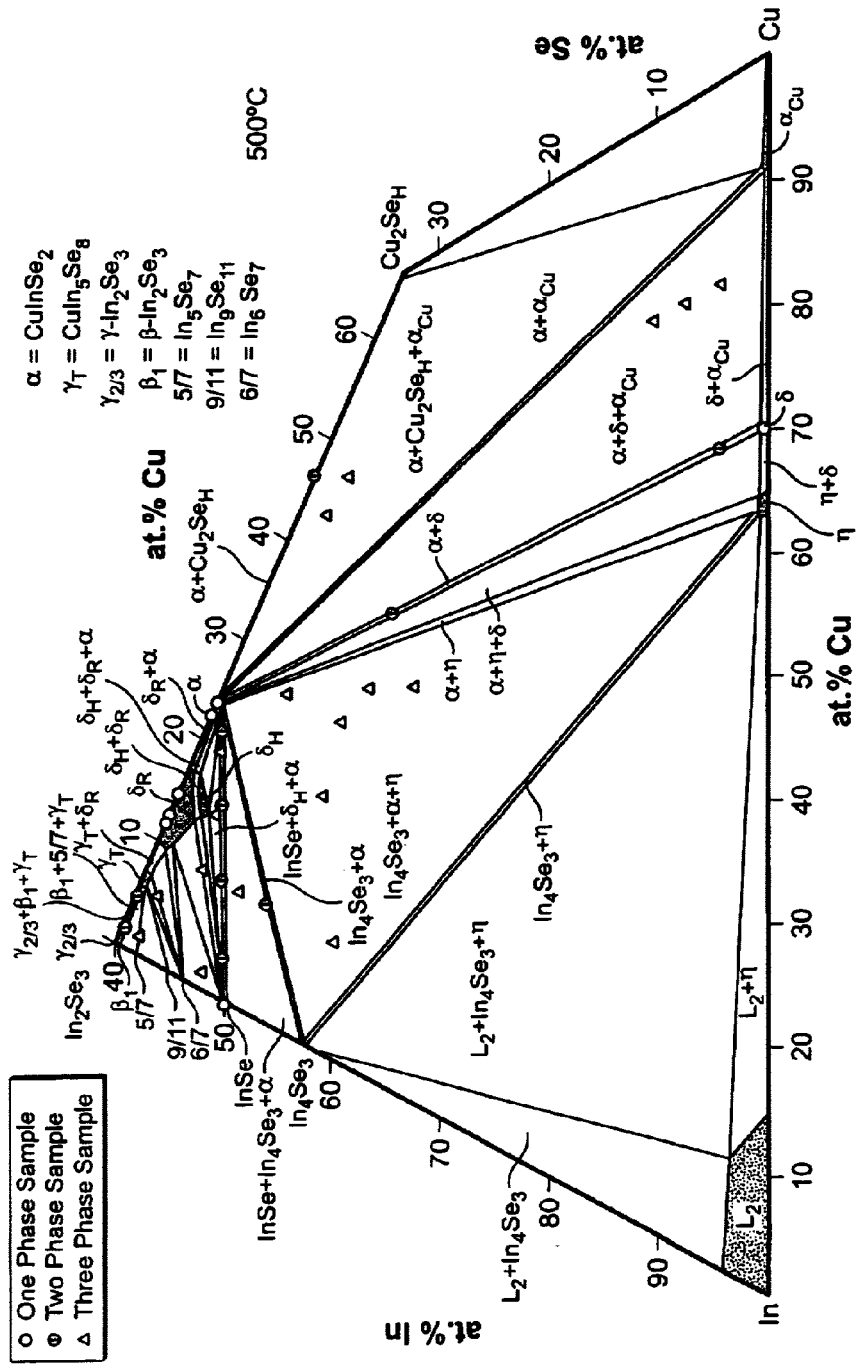

FIG. 36 presents an isothermal section of the phase diagram at 500° C. The shaded areas indicate single-phase regions. At 500° C. all phases are solid, except for the liquid phase $L_2$ in the In-rich corner. The three-phase equilibria $L_2+In_4Se_3+\eta$ and $In_4S_3+\alpha+\eta$ were established below the transition plane at $U_{15}$, the largest transition plane of the In—$In_2Se_3$—$Cu_2Se$—Cu subsystem. The two-phase equilibrium $\alpha+\delta$ in FIG. 36 indicates the plane of the $CuInSe_2$—$Cu_{70}In_{30}$ isopleth (FIG. 31).

The $\alpha$ phase, $CuInSe_2$, participates in eight two-phase and three-phase equilibria of the In—$In_2Se_3$—$Cu_2Se$—Cu subsystem. Explicitly, $\alpha$ establishes equilibria with $In_4Se_3$, $\eta$, $Cu_2Se_H$, $\delta$, $\alpha_{Cu}$, InSe, $\delta_H$, and $\delta_R$. The three-phase equilibria $\alpha+\alpha_{Cu}+Cu_2Se_H$, $\alpha+\eta+\delta$, and $\alpha+\delta+\alpha_{Cu}$ follow from the four-phase reactions at $U_{sol1}$ (618° C.), $U_{sol2}$ (612° C.), and $E_{Tsol3}$ (572° C.). The region between $In_4Se_3$-$\alpha(CuInSe_2)$—$In_2Se_3$ has been described in Example I (FIG. 16). While the high-temperature phase $\delta_H$ cannot be quenched-in at compositions within the plane of the quasibinary section $Cu_2Se$—$In_2Se_3$, it can be quenched-in at somewhat more In-rich compositions next to the plane of the section.

7. Microstructure at 500° C.

FIGS. 37, 38, 39 and 40 present micrographs of several different alloys after annealing at 500° C. for four to five days and subsequent quenching in water. For metallographic etching of polished surfaces we employed a solution of 10% ferri-nitrate. Particularly for Cu-rich alloys this solution proved to reveal the different phases with good contrast. For all other metallographic investigations we obtained sufficient SEM contrast without wet chemical etching. In some cases we could further improve the LM contrast by employing polarized light.

Figure 37A:
Figure 37B:
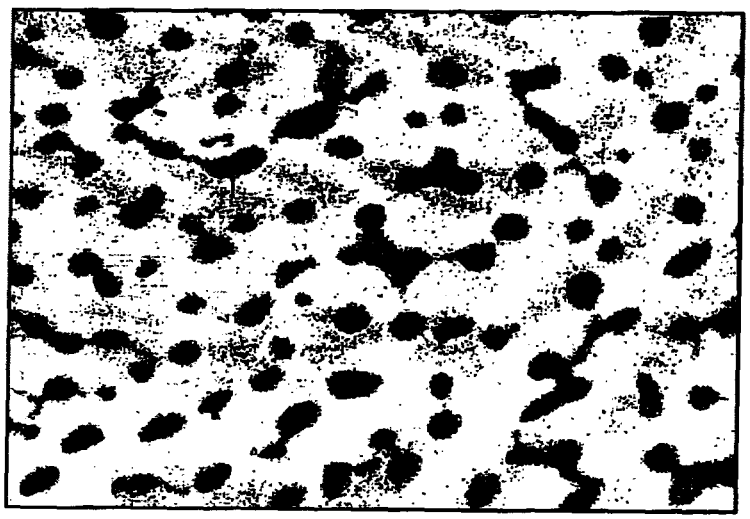

FIG. 37a reproduces the microstructure of $Cu_{48.0}In_{14.0}Se_{38.0}$. This micrograph, which was obtained without wet etching, indicates the sequence in which the individual phases have formed during solidification. The coarse eutectic microstructure reveals that at first part of the liquid phase has precipitated the phases $\alpha/\delta$ (gray) and (Cu, $In)_2Se_H$ (dark). Then, as solidification progresses, the composition of the liquid phase changes, such that the residual liquid phase $L_1$ finally decomposes into $L_1+\alpha+Cu_2Se_H$. Since the specimen of FIG. 37a has been annealed at 500° C., the microstructure that formed by the ternary eutectic reactions dominates the micrograph and documents the phase equilibrium $\alpha_{Cu}+\alpha+Cu_2Se_H$. The enlarged section in FIG. 37 allows to distinguish more clearly between $\alpha_{Cu}$ (dark), $Cu_2Se_H$ (dark-gray), and $\alpha$ (light-gray).

Figure 38:
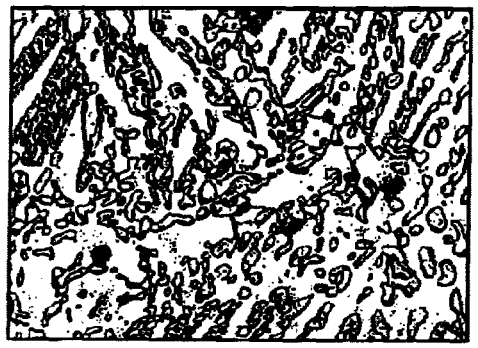

FIG. 38 shows the microstructure of $Cu_{28.0}In_{33.4}Se_{38.6}$ and confirms the existence of the three-phase equilibrium $In_4Se_3+\eta+\alpha$ below the transition plane at $U_{15}$ (506° C.). In this micrographs, $\alpha$ appears dark, $\eta$ appears bright, and $In_4Se_3$ shows up with a gray level in-between.

Figure 39:
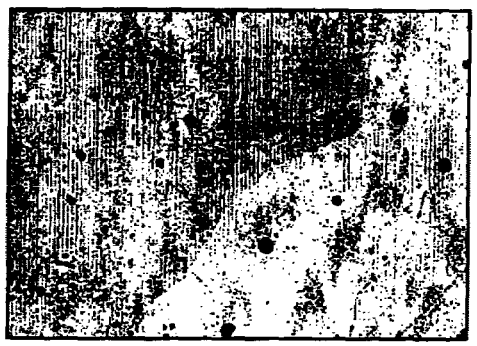

FIG. 39 documents the two-phase equilibrium between $\alpha$ and $\delta$. In polarized light, which we employed when recording this micrograph, the $\delta$ phase features a weak transition from light-gray to dark-gray. The $\alpha$ phase, which appears dark, has only a small volume fraction and consists of globular particles. In order to interpret the micrograph of FIG. 39 it is helpful to consult the $CuInSe_2$—$Cu_{70}In_{30}$ isopleth of FIG. 31. The latter shows that $\alpha$ forms from the liquid phase $L_2$ via the critical tie line $T_{k13}$ (663° C.), while $\delta$ goes back to the transformation $\gamma \to \delta$ at 605° C.

Figure 40:
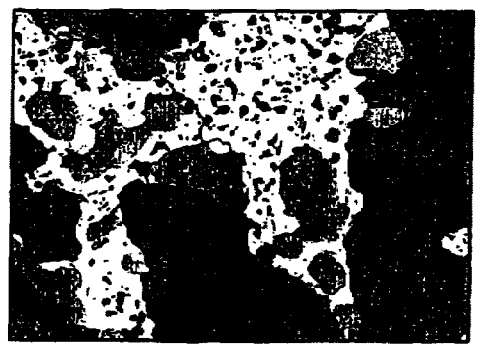

FIG. 40 presents evidence for the existence of the three-phase space $\alpha_{Cu}+\alpha+\delta$ below the eutectoid four-phase plane at $e_{Tsol3}$ (572° C.). After the etching applied here, $\alpha_{Cu}$ appears bright, $\delta$ light-gray, and $\alpha$ black.

With alloy compositions of 50 at. % Cu and 20 to 30 at. % Se, cooling down from the melt leads to separation of the liquid phase into the liquid phase $L_1$ and the liquid phase $L_2$. Since $L_1$ is Se-rich and $L_2$ is Cu-rich, $L_1$ predominantly solidifies to $\alpha+L_2+Cu_2Se_{H/R}$ in a ternary monotectic reaction at $mo_{T1}$, while $L_2$ mainly solidifies via the ternary eutectic four-phase plane at $E_{T1}$. If one fractures a specimen with a composition in the relevant range, already visual inspection of the cleavage surface reveals particles that originate from the solidification of the two different liquid phases. Metallographic etching of such alloys exhibits globular regions indicating for the decomposition of $L_2$.

Figure 41A:
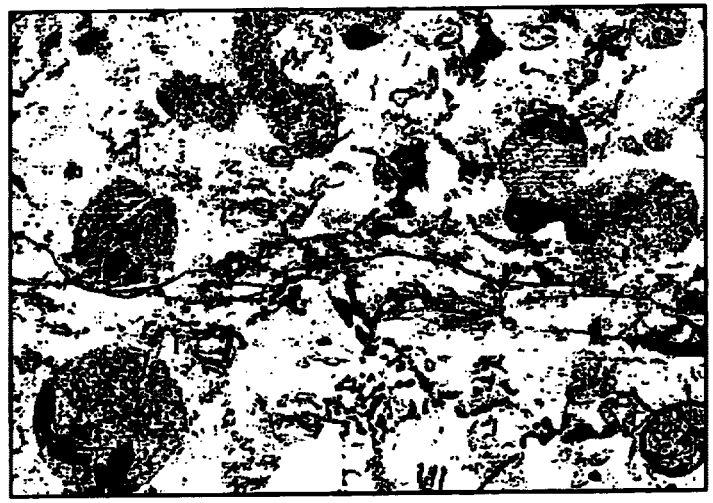
Figure 41B:

FIG. 41 shows an example for such a microstructure. FIG. 41a reveals the microstructure of $Cu_{48.0}In_{22.0}Se_{30.0}$ after cooling down from 1000° C. to room temperature at 5 K/min. The bright regions indicate where $L_1$, the Se-rich liquid phase, has solidified, while the dark, globular regions originate from the solidification of $L_2$, the Cu-rich liquid phase. The globular regions consist of several phases, including the $\alpha_{Cu}$ solid solution, which has formed by primary precipitation from the liquid phase $L_2$ (FIG. 41b).

Figure 42A:
Figure 42B:

If one cools down alloys with a compositions near the monotectic point at $mo_{T1}$ from the liquid state at 1020° C. to 600° C. at 2 K/min, fine Cu whiskers form at the surface of the specimen (FIGS. 42a and b). These Cu whiskers have grown out from the black holes one recognizes in the background of FIG. 23b and probably form owing to the contraction that takes place during the slow cooling of the residual liquid phase $L_2$, which is Cu-rich.

8. Conclusion

In this Part we have described the phase equilibria of In—$In_2Se_3$—$Cu_2Se$—Cu, subsystem II of the Cu—In—Se system, by liquidus projections, isopleths, and isothermal sections of the ternary phase diagram. We have found that the miscibility gaps in the In-rich regions of the boundary systems In—Se and Cu—Se, respectively, merge continuously. Eutectic, metatectic, and monotectic critical tie line play an important role for the phase equilibria of the In—$In_2Se_3$—$Cu_2Se$—Cu subsystem. In particular, metatectic and monotectic critical tie lines lead to the existence of two primary crystallization surfaces for the α phase ($CuInSe_2$), which constitutes the most important phase for photovoltaic applications.

Part III

1. General

Part III deals with the remaining subsystem III, $In_2Se_3$—Se—$Cu_2Se$, and extends the discussion to the entire composition triangle. We discuss this subsystem by means of a liquidus projection, several isothermal sections and several isopleths. Furthermore, we supplement the reaction scheme of Part II by two further reaction schemes for the regions $In_2Se_3$—Se—$CuInSe_2$ and $Cu_2Se$—Se—$CuInSe_2$ (IIIa and IIIb in FIG. 1).

Subsequently, we discuss the phase equilibria of the Cu—In—Se system as a whole. For this purpose, we show its liquidus projection, three isothermal sections, and two isopleths, covering the entire composition triangle.

The fabrication of the alloys and the experimental methods we used for characterization are described in Part I.

2. Phase Equilibria of the $In_2Se_3$—Se—$Cu_2Se$ Subsystem 2.1 Liquidus Projection FIG. 43 presents the liquidus of the Cu—In—Se system, as determined by DTA (differential thermal analysis) and metallography of cast alloys and DTA specimens cooled down from the melt. The symbols p, e, and mo in FIG. 43a denote binary peritectica, eutectica, and monotectica, respectively. The fine lines represent liquidus isotherms. Bold lines with arrows, in contrast, represent eutectic, peritectic or monotectic reactions. The arrows always indicate the direction of decreasing temperature. The symbols U, $E_T$, and $mo_T$ designate transition planes, ternary eutectica and ternary monotectica, respectively. Thus, these symbols indicate four-phase reactions involving a liquid phase. The dotted lines marked with symbols $T_k$ in FIGS. 43a, 43e, and 43f indicate critical tie lines. In Parts I and II we have explained eutectic, peritectic, metatectic, and monotectic critical tie lines as well as two types of four-phase planes (transition planes and ternary eutectica) by means of schematic drawings.

The dominant features in the liquidus projection of FIG. 43 are the miscibility gap of the liquid phases $L_1+L_2$ and the primary crystallization surface of the phase $\delta_H$. The melting point maximum of $\delta_H$ lies at 1002° C. and is marked by a dot in FIG. 43a. While the maximum resides within the plane of the $In_2Se_3$—$Cu_2Se$ isopleth, it corresponds to a Cu content of 23.5 at. % and thus does not exactly coincide with the stoichiometry $CuInSe_2$ of the α phase.

The phase $H_T$ ($Cu_{13}In_3Se_{11}$), which also crystallizes via a melting point maximum within the plane of the $In_2Se_3$—$Cu_2Se$ isopleth, possesses the smallest liquidus surface. Owing to the binary monotectica $mo_1$, $mo_2$, and $mo_3$ as well as the ternary monotectica $mo_{T1}$, $mo_{T2}$ and $mo_{T3}$ the phases $Cu_2Se_H$ and $In_4Se_3$ have two surfaces of primary crystallization, which lie parallel to the boundary systems Cu—Se and In—Se, respectively, in FIGS. 43a and 43c.

Figure 43A:
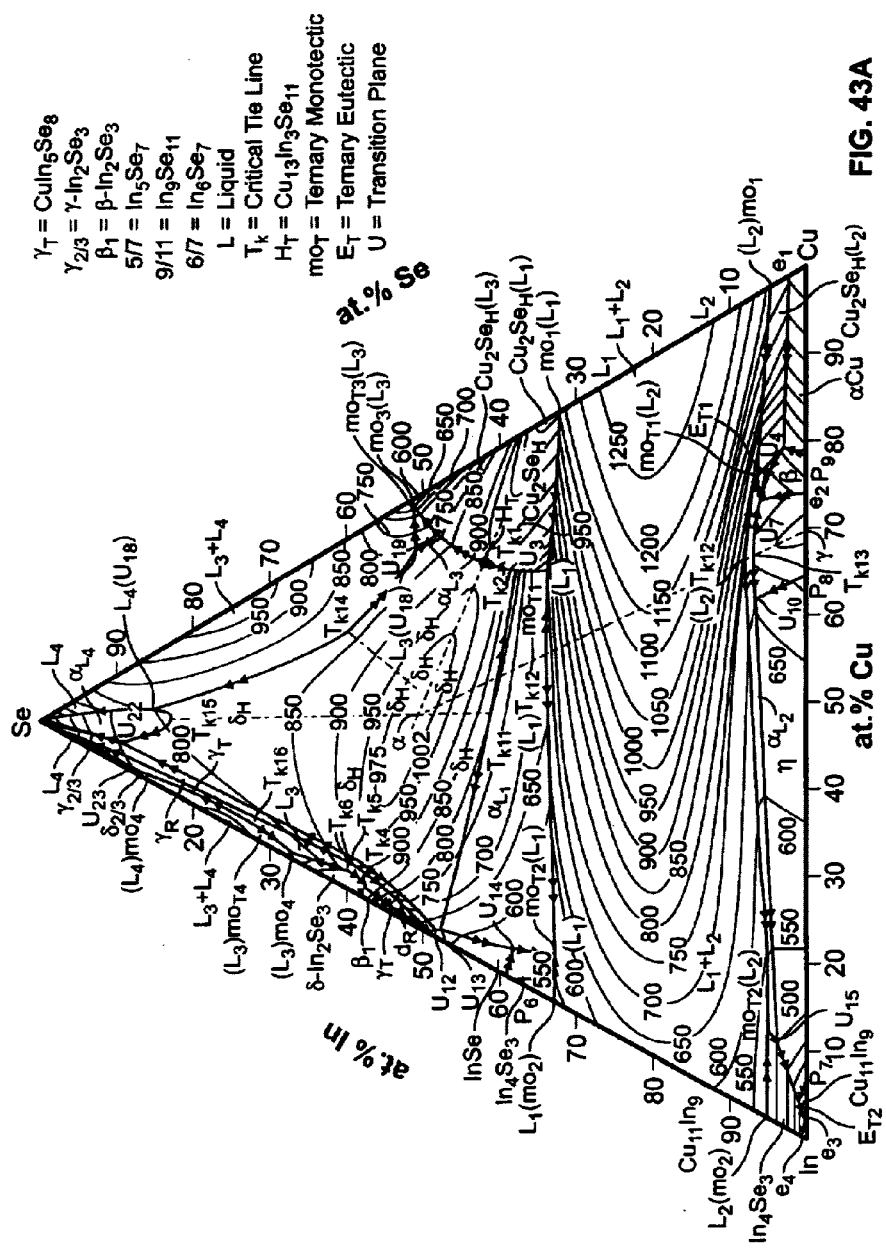

The α phase ($CuInSe_2$) possesses two surfaces of primary precipitation from the liquid phase in the $In_2Se_3$—Se—$Cu_2Se$ subsystem. FIG. 43a shows these surfaces as $α_{L1}$ and $α_{L2}$. As explained in Part II, these liquidus surfaces form via the metatectic critical tie line $T_{k11}$ and the monotectic critical tie line $T_{12}$. The Se-rich side of the liquidus projection in FIGS. 43a, 43b, and 43c exhibits two further liquidus surfaces of a that we have observed: $α_{L3}$ and $α_{L4}$. The liquidus surface $α_{L4}$ results from the metatectic critical tie line $T_{k15}$ and extends to the Se corner. The liquidus surface $α_{L3}$, in contrast, lies parall I to the Cu—Se boundary system at about 50 at. % Se and originates from the four-phase reaction $U_{18}$ (Table 2 and Section 2.3).

Figure 44A:
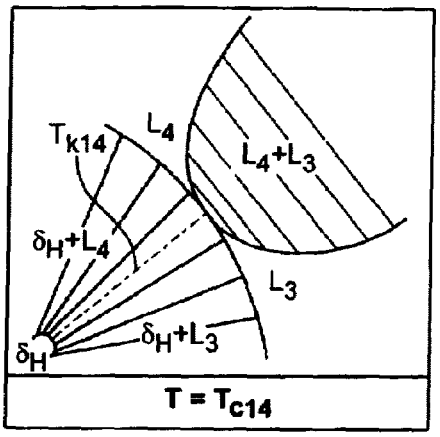
Figure 44B:
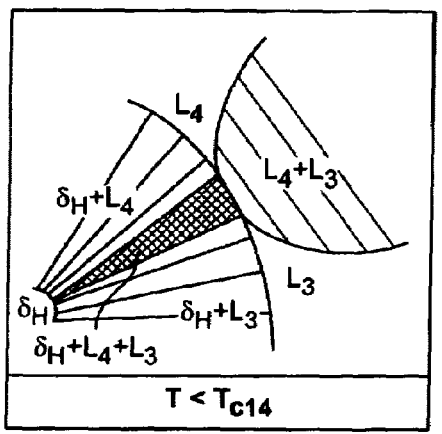

In FIG. 43a the miscibility gap $L_3+L_4$, which originates from the Cu—Se boundary system, terminates at a critical point at $T_{k14}$. At this critical point the liquidus isotherms of the two-phase region $L+\delta_H$ touch with the critical point of the miscibility gap $L_3+L_4$. Note that this point corresponds to a saddle point of the liquidus. FIGS. 44a and 44b present schematic drawings of this situation, which we explain further in the following.

Figure 44C:
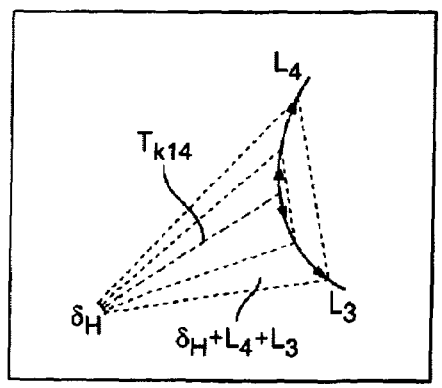

In FIG. 44a the critical point of the miscibility gap $L_3+L_4$ meets the liquidus isotherm of the two-phase space $L_3+\delta_H$ or $L_4+\delta_H$, respectively, at $T_{k14}$; at $T_{k14}$ the liquid phases $L_3$ and $L_4$ have the same composition. The dotted line that emerges from this point marks a 'special' critical tie line, along which the phases $L_3=L_4$ establish an equilibrium with $\delta_H$. Below the critical temperature of $T_{k14}$, the system develops a single three-phase space, $L_3+L_4+\delta_H$, which is shown in black in FIG. 44b. On reducing the temperature this three-phase space widens, while the liquid phase $L_4$ becomes richer in Se and the liquid phase $L_3$ becomes more and more deficient in Se. FIG. 44c demonstrates the extension of the three-phase space with decreasing temperature in a three-dimensional schematic drawing. The critical tie lines $T_{k14}$, $T_{k15}$, and $T_{k16}$ initiate rather complicated reaction schemes within the $In_2Se_3$—Se—$Cu_2Se$ subsystem. The critical tie line $T_{k16}$ is of the same type as $T_{k14}$.

In the entire Cu—In—Se system we have determined twenty-nine different liquidus surfaces, eighteen critical tie lines, and 40 four-phase equilibria. In order to simplify the discussion, we have subdivided the $In_2Se_3$—Se—$Cu_2Se$ subsystem into the regions $CuInSe_2$—Se—$Cu_2Se$ and $In_2Se_3$—Se—$CuInSe_2$ (IIIa and IIIb, compare FIG. 1). The boundary between these two regions coincides with the metatectic critical tie line $T_{k15}$. In the following, we first discuss the isopleth along this separation line and then turn to the regions IIIa and IIIb.

2.2 The Se—$CuInSe_2$ Isopleth

Figure 45:
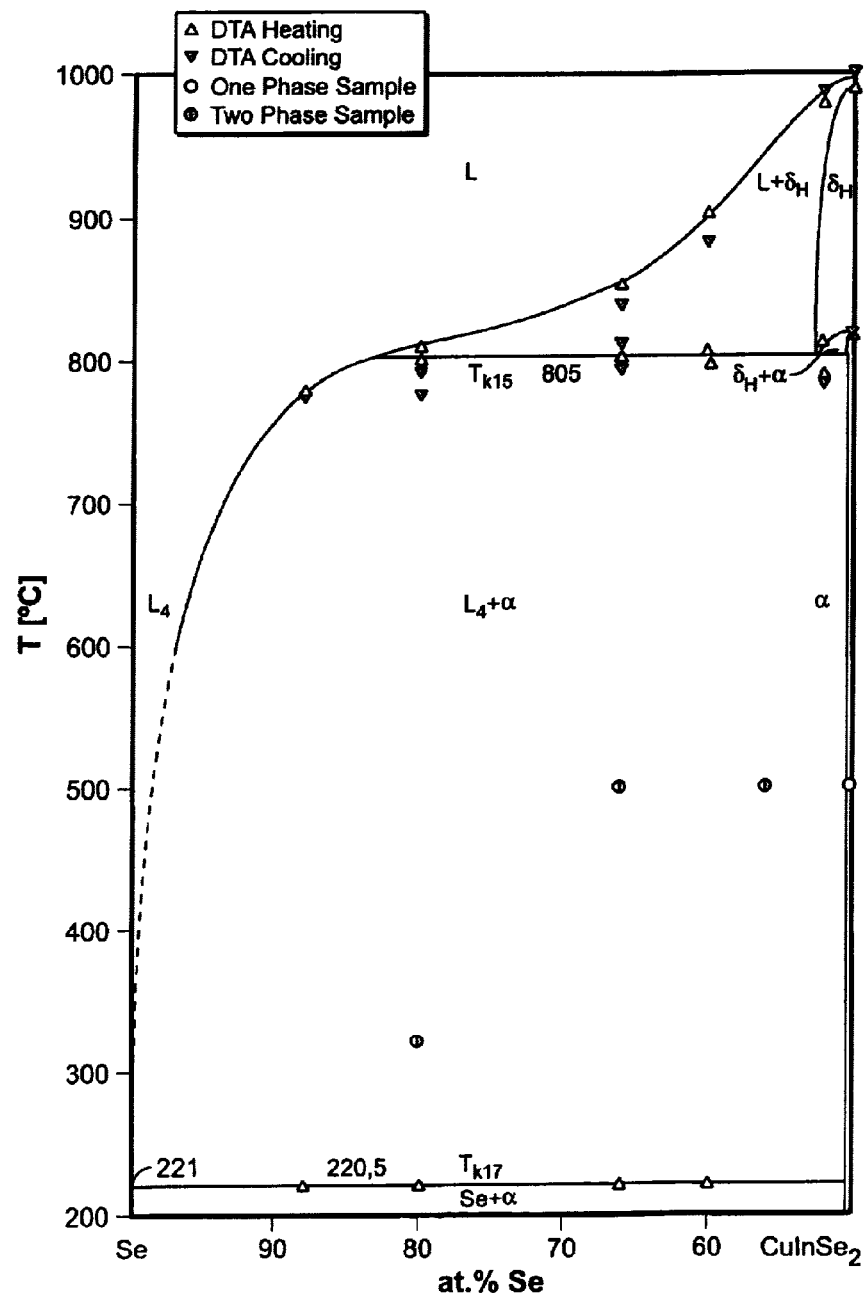

FIG. 45 shows the isopleth Se—$CuInSe_2$, in other words the vertical section along the metatectic critical tie line $T_{k15}$. In this representation one clearly recognizes the melting point maximum of the phase $\delta_H$ and the temperature maximum of the reaction from $\delta_H$ to α ($CuInSe_2$). At 805° C. and along the critical tie line $T_{k15}$ the high-temperature phase $\delta_H$ decomposes into the Se-rich liquid phase $L_4$ and α. This reaction represents a kind of eutectic crystallization and is denoted as "metatectic". In Part II we have introduced metatectic critical tie lines with the example of the critical tie line $T_{k11}$. Below $T_{k15}$ and above 220.5° C., FIG. 45 indicates a two-phase equilibrium between the liquid phase $L_4$ and α. Above 805° C. the Se—$CuInSe_2$ isopleth is no longer a quasibinary one because the intersection between the maxima and the plane of the isopleth does not occur exactly at the composition $Cu_{25.0}In_{25.0}Se_{50.0}$. As mentioned before, both maxima fall into the plane of the $In_2Se_3$—$Cu_2Se$ isopleth and occur at 23.5 at. % Cu and 24.8 at. % Cu, respectively. Thus, the tie lines of the two-phase region $L+\delta_H$ do not lie exactly within the plane of the Se—CuInSe$_2$ isopleth.

2.3 CuInSe$_2$—Se—Cu$_2$Se

Table 2 describes the entire reaction scheme of the CuInSe$_2$—Se—Cu$_2$Se region (IIIb in FIG. 1). The column entitled In$_2$Se$_3$—Cu$_2$Se lists the relevant critical tie lines of this region: $T_{k1}$, $T_{k2}$, $T_{k3}$, and $T_{k7}$. The lines marked by arrows or "I" originate from or lead to the subsystems In—In$_2$Se$_3$—Cu$_2$Se—Cu (critical tie lines $T_{k1}$, $T_{k2}$, $T_{k3}$, and $T_{k7}$) and In$_2$Se$_3$—Se—Cu$_2$Se (critical tie lines $T_{k15}$, $T_{k17}$). In the region of CuInSe$_2$—Se—Cu$_2$Se Table 2 lists five transition equilibria ($U_{17}$, $U_{18}$, $U_{19}$, $U_{20}$, $U_{21}$), one ternary monotecticum (mo$_{T3}$), and one ternary eutecticum ($E_{T3}$).

Figure 43B:
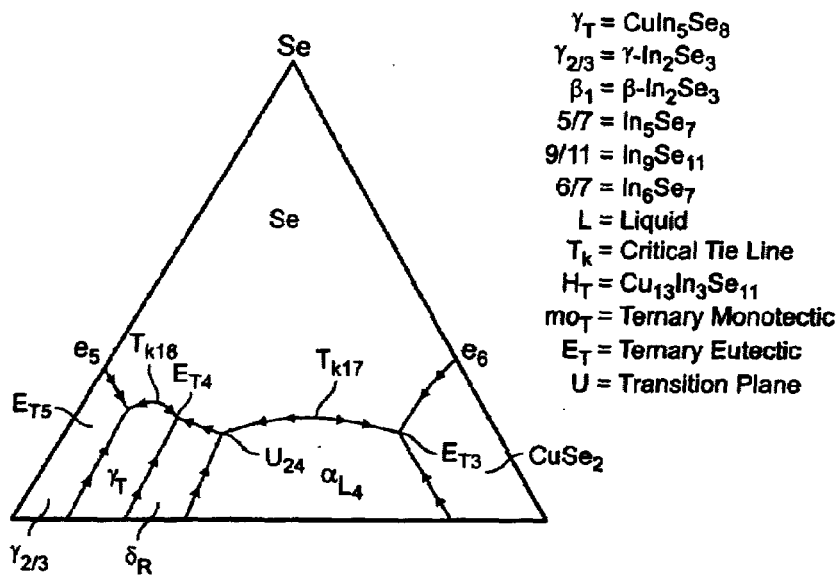
Figure 43C:
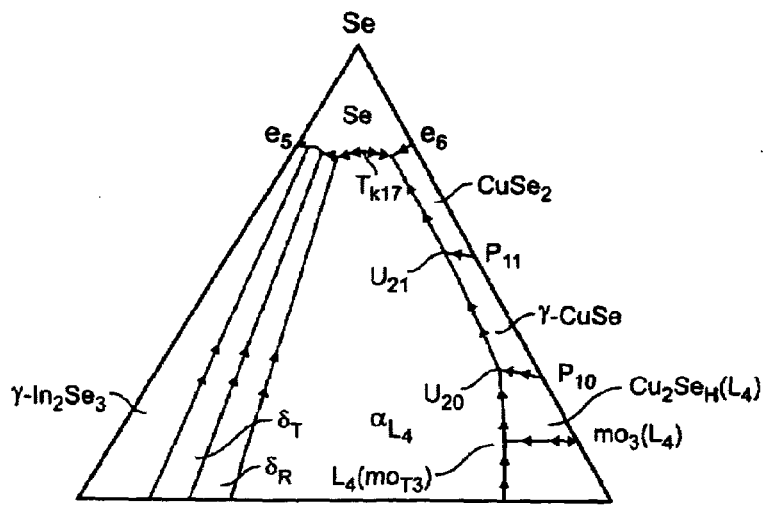
Figure 43D:
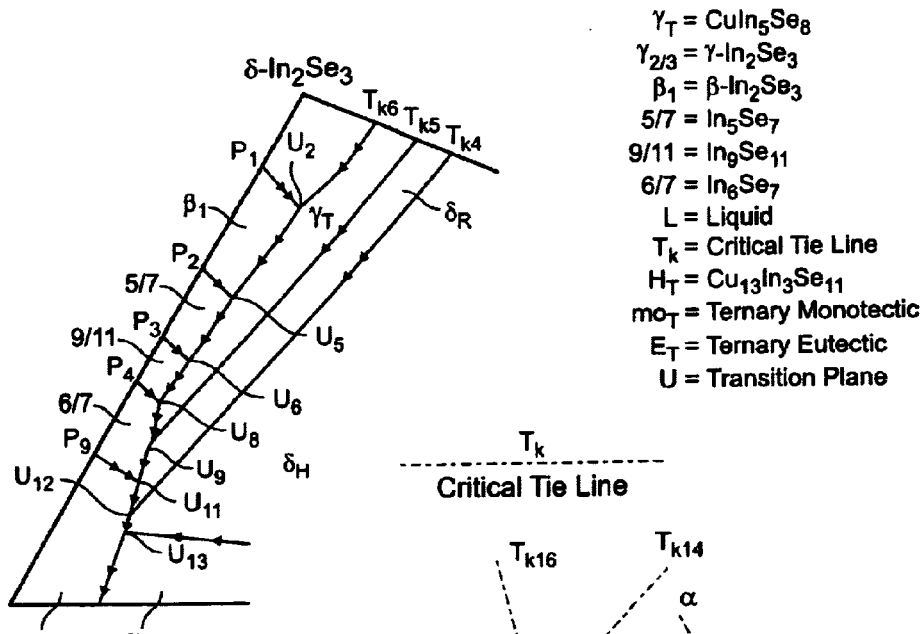
Figure 43E:
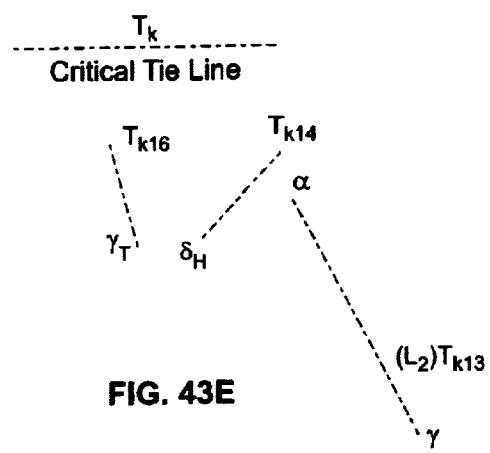
Figure 43F:
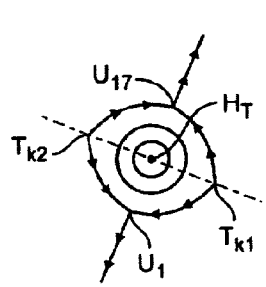
Figure 43G:
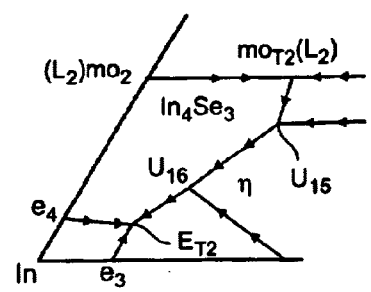

The Cu-rich side of the In$_2$Se$_3$—Cu$_2$Se isopleth features crystallization of the phase H$_T$ (Cu$_{13}$In$_3$Se$_{11}$) via a melting point maximum at 947° C. (FIGS. 43a and 43f). H$_T$ is a high-temperature phase that we could not stabilize at room temperature. At 923DC H$_T$ decomposes into α+(Cu, In)$_2$Se by a eutectoid reaction. According to FIG. 43f the liquidus surface of H$_T$ is bounded by the critical tie lines at $T_{k2}$ and $T_{k1}$ and by the points U$_1$ and U$_{17}$.

The transition plane U$_1$ belongs to the In—In$_2$Se$_3$—Cu$_2$Se—Cu subsystem and was discussed in Part II. Below the transition plane U$_{17}$ we observe two three-phase equilibria: $L_3+\delta_H+$(Cu, In)$_2$Se$_H$ and $\delta_H+H_T+$(Cu, In)$_2$Se$_H$. The latter equilibrium also exists below the transition plane U$_1$ at 925° C. in the In—In$_2$Se$_3$—Cu$_2$Se—Cu subsystem. Table 2 further indicates that both these three-phase equilibria terminate in the minimum at the critical tie line $T_{k3}$ (923° C.).

For the phase equilibria of the CuInSe$_2$—Se—Cu$_2$Se region, the critical tie line $T_{k14}$ (835° C.) plays a key role. This is because the critical point of the miscibility gap $L_3+L_4$ of the Cu—Se boundary system falls onto this critical tie line. According to FIG. 44b the critical tie line at $T_{k14}$ brings about the three-phase space $L_3+L_4+\delta_H$. With decreasing temperature this space extends and then terminates on the four-phase plane U$_{18}$ ($L_4+\delta_H \rightleftharpoons α+L_3$) at 803° C., together with the three-phase space $\delta_H+L_4+α$. According to FIGS. 43a, 43b, and 43c, the liquid phase L$_4$ below the four-phase plane U$_{18}$ becomes more and more Se-rich, participates in the transition planes U$_{20}$ (376° C.) and U$_{21}$ (338° C.), and ends at $E_{T3}$ (220° C.).

The liquid phase L$_3$ at 803° C. becomes richer in Cu when the temperature decreases, takes part in the four-phase reaction U$_{19}$ at 800° C., and ends at the ternary monotecticum mo$_3$ (522° C.). The liquidus projection of FIG. 43a displays a small liquidus surface of the α phase (CuInSe$_2$) below the four-phase reaction U$_{19}$. in FIG. 43a this surface is designated as $α_{L3}$, and it is bounded by L$_3$ (U$_{18}$), U$_{19}$, and mo$_{T3}$.

Depending on the position of the isopleths within the CuInSe$_2$—Se—Cu$_2$Se region, these vertical sections may intersect with the four-phase planes listed in Table 2. By means of the isopleths shown in FIGS. 46, 47, and 48 we now discuss the nonvariant equilibria of the region CuInSe$_2$—Se—Cu$_2$Se.

Figure 46:
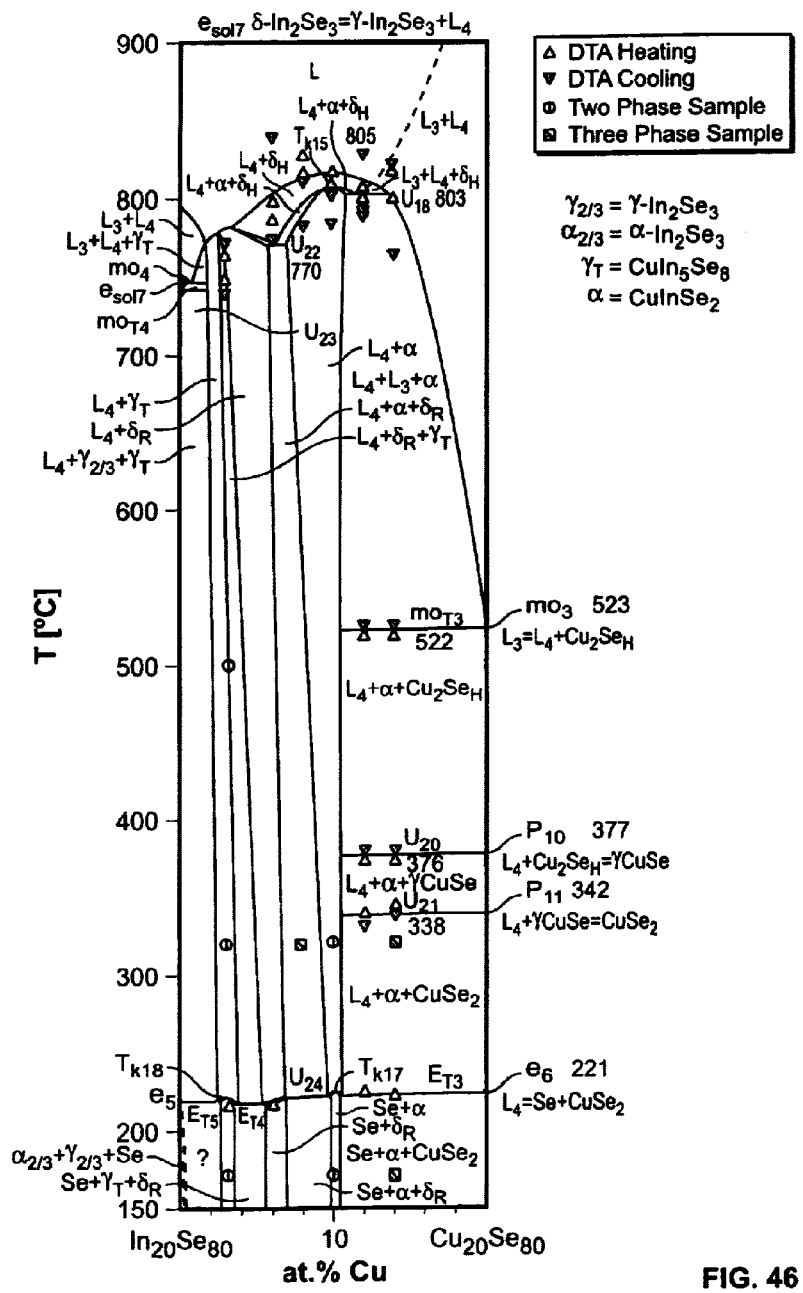

The isopleth In$_{20.0}$Se$_{80.0}$—Cu$_{20.0}$Se$_{80.0}$ in FIG. 46 exhibits substantial differences between the phase equilibria between the left half (0 to 10 at. % Cu) and the right half (10 to 20 at. % Cu). In the region from 10 to 20 at. % Cu the isopleth intersects with the four-phase planes U$_{18}$, mo$_{T3}$, U$_{20}$, U$_{21}$, and E$_{t3}$ as given in Table 2. As we have mentioned before, the CuInSe$_2$—Se isopleth coincides with the boundary between the regions CuInSe$_2$—Se—Cu$_2$Se and In$_2$Se$_3$—Se—CuInSe$_2$.

Figure 47:
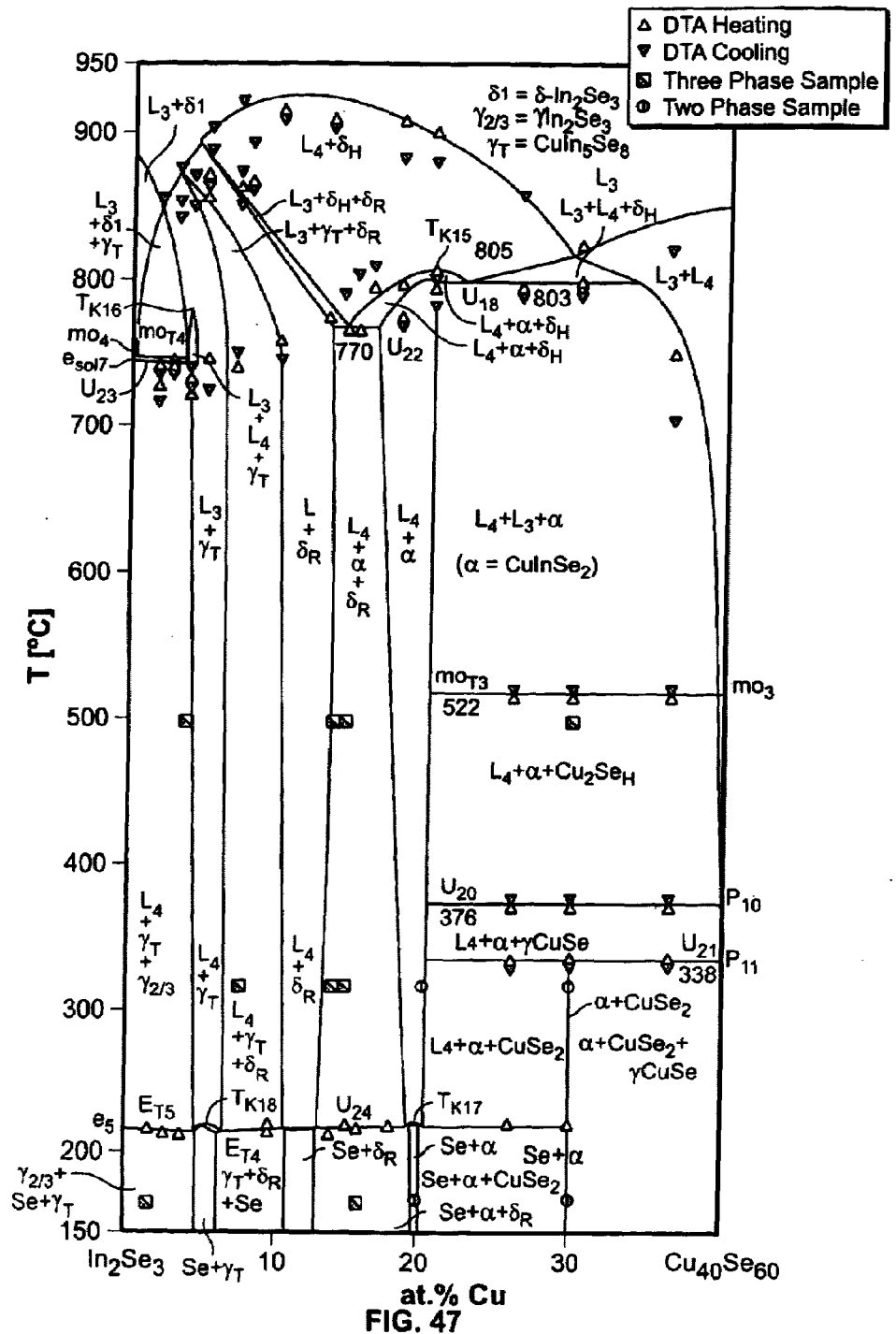
Figure 48A:
Figure 48B:
Figure 49A:
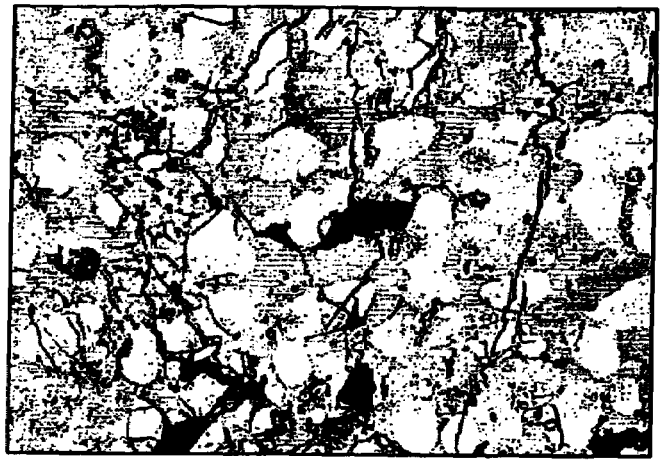
Figure 49B:

The isopleth In$_2$Se$_3$—Cu$_{40.0}$Se$_{60.0}$ in FIG. 47 features intersection with the same four-phase planes as in FIG. 46 in the region from 20 to 40 at. % Cu. Again, this isopleth exhibits substantial differences between the phase equilibria in the left half (0 to 20 at. % Cu) and the right half (20 to 40 at. % Cu). The plane of the isopleth intersects with four-phase plane U$_{21}$ such that it includes the two-phase equilibrium α+CuIn$_2$ as well as the three-phase equilibria $L_4+α+CuSe_2$ and $α+CuSe_2+γ-CuSe$, which are established below 338° C. The phases γ-CuSe and CuSe$_2$ form in the Cu—Se boundary system via the peritectic reactions p$_{10}$ and p$_{11}$ at 377° C. and 342° C., respectively. The microstructure of Cu$_{30.0}$In$_{10.0}$Se$_{60.0}$ in FIGS. 48a through 48b confirm the existence of the four-phase reactions U$_{20}$ and U$_{21}$. The SEM image of FIG. 48a reveals the microstructure of the three-phase space $L_4$ (gray)+α(bright)+CuSe$_H$ (dark) between mo$_{T3}$ (522° C.) and U$_{20}$ (376° C.). The Se-rich liquid phase L$_4$ (gray) solidified with a fine grain size during the water quench. In the LM color micrograph of FIG. 48b the fine grained regions of L$_4$ appear gray while α and CuSe$_H$ show up with a dark brown and a light brown hue, respectively. Tempering the same alloy for two days at 320° C. yields the microstructure of FIG. 49. The SEM image in FIG. 49a reveals the two-phase equilibrium α (bright)+CuSe$_2$ (dark). The LM bright-field micrograph of FIG. 49b, which has been recorded under polarized light, additionally reveals the fine grains of the CuSe$_2$ phase. The composition Cu$_{30}$In$_{10}$Se$_{60}$ falls onto the line that connects α with CuSe$_2$ and coincides with the inner tie line of the transition plane U$_{21}$ ($L_4+γ$-CuSe α+CuSe$_2$).

The isopleth In$_{50.0}$Se$_{50.0}$—Cu$_{50.0}$Se$_{50.0}$ in FIG. 30 features phase equilibria of subsystem II (In—In$_2$Se$_3$—Cu$_2$Se) and the region IIIb (CuInSe$_2$—Se—Cu$_2$Se) of subsystem III. The equilibria between 0 and 25 at. % Cu were already described in Example II. FIG. 30 visualizes the intersection of the isopleth with the liquidus surface of the phase $\delta_H$ and the temperature maximum of the solid state reaction from $\delta_H$ to α. Between 25 and 50 at. % Cu on recognizes the intersection with the four-phase planes U$_{19}$, mo$_{T3}$, and U$_{20}$, and between 800° C. and 522° C. the diagram reveals part of the two-phase space $L_3+α$. The liquidus line between 45 and 49 at. % Cu belongs to the liquidus surface L$_3$ (α).

2.4 In$_2$Se$_3$—Se—CuInSe$_2$

In this section we describe the region In$_2$Se$_3$—Se—CuInSe$_2$ of subsystem III (region IIIb in FIG. 1) by means of the liquidus projection (FIGS. 43a, 43b and 43e), the isopleths with 80 and 60 at. % Se (FIGS. 47 and 48), and the reaction scheme of Table 3.

In FIG. 43a one end of the critical tie line $T_{k16}$ is marked by a dot. The corresponding point terminates the miscibility gap of the liquid phases L$_3$ and L$_4$, and at this point the critical point of the liquid phases L$_3$ and L$_4$ touches the liquidus isotherm L+γ$_T$. Along the critical tie line formed in this way the phases L$_3$=L$_4$ establish an equilibrium with γ$_T$ (FIG. 43e). Below $T_{k1}$, this equilibrium develops into the three-phase space $L_3+L_4+γ_T$ (Table 3).

On cooling, the liquid phase L$_4$ of the three-phase space $L_3+L_4+γ_T$ becomes richer in Se, takes part in the four-phase reactions U$_{22}$, U$_{23}$, and U$_{24}$, and vanishes at $E_{T4}$ (219° C.). In contrast to this behavior, the liquid phase L$_3$ becomes richer in In with decreasing temperature and finally decomposes into $L_4+β_1+γ_T$ by the monotectic reaction mo$_{T4}$ (745° C.). The symbol $δ_1$, which was introduced in Table 3 denotes the high-temperature phase δ-In$_2$Se$_3$. The column entitled In$_2$Se$_3$—CuInSe$_2$ of Table 3 contains the critical tie lines $T_{k4}$, $T_{k5}$, $T_{k6}$, $T_{k8}$, and $T_{k9}$ on the In-rich side of the In$_2$Se$_3$—

Cu$_2$Se isopleth (subsystem I). The symbol $\gamma_T$ denotes the ternary phase (CuIn$_5$Se$_8$), which forms within this quasibinary section at 900° C.

The column entitled In$_2$Se$_3$—Se of Table 3 lists the non-variant equilibria mo$_4$ (750° C.), e$_{sol7}$ (745° C.), e$_5$ (221° C.), and p$_{sol1}$ (201° C.) of the In—Se boundary system.

The transition plane U$_{22}$ (L$_4$+$\delta_H$⇌$\alpha$+$\delta_R$) terminates the three-phase equilibria that emerge from the critical tie lines T$_{k4}$ (L+$\delta_H$+$\delta_R$) and T$_{k15}$ ($\delta_H$+$\alpha$+L$_4$), and two new three-phase equilibria are established below this plane: $\delta_R$+$\alpha$+L$_4$ and $\delta_H$+$\alpha$+$\delta_R$ ($\delta_H$ denotes the high-temperature modification and $\delta_R$ the room temperature modification of the phase with the stoichiometry CuIn$_3$Se$_5$). The three-phase space and $\delta_H$+$\alpha$+$\delta_R$ shifts towards the In$_2$Se$_3$—Cu$_2$Se quasibinary section and then becomes nonvariant when merging into the critical tie line T$_{k9}$ (520° C.). On further decreasing the temperature, the equilibrium shifts into the subsystem II (In—In$_2$Se$_3$—Cu$_2$Se—Cu) and then terminates at the four-phase plane e$_{Tsol4}$.

Only in this subsystem it is possible to stabilize $\delta_H$ at room temperature by quenching in water (Section 3, isothermal sections). The plane mo$_{T4}$ constitutes a ternary monotectic four-phase plane, while U$_{23}$ is a transition plane. The isopleths in FIGS. 46 and 47 exhibit intersections with the four-phase planes U$_{22}$, mo$_{T4}$, and U$_{23}$. Between 743° C. and the temperatures of E$_{T5}$ (220° C.), E$_{T4}$ (219° C.), and U$_{24}$ (220° C.) the isopleths only display the three-phase spaces L$_4$+$\gamma_T$+$\gamma$-In$_2$Se$_3$, L$_4$+$\gamma_T$+$\delta_R$, and L$_4$+$\alpha$+$\delta_r$. Table 3 indicates the four-phase reactions that generate these three-phase spaces (note that $\gamma$-In$_2$Se$_3$ is abbreviated by $\gamma$2/3), and the schematic drawing of FIG. 43b shows the position of the non-variant equilibria E$_{T5}$, E$_{T4}$, and U$_{24}$. We have not experimentally determined, however, the critical tie lines at T$_{k18}$ and T$_{k17}$ and the course of the reaction p$_{sol1}$. On the In-rich side of the boundary system $\gamma$-In$_2$Se$_3$ can precipitate directly from the liquid phase L$_4$, owing to the binary monotecticum mo$_4$ and the ternary monotecticum mo$_{T4}$ (FIGS. 43a and 43b).

3. Discussion of the Entire Cu—In—Se System 3.1 Isothermal Section at 900° C.

Figure 50:
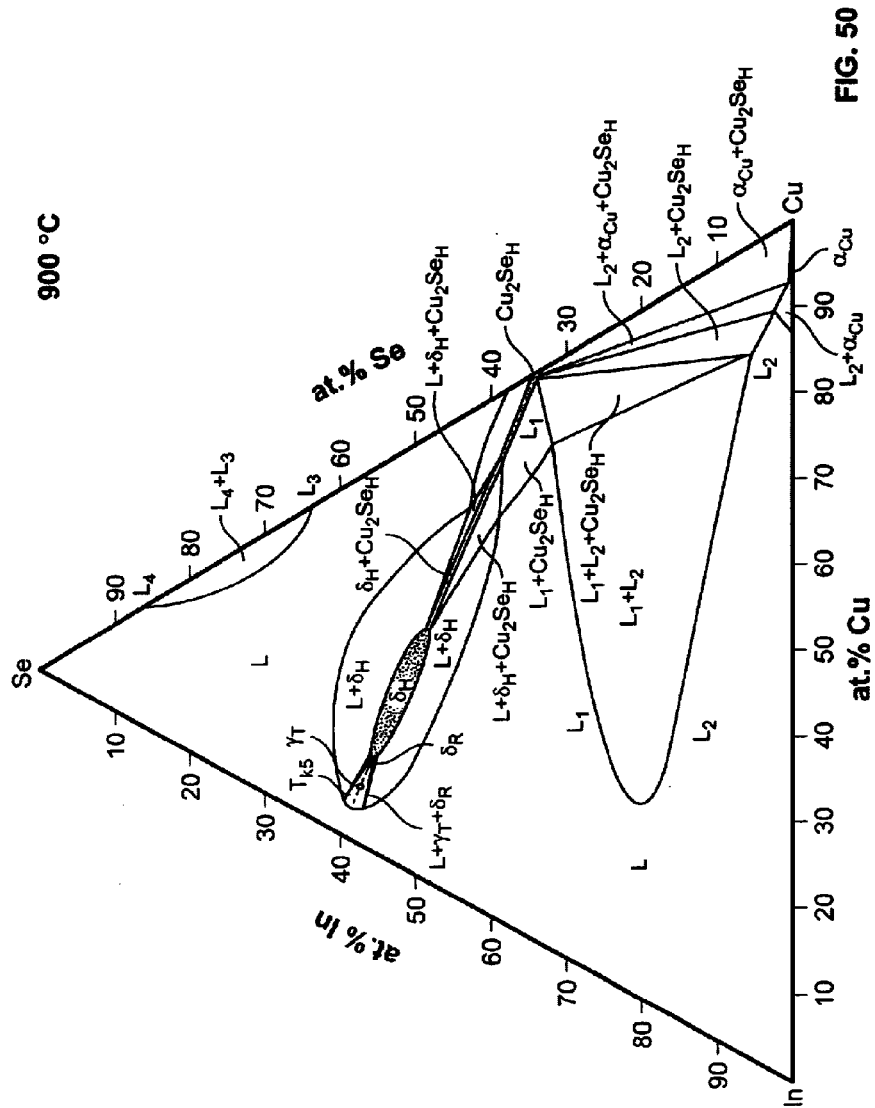

FIG. 50 presents an isothermal section of the entire concentration angle at 900° C. At this temperature a broad range of compositions exists as a liquid phase. Along the line that connects In$_2$Se$_3$ with Cu$_2$Se one recognizes the regions of homogeneous $\delta_H$ and homogeneous (Cu, In)$_2$Se$_H$, shown as shaded fields. The two three-phase equilibria L+$\delta_H$+(Cu, In)$_2$Se$_H$ result from the transition planes U$_1$ (925° C.) and U$_{17}$ (925° C.). The small ribbon between the before-mentioned three-phase equilibria originates from the eutectoid decomposition of the high-temperature phase H$_T$ into $\delta_H$+(Cu, In)$_2$Se$_H$ at T$_{k3}$=923° C.

In the In-rich and Se-rich region of the isothermal section one can see the critical tie line at T$_{k5}$=900° C. (L+$\delta_H$⇌$\gamma_T$), which coincides with the plane of the In$_2$Se$_3$—Cu$_2$Se vertical section. The two-phase region L+$\delta_H$ features radial tie lines around the field of homogeneous $\delta_H$. These tie lines terminate at the three-phase equilibria L+$\delta_H$+Cu$_2$Se and L+$\delta_H$+$\delta_R$. The two-phase region $\delta_H$+Cu$_2$Se$_H$ in-between is very small and extends exactly parallel to the plane of the In$_2$Se$_3$—Cu$_2$Se quasibinary section.

Adding In renders the binary reactions mo$_1$ (L$_1$⇌L$_2$+Cu$_2$Se$_H$) at 1100° C. and e$_1$ (L$_2$⇌$\alpha_{Cu}$+Cu$_2$Se$_H$) at 1065° C. of the Cu—Se boundary mono-variant on adding In and shifts them to lower temperatures. These equilibria end at 653° C. at mo$_{T1}$ (L$_1$⇌L$_2$+$\alpha$+(Cu, In)$_2$Se$_H$) and at U$_4$ (L$_2$+$\alpha_{Cu}$⇌(Cu, In)$_2$Se$_H$+$\beta$), respectively. In the Cu-rich corner the plane of the isothermal section intersects with the two three-phase spaces L$_1$+L$_2$+Cu$_2$Se$_H$ and L$_2$+$\alpha_{Cu}$+Cu$_2$Se$_H$. The tie lines of the liquid phase miscibility gap L$_1$+L$_2$ extend from the three-phase space L$_1$+L$_2$+(Cu, In)$_2$Se$_H$ and terminate at the critical point of the miscibility gap at about 25 at. % Cu and 20 at. % Se. The course of the L$_1$+L$_2$ miscibility gap towards high temperatures was obtained by extrapolating the low-temperature data (Example II). In contrast to the miscibility gap L$_1$+L$_2$, the miscibility gap L$_3$+L$_4$ on the Se-rich side of the Cu—Se boundary system only has a small extension (5 at. % In) at 900° C.

3.2 Isothermal Section at 800° C.

Figure 51:
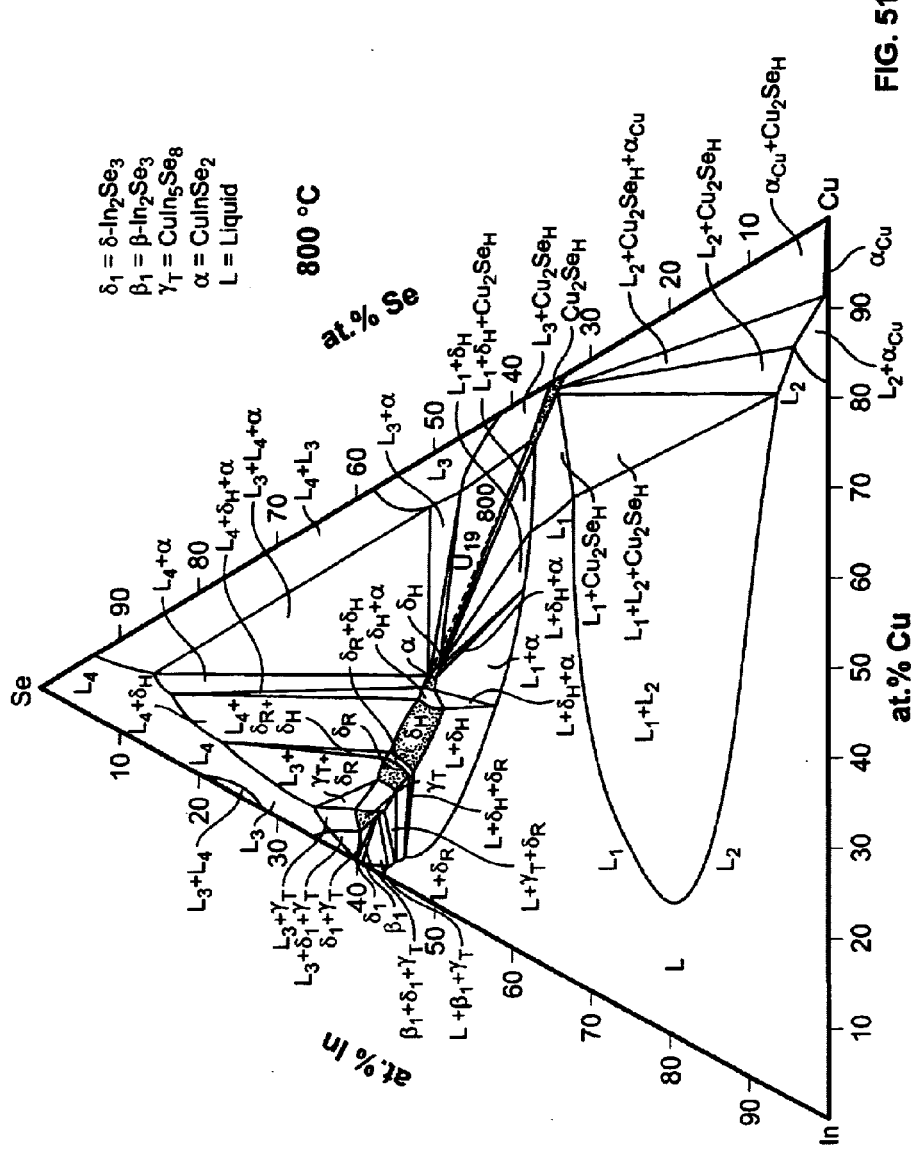

FIG. 51 presents an isothermal section at 800° C. Like in FIG. 50, shaded fields indicate the regions of homogeneous ternary phases ($\gamma_T$, $\delta_R$, $\delta_R$, and $\alpha$). The 800° C. section lies below many critical tie lines and transition planes. Therefore, FIG. 51 features numerous three-phase equilibria.

At 800° C. the system features three two-phase equilibria that involve the ternary $\alpha$ phase (CuInSe$_2$): L$_1$+$\alpha$, L$_3$+$\alpha$, and L$_4$+$\alpha$. FIG. 51 also indicates the position of the transition plane U$_{19}$, which also occurs at 800° C. This transition plane belongs to the region IIIb (CuInSe$_2$—Se—Cu$_2$Se) of subsystem III and borders immediately to the two-phase space $\alpha$+(Cu, In)$_2$Se$_H$. The three-phase spaces L$_3$+L$_4$+$\alpha$ and L$_3$+$\delta_H$+$\alpha$ come into existence via the transition plane U$_{18}$ (L$_4$+$\delta_H$⇌$\alpha$+L$_3$) and via the metatectic critical tie line T$_{k15}$ ($\delta_H$⇌$\alpha$+L$_4$). As we have described in Part II, the two-phase space L$_1$+$\alpha$ comes about by the metatectic critical tie line T$_{k11}$ at 812° C. The two three-phase spaces L$_1$+$\delta_H$+$\alpha$, which start to exist below 812° C. and the intersection with the two-phase space L$_1$+$\alpha$ belong to subsystem II (In—In$_2$Se$_3$—Cu$_2$Se—Cu).

The three-phase equilibria L+$\delta_H$+$\delta_R$ and L+$\gamma_T$+$\delta_R$ which form via the critical tie lines T$_{k4}$ (910° C.) and T$_{k5}$ (900° C.) and both occur two times each, extend towards the Se-rich and In-rich side of the composition triangle into the region IIIa (In$_2$Se$_3$—Se—CuInSe$_2$) of subsystem III and into subsystem II (In—In$_2$Se$_3$—Cu$_2$Se—Cu).

In the region of In$_2$Se$_3$ we observe two three-phase spaces: $\beta$-In$_2$Se$_3$+$\delta$-In$_2$Se$_3$+$\gamma_T$ and L$_3$+$\delta_1$+$\gamma_T$ (note that in FIG. 51 the symbols $\beta_1$ and $\delta_1$ are shortcuts for $\beta$-In$_2$Se$_3$ and $\delta$-In$_2$Se$_3$). These three-phase spaces originate from the critical tie line at T$_{k6}$ (part I, part II). The Se-rich side of FIG. 51 further indicates a narrow region of liquid phase L$_3$ or L$_4$, respectively parallel to the In—Se boundary system. Apart from small shifts, the phase equilibria within subsystem II (In—In$_2$Se$_3$—Cu$_2$Se—Cu) are the same as in FIG. 50.

3.3 Isothermal Section at 500° C.

Figure 52A:
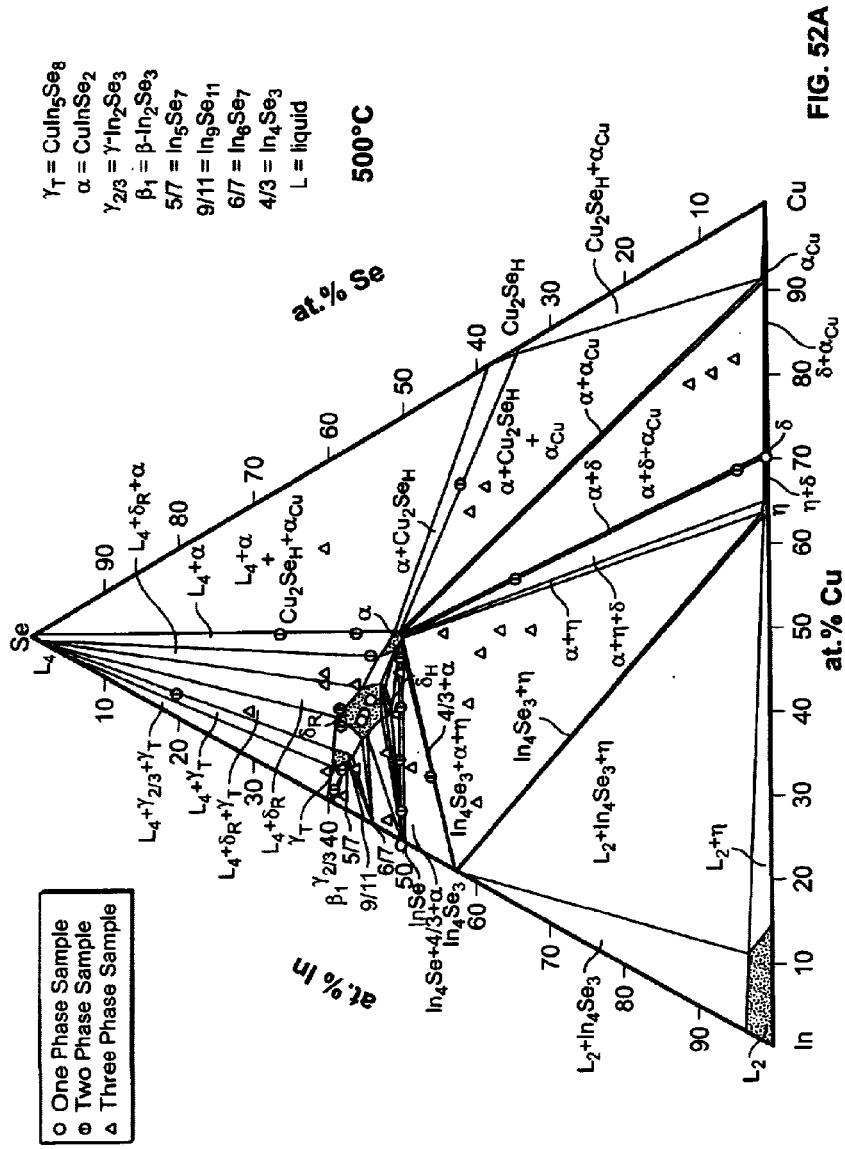
Figure 52B:
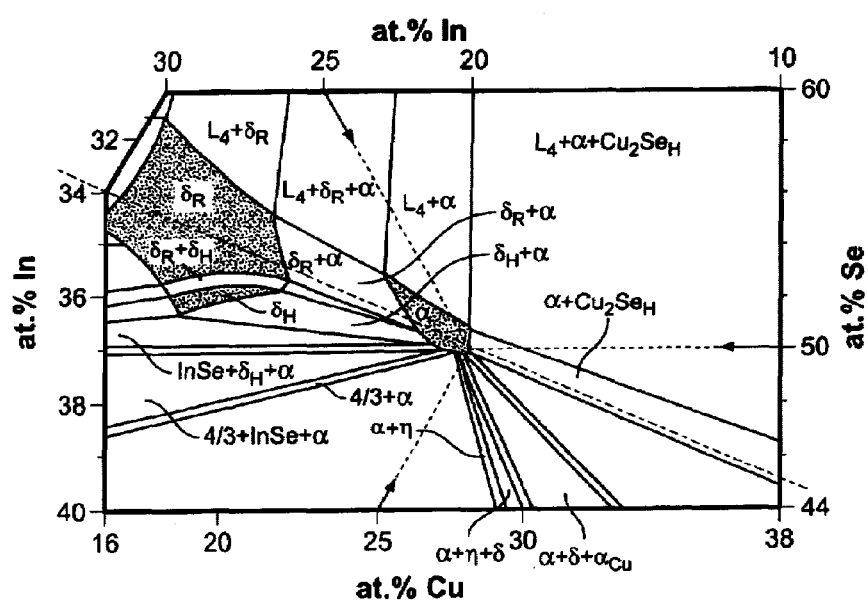

The isothermal section at 500° C. is of major technical importance for the fabrication of thin films for photovoltaic devices because these films are often deposited at temperatures around 500° C. This Example extends our discussion of the isothermal section at 500° C. from Cu-rich and In-rich alloys (Parts I and II) to Se-rich alloys: FIG. 52 presents the isothermal section at 500° C. over the entire composition triangle. FIG. 52b corresponds to the region we have presented in Part I, covering compositions from 15 to 38 at. % Cu and from 44 to 60 at. % Se. The dotted line in this diagram marks the composition Cu$_{25}$In$_{25}$Se$_{50}$, and the hatched line marks the position of the In$_2$Se$_3$—Cu$_2$Se quasibinary section. Note that th legend of FIG. 52 introduces a few shortcuts for ternary phases and indium selenides.

In the Se-rich corner and in the In-rich corner the isothermal section at 500° C. still features small regions of liquid phase (L$_4$ and L$_2$, respectively). The four three-phase equilibria L$_4$+$\gamma$-In$_2$Se$_3$+$\gamma_T$, L$_4$+$\delta_R$+$\gamma_T$, L$_4$+and from the reaction mo$_{T3}$. The development of these three-phase spaces towards lower temperatures becomes obvious from the isopleths of FIGS. 46 and 47.

The α phase (CuInSe$_2$) establishes equilibria with eight solid phases and one liquid phase (L$_4$). Among the solid phases, η, δ, and α$_{Cu}$ originate from the In—Cu boundary system, Cu$_2$Se$_H$ from the Cu—Se boundary system, and InSe and In$_4$Se$_3$ from the In—Se boundary system. The remaining two phases in equilibrium with α are δ$_R$ and δ$_H$. The morphology of the α phase field at higher and lower temperatures can be assessed from the In$_2$Se$_3$—Cu$_2$Se isopleth in Part I and from the numerous other isopleths we have presented in Parts II and III, the present publication.

4. Phase Equilibria with 10 at. % In

Figure 53:
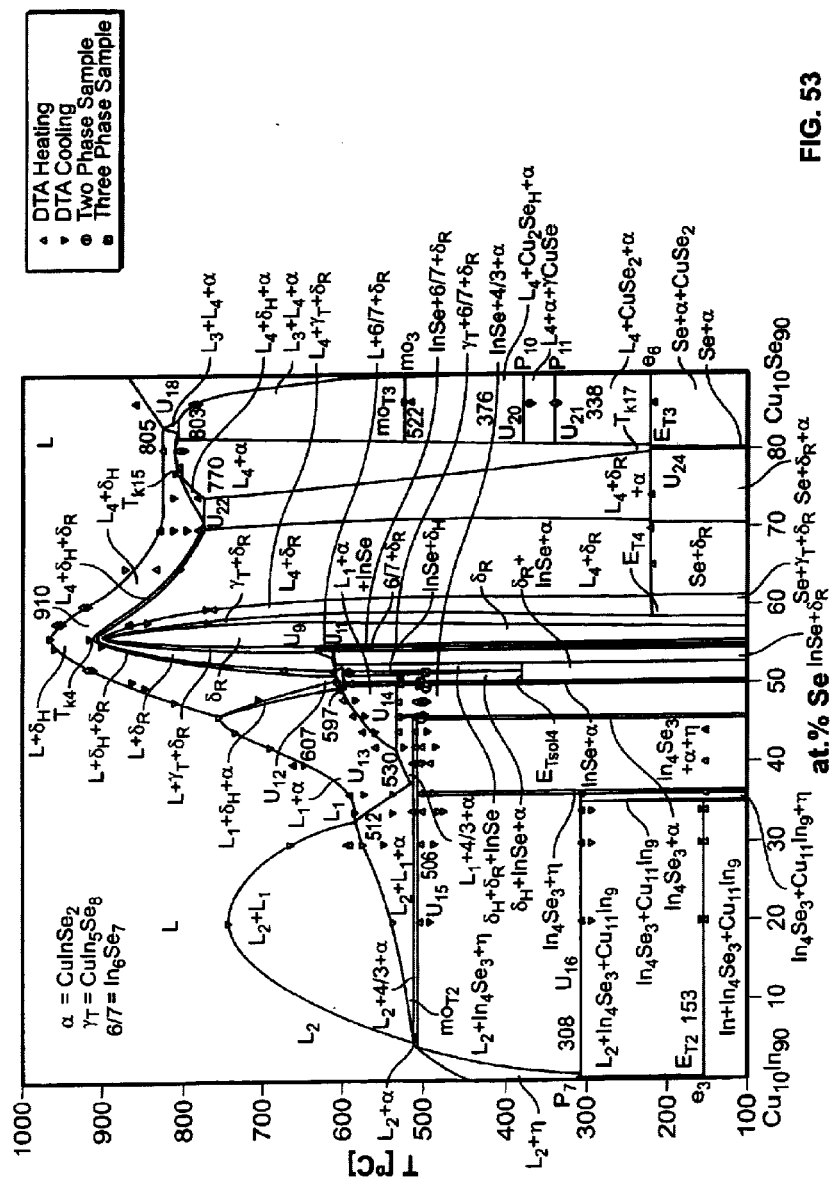

With FIG. 30 and FIG. 31 we have already shown two isopleths that connect the phase equilibria of the three different subsystems. FIG. 53 presents another isopleth of this kind, linking the equilibria of subsystem II (In—In$_2$Se$_3$—Cu$_2$Se—Cu) with those of region IIIa (In$_2$Se$_3$—Se—CuInSe$_2$) and region IIIb (Cu$_2$Se—Se—CuInSe$_2$) of subsystem III (In$_2$Se$_3$—Se—Cu$_2$Se). The equilibria of subsystem I, the In$_2$Se$_3$—Cu$_2$Se quasibinary section, appear below the intersection with the maximum L+δ$_H$ and below the intersection with the critical tie line at T$_{k4}$ (91° C.) in FIG. 53. Starting from the Cu—In boundary system at Cu$_{10}$In$_{90}$ and increasing the Se content from 0 to 55 at. % Se, the isopleth first intersects with the miscibility gap L$_1$+L$_2$, then with the ternary monotectic four-phase plane mo$_{T2}$, and finally with the four-phase planes U$_9$, U$_{11}$, U$_{12}$, U$_{13}$, U$_{14}$, U$_{15}$, U$_{16}$, and E$_{T2}$. Furthermore, FIG. 53 shows that the two three-phase spaces L$_4$+δ$_H$+α, which emerge from the critical tie line T$_{k15}$ (805° C.) on the Se-rich side of the isopleth, terminate at the transition planes U$_{22}$ (770° C.) and U$_{18}$ (803° C.). The non-variant equilibria reaching from 80 at. % Se almost to the Cu—Se boundary system belong to the ternary monotectic four-phase plane mo$_{T3}$ at 522° C. and to the transition planes U$_{20}$ at 376° C. and U$_{21}$ at 338° C. The temperatures of the intersections with the ternary eutectica E$_{T4}$ and E$_{T3}$ and with the transition plane U$_{24}$ are very close to each other according to Table 3 they differ by only 1 K.

The symbol e$_{Tsol4}$ denotes a four-phase plane at 400° C. between 50.0 and 52.5 at. % Se. This four-phase plane corresponds to ternary eutectic reaction by which the phase δ$_H$ decomposes into δ$_R$+InSe+α (Table 1). This result was obtained by analyzing specimens that were tempered for 30 d immediately below 400° C. In these specimens the phase δ$_H$ was no longer observed.

5. Conclusion

Experimental research on the phase equilibria of alloys still plays a key role for the development of new technologies because this kind of research provides physical insight in the causal correlations between phase equilibria, evolution of microstructures, and the macroscopic properties of materials. The phase diagram of Cu—In—Se, which we have described in the three subsequent Examples, exhibits a large variety of four-phase reactions and critical tie lines. This rather complicated system required a thorough investigation of many different alloys in order to deduce the liquidus isotherms, the tie lines and the partitioning of the liquidus. Our results are based on experimental studies by differential thermal analysis, light-optical microscopy, scanning electron microscopy, transmission electron microscopy, and x-ray diffraction. In total, we have identifi d four different ternary phases: α (CuInSe$_2$), γ$_T$ (CuIn$_5$Se$_8$), H$_T$ (Cu$_{13}$In$_3$8e$_{11}$), and δ$_{H/R}$ (CuIn$_3$Se$_5$). Among these, H$_T$ and δ$_H$ are high-temperature phases, which cannot be stabilized at room temperature by quenching in water.

In the framework of our study it was necessary to re-investigate the phase equilibria of all three binary boundary systems of Cu—In—Se, particularly for the In—Se boundary system. These studies resulted in re-determination of the miscibility gaps between the In-rich and Se-rich liquid phases of the In—Se boundary system and the miscibility gap on the Se-rich side of the Cu—Se boundary system. Moreover, those initial studies led to the discovery of two new phases in the In—Se boundary system and yielded a diagram of metastable states. Among the indium selenides, InSe and In$_4$Se$_3$ establish two-phase and three-phase equilibria with the α phase (CuInSe$_2$).

In the composition range of the phase InSe and in ternary alloys we also observed the formation of metastable equilibria during cooling down from the liquid state. In the composition range of the α phase and along the In$_2$Se$_3$—Cu$_2$Se quasibinary section we have set up a diagram of supercooled equilibria. This diagram proved to be helpful in interpreting the results of TEM studies on the microstructure of thin film solar cells. Comparison between thin films and equilibrated polycrystalline bulk material revealed that the room temperature state of the thin films corresponds the equilibrium state of the bulk material at elevated temperatures. The large composition range that the α phase (CuInSe$_2$) exhibits at higher temperatures can be quenched-in to room temperature. Maximum extension of the composition range can be achieved with alloys within the In$_2$Se$_3$—Cu$_2$Se quasibinary section by annealing above the δ$_H$→α phase transformation and quenching in water. According to experimental results of Beilharz et al. ("Bulk crystals in the system Cu—In—Ga—Se with initial Ga/Ga+In=0.1 to 0.3: growth from the melt and characterization", in Ternary and Multinary Components, Institute of Physics Publishing, Bristol UK (1998, 19–22), it is also possible to extend the composition range of the α phase by alloying with Ga. A similar effect has been observed for Na additions. Therefore, it appears reasonable to extend our studies on the phase equilibria of Cu—In—Se to the quaternary systems Cu—In—Se—Ga and Cu—In—Se—Na. Preliminary experiments with polycrystalline specimens of the α phase have shown that alloying with 0.1 to 0.2 at. % Na extends the range of homogeneous α by about 2 at. % Cu towards the In$_2$Se$_3$ side of the In$_2$Se$_3$—Cu$_2$Se quasibinary section.

From the isothermal sections we have presented in Parts II and III it becomes clear that at 500° C. the α phase establishes two-phase and three-phase equilibria with nine different phases. This variety of equilibria explains the difficulties other researchers have encountered when attempting to grow CuInSe$_2$ single crystals. Within the In$_2$Se$_3$—Cu$_2$Se quasibinary section the α phase (CuInSe$_2$) can only form via the δ$_H$→α transformation. Therefore, our finding that the α phase possesses four different surfaces of primary crystallization (α$_{L1}$ through α$_{L4}$) is of major importance for the development of new strategies to grow CuInSe$_2$ single crystals. According to the Cu—In—Se phase diagram it is possible to grow single crystals of the α phase within a certain range of different compositions around the stoichiometric composition CuInSe$_2$. For this purpose, one first needs to grow single crystals of δ$_H$ with the desired composition and then transform these to α. This is not possible, however, with the Bridgman technique: Since this technique requires congruent solidification, one can only obtain δ$_H$ single crystals with the composition Cu$_{23.5}$In$_{26.0}$Se$_{50.5}$, and on transforming to α and cooling down to room temperature such single crystals decompose into two phases (Part I). In order to grow α single crystals and to be able to control their composition, therefore, one should not employ the Bridgman technique but the Czochralski method, which works with a large reservoir of liquid phase.

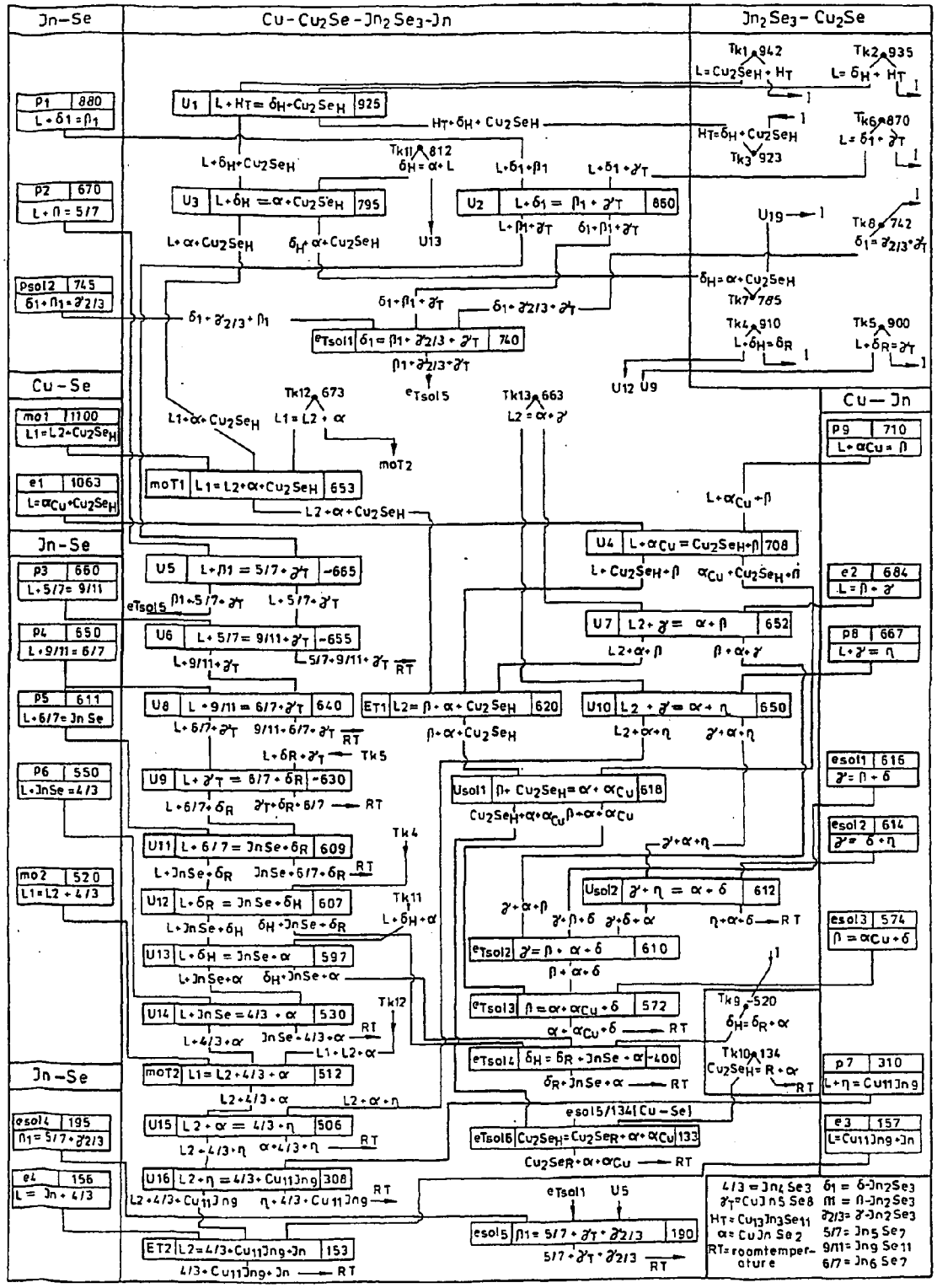
Table 1

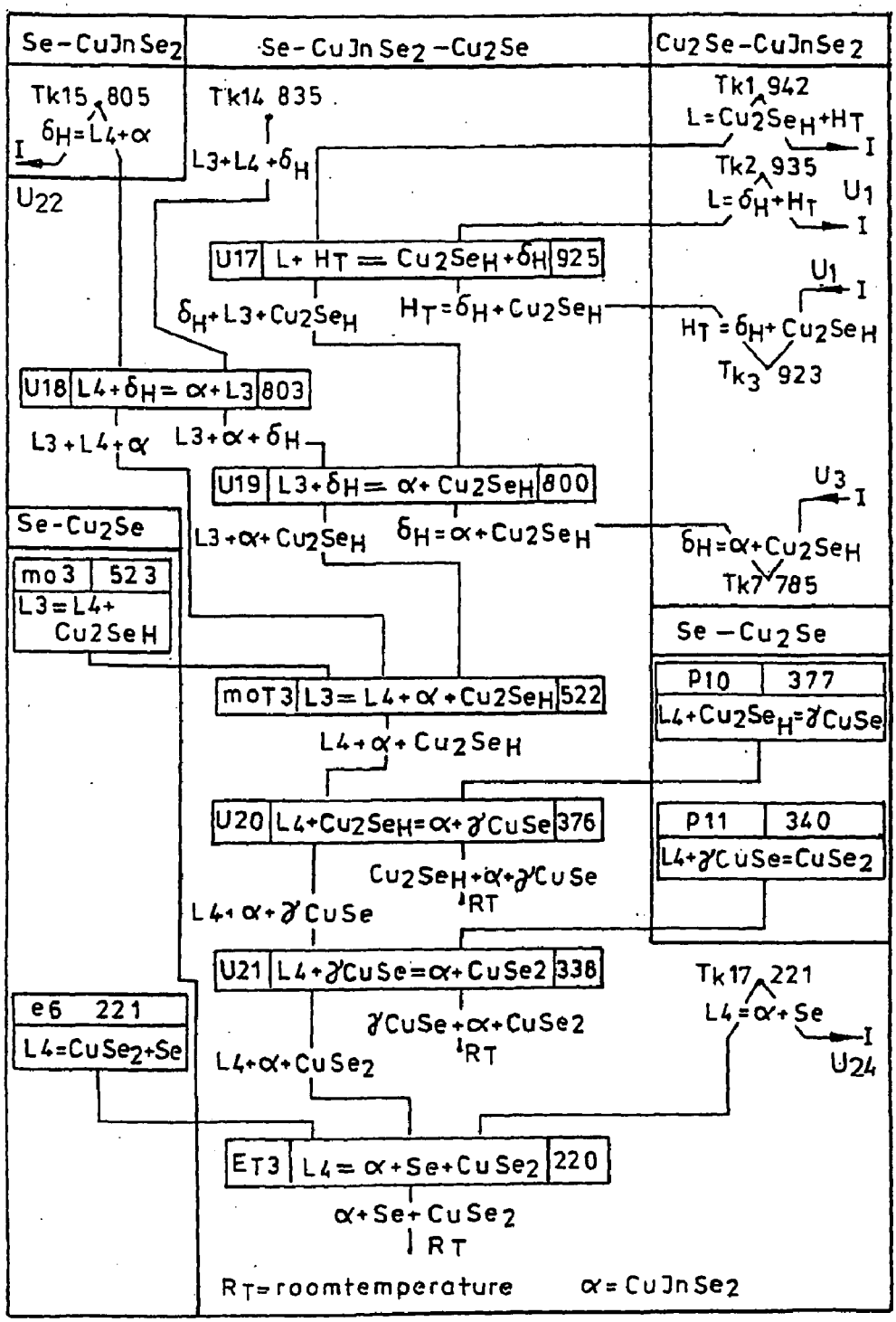
Table 2

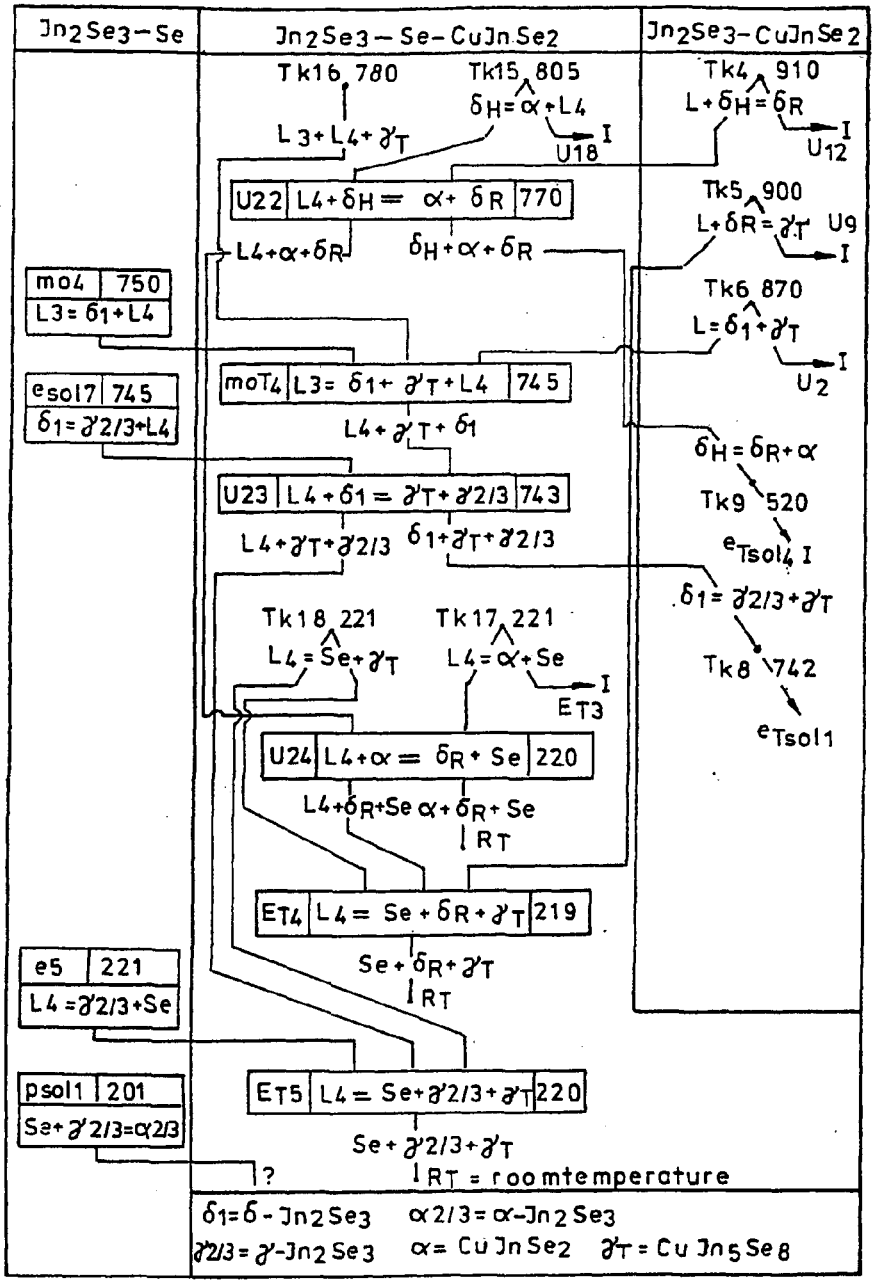
Table 3

TABLE 4

Primary surfaces $a_{L1}$

1. $U_{13}$(597° C., $Cu_{1.0}In_{51.0}Se_{48.0}$)
2. $U_{14}$(530° C., $Cu_{3.6}In_{58.4}Se_{38.0}$)
3. $mo_{T2}$(512° C., $Cu_{5.6}In_{61.8}Se_{32.6}$)
4. $Tk_{12}$ (673° C., $Cu_{39.8}In_{26.6}Se_{33.6}$)
5. $moT1$ (653° C., $Cu_{49.0}In_{33.1}Se_{17.9}$)
6. U3 (795° C., $Cu_{47.2}In_{16.2}Se_{37.6}$)
7. $T_{k11}$(812° C., $Cu_{29.3}In_{29.7}Se_{41.0}$)

Primary surface $a_{L2}$

1. $mo_{T2}$(L2) (512° C., $Cu_{10.0}In_{85.0}Se_{5.0}$)
2. U15 (506° C., $Cu_{9.2}In_{86.7}Se_{4.1}$)
3. $T_{k13}$(L2) (663° C., $Cu_{63.5}In_{30.0}Se_{6.5}$)
4. U7 (652° C., $Cu_{70.3}In_{23.8}Se_{5.9}$)
5. $E_{T1}$ (620° C., $Cu_{71.5}In_{22.7}Se_{5.8}$)
6. $mo_{T1}$(L2) (653° C., $Cu_{72.0}In_{21.2}Se_{6.8}$)
7. $T_{k12}$(L2) (673° C., $Cu_{62.0}In_{30.0}Se_{8.0}$)

Primary surface $a_{L3}$

1. U18 (L3) (803° C., $Cu_{41.9}In_{7.9}Se_{50.2}$)
2. U19 (800° C., $Cu_{46.5}In_{6.4}Se_{47.1}$)
3. $mo_{T3}$(L3) (552° C., $Cu_{49.0}In_{0.5}Se_{50.5}$)

Primary surface $a_{L4}$

1. $T_{k15}$ (805° C., $Cu_{8.5}In_{8.5}Se_{83.0}$)
2. $U_{18}$(L4) (803° C., $Cu_{8.4}In_{6.1}Se_{85.5}$)
3. $U_{22}$ (770° C., $Cu_{2.7}In_{8.3}Se_{89.0}$)
4. $T_{k17}$ (221° C.)
5. U24 (220° C.)
6. $E_{T3}$ (220° C., $Se_{99.9}$)

The invention claimed is:

1. A method for preparing a solid composition comprising preparing a solid composition comprising Cu, In and Se from a liquid molten Cu—In—Se phase under conditions resulting from the phase diagrams shown in FIGS. 2, 3a–b, 6, 14a–b, 16a–b, 21, 22, 23, 27a–c, 28, 29, 30, 31, 32, 36, 45, 46, 47, 50, 51, 52, 53 and to the liquidus projections as shown in FIGS. 26a–f and 43a–g to form the solid composition comprising the elements Cu, In and Se.

2. The method of claim 1 wherein the preparation comprises the direct formation of a solid composition from a liquid phase.

3. The method of claim 2 wherein the solid composition has a stoichiometry which differs from the stoichiometry of the liquid phase from which it is formed.

4. The method of claim 1 wherein said preparation comprises a crystallization from a liquid phase with compositions in the field marked as $α_{L1}$, $α_{L2}$, $α_{L3}$, $α_{L4}$, in FIGS. 43a–g.

5. The method of claim 4 wherein said preparation comprises crystal growth by the Czochralski method without feed of a liquid phase.

6. The method of claim 4 wherein said preparation comprises crystal growth by the Czochralski method including feed of a liquid phase.

7. The method of claim 4 wherein said preparation comprises crystal growth from a first liquid phase which is in contact with a second liquid phase wherein the density and the stoichiometry of the first liquid phase are different from the second liquid phase.

8. The method of claim 1 wherein said compositions are single crystalline compositions.

9. The method of claim 1 wherein said compositions include Cu, In, Se and at least one further element.

10. The method of claim 9 wherein said at least one further element is present in an amount of up to 5 atom percent based on the total composition.

11. The method of claim 9 wherein said at least one further element is selected from the group Ga, Na, S.

12. The method of claim 1 wherein said compositions are selected from the α-phase, the $γ_T$-phase, the $δ_R$-phase and the $δ_H$-phase.

13. The method of claim 12 wherein said composition is the α-phase having the stoichiometry $CuInSe_2$, within a compositional range as indicated in FIGS. 51 and 52 and optionally extended by the presence of further elements.

14. The method of claim 13 wherein the α-phase is directly crystallized from a liquid phase selected from the group of liquidus surfaces of primary crystallization αL1, αL2, αL3 and αL4 as defined in the phase diagram and in Table 4.

15. The method of claim 14 wherein the α-phase is obtained as a single crystal.

16. The method of claim 14 wherein the α-phase is grown on a substrate.

17. A method for directly obtaining a Cu—In—Se α-phase from a liquid Cu—In—Se phase by crystal growth from the group of liquidus surfaces of primary crystallization αL1, αL2, αL3 and αL4, wherein the method is conducted under conditions resulting from the phase diagram and in Table 4 to obtain the Cu—In—Se α-phase, wherein the phase diagrams is as shown in FIGS. 2, 3a–b, 4, 5, 6, 21, 22, 23, 24, 25, 26, 27, 28, 29, 30, 31, 32, 36, 43, 44, 45, 46, 47, 50, 51, 52 and 53.

18. The method of claim 17 wherein the α-phase is obtained as a single-phase composition.

19. A single-phase Cu—In—Se composition selected from the α-phase, the γt-phase, the 67 $_R$-phase and the 67 $_H$-phase.

20. The composition of claim 19 which is the α-phase having the stoichiometry $CuInSe_2$ within a compositonal range as indicated in FIGS. 51 and 52 and optionally extended by the presence of further elements.

21. The composition of claim 20 having a defect concentration which is about the corresponding equilibrium concentration.

22. The composition of claim 21 which is a single crystal.

23. The composition of claim 20 which is a single crystal.

24. The composition of claim 19 having a defect concentration which is about the corresponding equilibrium concentration.

25. The composition of claim 24 which is a single crystal.

26. The composition of claim 19 which is a single crystal.

* * * * *